(12) United States Patent
Anderson et al.

(10) Patent No.: US 12,506,006 B2
(45) Date of Patent: Dec. 23, 2025

(54) SEMICONDUCTOR DEVICE AND METHOD OF DIRECT WAFER BONDING BETWEEN SEMICONDUCTOR LAYER CONTAINING SIMILAR WBG MATERIALS

(71) Applicant: IceMos Technology Limited, Belfast (GB)

(72) Inventors: Samuel J. Anderson, Tempe, AZ (US); Takeshi Ishiguro, Fukushima (JP); Cathal Duffy, Belfast (GB); Aymeric Privat, Tempe, AZ (US)

(73) Assignee: IceMos Technology Limited (GB)

( * ) Notice: Subject to any disclaimer, the term of this patent is extended or adjusted under 35 U.S.C. 154(b) by 551 days.

(21) Appl. No.: 17/822,357

(22) Filed: Aug. 25, 2022

(65) Prior Publication Data

US 2023/0064236 A1 Mar. 2, 2023

Related U.S. Application Data

(63) Continuation-in-part of application No. 17/822,055, filed on Aug. 24, 2022, which is a (Continued)

(51) Int. Cl.
*H01L 21/18* (2006.01)
*H01L 21/265* (2006.01)
(Continued)

(52) U.S. Cl.
CPC ...... *H01L 21/187* (2013.01); *H01L 21/26513* (2013.01); *H01L 21/26586* (2013.01);
(Continued)

(58) Field of Classification Search
None
See application file for complete search history.

(56) References Cited

U.S. PATENT DOCUMENTS 6,573,534 B1\* 6/2003 Kumar ............... H10D 62/8325
257/E29.066
7,846,821 B2 12/2010 Ishiguro et al.
(Continued)

OTHER PUBLICATIONS

SiC Crystallography—https://www.iue.tuwien.ac.at/phd/ayalew/node20.html.

*Primary Examiner* — Julio J Maldonado
*Assistant Examiner* — Pinaki Das
(74) *Attorney, Agent, or Firm* — Robert D. Atkins; PATENT LAW GROUP: Atkins and Associates, P.C.

(57) ABSTRACT

A semiconductor device has a substrate made of a first semiconductor material. The first semiconductor material is silicon carbide. A first semiconductor layer made of the first semiconductor material is disposed over the substrate. A second semiconductor layer made of a second semiconductor material dissimilar from the first semiconductor material is disposed over the first semiconductor layer. The first semiconductor material is substantially defect-free silicon carbide, and the second semiconductor material is silicon. A semiconductor device is formed in the second semiconductor layer. The semiconductor device can be a power MOSFET, diode, insulated gate bipolar transistor, cluster trench insulated gate bipolar transistor, and thyristor. The second semiconductor layer with the electrical component provides a first portion of a breakdown voltage for the semiconductor device and the first semiconductor layer and substrate provide a second portion of the breakdown voltage for the semiconductor device.

29 Claims, 39 Drawing Sheets

Related U.S. Application Data continuation-in-part of application No. 17/811,639, filed on Jul. 11, 2022.

(60) Provisional application No. 63/260,614, filed on Aug. 26, 2021.

(51) Int. Cl.

| | |
|---|---|
| *H01L 21/3065* | (2006.01) |
| *H02M 3/335* | (2006.01) |
| *H10D 12/01* | (2025.01) |
| *H10D 30/66* | (2025.01) |
| *H10D 62/10* | (2025.01) |
| *H10D 62/822* | (2025.01) |
| *H10D 62/832* | (2025.01) |

(52) U.S. Cl.
CPC ....... *H01L 21/3065* (2013.01); *H10D 12/031* (2025.01); *H10D 30/668* (2025.01); *H10D 62/111* (2025.01); *H10D 62/822* (2025.01); *H10D 62/8325* (2025.01); *H02M 3/33523* (2013.01)

(56) References Cited

U.S. PATENT DOCUMENTS

| | | |
|---|---|---|
| 7,944,018 B2 | 5/2011 | Anderson et al. |
| 8,114,751 B2 | 2/2012 | Ishiguro et al. |
| 8,129,252 B2 | 3/2012 | Anderson et al. |
| 8,716,829 B2 | 5/2014 | Anderson et al. |
| 8,736,019 B2 | 5/2014 | Anderson et al. |
| 8,963,239 B2 | 2/2015 | Anderson et al. |
| 2002/0008234 A1 | 1/2002 | Emrick et al. |
| 2002/0153594 A1 | 10/2002 | Lipkin et al. |
| 2003/0036247 A1* | 2/2003 | Eriksen ............. H01L 21/76254 438/455 |
| 2003/0151051 A1* | 8/2003 | Johnson ............. H01L 21/2007 257/77 |
| 2004/0009649 A1* | 1/2004 | Kub ....................... B82Y 30/00 438/459 |
| 2005/0269660 A1 | 12/2005 | Singh |
| 2006/0169987 A1 | 8/2006 | Miura et al. |
| 2007/0087525 A1* | 4/2007 | Chen .................... H10D 84/038 438/455 |
| 2008/0142837 A1 | 6/2008 | Sato et al. |
| 2008/0296617 A1 | 12/2008 | Mishra et al. |
| 2009/0278169 A1 | 11/2009 | Hayashi et al. |
| 2010/0133550 A1 | 6/2010 | Zhang et al. |
| 2010/0327291 A1 | 12/2010 | Preble et al. |
| 2011/0006310 A1 | 1/2011 | Nagasawa et al. |
| 2011/0220915 A1 | 9/2011 | Edgar et al. |
| 2013/0187224 A1* | 7/2013 | Verma .................. H10D 84/856 257/337 |
| 2018/0366569 A1 | 12/2018 | Zeng et al. |
| 2019/0165134 A1 | 5/2019 | Diaz et al. |
| 2022/0293737 A1 | 9/2022 | Han et al. |
| 2023/0120346 A1* | 4/2023 | Ghyselen .......... H01L 21/76254 438/455 |

\* cited by examiner

SEMICONDUCTOR DEVICE AND METHOD OF DIRECT WAFER BONDING BETWEEN SEMICONDUCTOR LAYER CONTAINING SIMILAR WBG MATERIALS

CLAIM TO DOMESTIC PRIORITY

The present application is a continuation-in-part of U.S. patent application Ser. No. 17/822,055, filed Aug. 24, 2022, which claims the benefit of U.S. Provisional Application No. 63/260,614, filed Aug. 26, 2021, which is a continuation-in-part of U.S. patent application Ser. No. 17/811,639, filed Jul. 11, 2022, which claims the benefit of U.S. Provisional Application No. 63/260,614, filed Aug. 26, 2021, which applications are incorporated herein by reference. The present application further claims the benefit of U.S. Provisional Application No. 63/260,614, filed Aug. 26, 2021, which application is incorporated herein by reference.

FIELD OF THE INVENTION

The present invention relates in general to a semiconductor device and, more particularly, to a semiconductor device and method of direct wafer bonding between semiconductor layers with dissimilar materials, including wide band gap materials.

BACKGROUND OF THE INVENTION

Semiconductor devices are commonly found in modern electrical products. Semiconductor devices vary in the number and density of electrical components. Discrete semiconductor devices generally contain one type of electrical component, e.g., a light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, interface circuits, and other signal processing circuits.

With respect to the power MOSFET, such devices have been made with a super-junction structure. Advances have been made to merge micro-electrical-mechanical system (MEMS) layer transfer and super-junction technology. Super-junction has been an important development for power devices since the introduction of the insulated gate bipolar transistor (IGBT) in the 1980s. Super-junction has extended the well-known theoretical study on the limit of silicon in high-voltage devices. MEMS super-junction reduces manufacturing cost by merging MEMS processing techniques into CMOS processes to build super-junction metal oxide semiconductor (SJMOS) structures.

Super-junction can be challenging to realize in practice, due to the requirement of forming three-dimensional device structures with a high aspect ratio. SJMOS addresses the super-junction manufacturing and cost problem through a low-cost, commercially viable MEMS layer transfer and deep reactive ion etch fabrication technology. The comparison between multiple-epi and the merger of MEMS based SJMOS devices is differentiated by the number of mask layers. There can be twenty or more mask layers used in the manufacture of multi-epi, while SJMOS uses nine mask layers.

Many semiconductor devices use a substrate made at least in part with silicon carbide (SiC) semiconductor material, such as 4H and 6H SiC. The SiC semiconductor layer or substrate provides some useful advantages, such as high breakdown voltage, high speed, reduced switching losses, high power density, high temperature, better heat dissipation, and increased bandwidth capability. However, forming the SiC layer on a Si layer produces a heterointerface between two dissimilar materials with different lattice structures and different coefficients of thermal expansion (CTE). The heterointerface causes stress during temperature cycling and leads to defects in the SiC layer, including triangle defects, carrot defects, surface pits, step bunching, microtwins, stacking faults, basal plane dislocations (BPD), micropipes (MP), threading screw dislocations (TSD), and threading edge dislocations (TED). Many attempts have been made to reduce the defect density in the SiC substrate. For example, attempts have been made to accurately control surface chemistry during the epitaxial growth. In other examples, attempts have been made to optimize etch time prior to epitaxy, to optimize the shape of the wafers via optimized crystal growth, wafering, and polishing processes, and to make use of buffer-layers, high temperature processes, intrinsic strain reduction, and patterned Si-substrates when growing SiC or 3C—SiC heteroepitaxy. The work done to date has focused on reducing defects in the SiC substrate, which has only served to increase manufacturing costs, while continuing to produce SiC substrates with high defect densities and low yield.

Semiconductor devices perform a wide range of functions, such as signal processing, high-speed calculations, transmitting and receiving electromagnetic signals, controlling electrical devices, transforming sunlight to electricity, and creating visual projections for television displays. Semiconductor devices are found in the fields of communications, power conversion, networks, computers, and consumer products. Semiconductor devices are also found in military applications, aerospace, aviation, automotive, data processing centers, industrial controllers, and office equipment.

MOSFETs are commonly used in electrical circuits, such as communication systems and power supplies. Power MOSFETs are particularly useful when used as electric switches to enable and disable the conduction of relatively large currents. The on/off state of the power MOSFET is controlled by applying and removing a triggering signal at the gate electrode. When turned on, the electric current in the MOSFET flows between the drain and source. When turned off, the electric current is blocked by the MOSFET.

Power MOSFETs are typically arranged in an array of thousands of individual MOSFET cells electrically connected in parallel. The MOSFET cell has an inherent drain-source resistance ($R_{DSON}$) in the conducting state. The width of the MOSFET cell influences the electrical resistance of the MOSFET cell. The larger the cell width, the larger the resistance. Conversely, the larger the cell density with corresponding smaller cell width, the smaller the resistance. Many applications, such as portable electrical devices, require a low operating voltage, e.g., less than 5 VDC. The low voltage electrical equipment in the portable electrical devices creates a demand for power supplies that can deliver the requisite operating potential.

In addition, there is a need to increase the breakdown voltage for the power MOSFET, particularly in demanding applications, such as aerospace, data processing centers, LED lighting, charging stations for electric vehicles, and variable speed drives for electric motors. When semiconductor devices, such as power MOSFETs, are utilized in the upper atmosphere or in space, e.g., on rockets, satellites, space stations, or the like, these devices must maintain reliability despite the presence of potentially damaging cosmic rays and other types of radiation, i.e., the devices must be rad hard. The rad hard requirement also applies to other environments where the semiconductor device may be subjected to radiation doses above and beyond typical working conditions. Reliability parameters for such devices and conditions often refer to catastrophic events such as single event burnout (SEB) and single event gate rupture (SEGR). The most sensitive parts of the MOSFET tends to be the oxide layers and the silicon-oxide interfaces. The power MOSFET should be hardened against exposure to radiation in aerospace applications.

One previous solution for increasing reliability includes providing thicker oxide layers. The thicker oxide layer reduces the radiation-induced electric field and makes the device able to withstand a single event effect (SEE). However, the thicker oxide makes the overall device weaker when considering the effects from a total ionizing dose (TID). The oxide layer traps charges and interface trap density increase as the total radiation exposure goes up, driving the threshold voltage lower and increasing the threshold leakage current. It is also desirable to make the substantially defect-free SiC substrate radiation hardened for aerospace applications.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Most modern electrical equipment requires a power supply to provide a DC operating potential to the electrical components contained therein. Common types of electrical equipment which use power supplies include aerospace, personal computers, energy systems, telecommunication systems, audio-video equipment, consumer electrical devices, automotive components, portable electrical devices, data processing centers, LED lighting, electric vehicles, and other devices which utilize integrated circuits, semiconductor chips, or otherwise require DC operating potential. Many semiconductor components require a low voltage DC operating potential. However, many sources of electric power are AC, or high voltage DC, which must be converted to low voltage DC for the electrical equipment.

Figure 1:
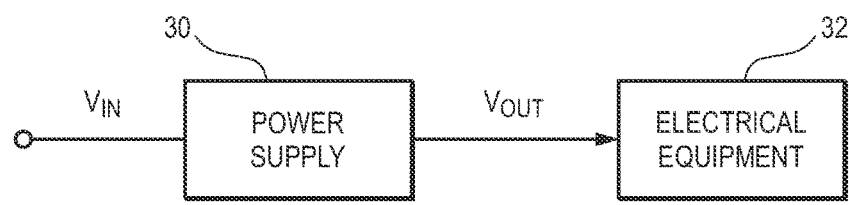
FIG. 1 illustrates a block diagram of a power supply and electrical equipment.

In one common arrangement, the AC/DC power supply receives an AC input voltage, e.g., between 110 and 240 VAC, and converts the AC input voltage to the DC operating voltage. Referring to FIG. 1, a PWM power supply 30 is shown providing a DC operating potential to electrical equipment 32. Power supply 30 receives input voltage $V_{IN}$ and produces one or more DC output voltages. The electrical equipment 32 may take the form of aerospace equipment, personal computers, energy systems, telecommunication systems, audio-video equipment, consumer electrical devices, automotive components, portable electrical devices, aerospace, data processing centers, LED lighting, charging stations for electric vehicles, variable speed drives for electric motors, and other devices which utilize integrated circuits, semiconductor chips, or otherwise require DC operating potential from the power supply.

Figure 2:
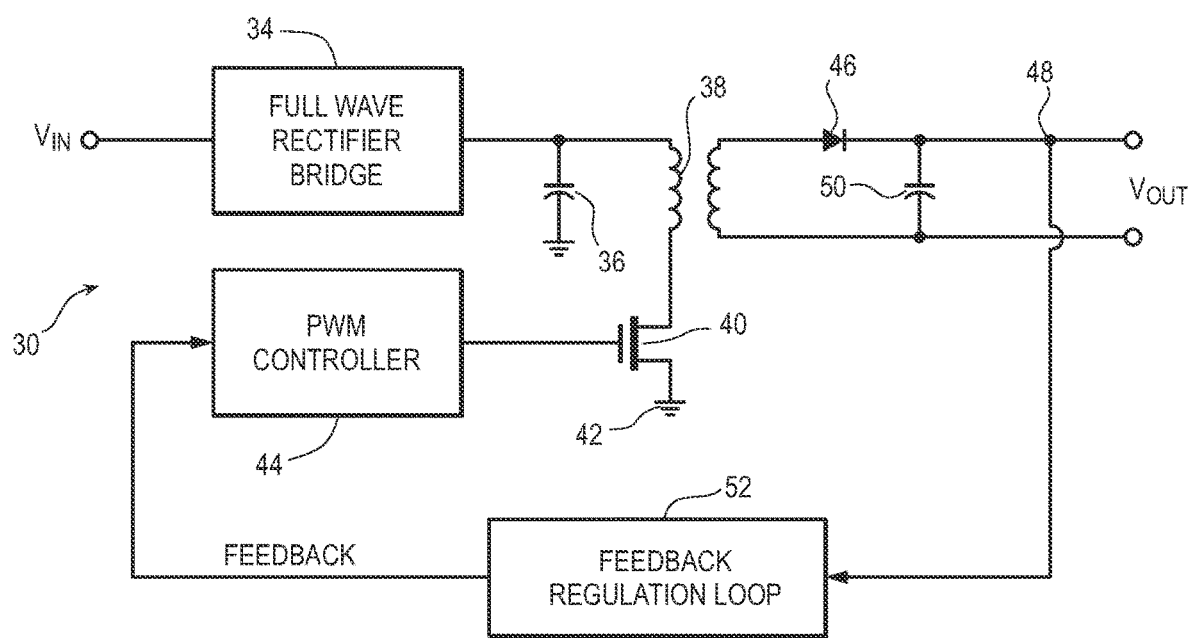
FIG. 2 is a schematic and block diagram of a pulse width modulated power supply.

Further detail of PWM power supply 30 is shown in FIG. 2. The input voltage $V_{IN}$ may be an AC signal, e.g., 110 VAC, or DC signal, e.g., 48 volts. For the case of an AC input voltage, power supply 30 has a full-wave rectifier bridge 34. The full-wave rectifier bridge 34 converts the AC input voltage to a DC voltage. In the case of a DC input voltage, the full-wave rectifier bridge 34 is omitted. Capacitor 36 smooths and filters the DC voltage. The DC voltage is applied to a primary winding or inductor of transformer 38. The primary winding of transformer 38 is also coupled through power transistor 40 to ground terminal 42. In one embodiment, power transistor 40 is a multi-cell vertical power MOSFET, as described in FIGS. 11a-11k and 12. The gate of MOSFET 40 receives a PWM control signal from PWM controller 44. The secondary winding of transformer 38 is coupled to rectifier diode 46 to create the DC output voltage $V_{OUT}$ of power supply 30 at node 48. Capacitor 50 filters the DC output voltage $V_{OUT}$. The DC output voltage $V_{OUT}$ is routed back through feedback regulation loop 52 to a control input of PWM controller 44. The DC output voltage $V_{OUT}$ generates the feedback signal which PWM controller 44 uses to regulate the power conversion process and maintain a relatively constant output voltage $V_{OUT}$ under changing loads. The aforedescribed electrical components of the power supply module are typically mounted to and electrically interconnected through a printed circuit board.

In the power conversion process, PWM controller 44 sets the conduction time duty cycle of MOSFET 40 to store energy in the primary winding of transformer 38 and then transfer the stored energy to the secondary winding during the off-time of MOSFET 40. The output voltage $V_{OUT}$ is determined by the energy transfer between the primary winding and secondary winding of transformer 38. The energy transfer is regulated by PWM controller 44 via the duty cycle of the PWM control signal to MOSFET 40. Feedback regulation loop 52 generates the feedback signal to PWM controller 44 in response to the output voltage $V_{OUT}$ to set the conduction time duty cycle of MOSFET 40.

Figure 3:
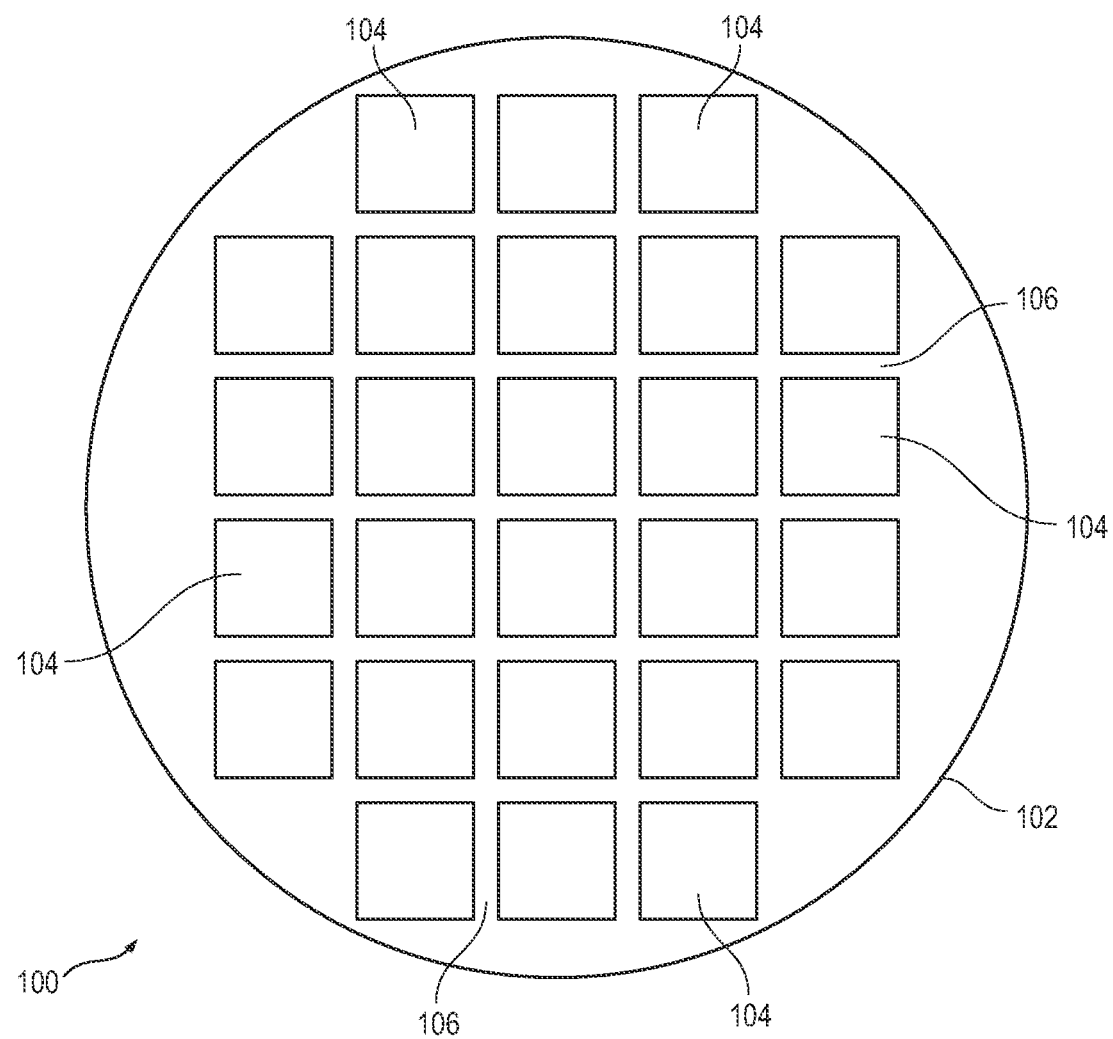
FIG. 3 illustrates a semiconductor wafer with a plurality of semiconductor die.

FIG. 3 shows semiconductor wafer or substrate 100 with a base substrate material 102, such as silicon (Si), SiC, cubic silicon carbide (3C—SiC), germanium, aluminum phosphide, aluminum arsenide, gallium arsenide, gallium nitride, indium phosphide, diamond, and all families of III-V and II-VI semiconductor materials for structural support. In one embodiment, substrate 100 includes a nearly or substantially defect-free SiC substrate, as described in FIGS. 4-17. A plurality of semiconductor die or electrical components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Semiconductor die 104 can be a vertical or lateral power MOSFET with gate and source terminals on a first surface of the die and drain terminal on a second surface opposite the first surface of the die. Semiconductor die 104 can be contained in a semiconductor package, such as TO220, T0247, decawat package (DPAK), double decawat package (D2PAK), TSON, micro leadframe package (MLP), dual flat no-leads (DFN), and other packages for vertical discrete devices or lateral chip scale up-drain packages.

Figure 4A:
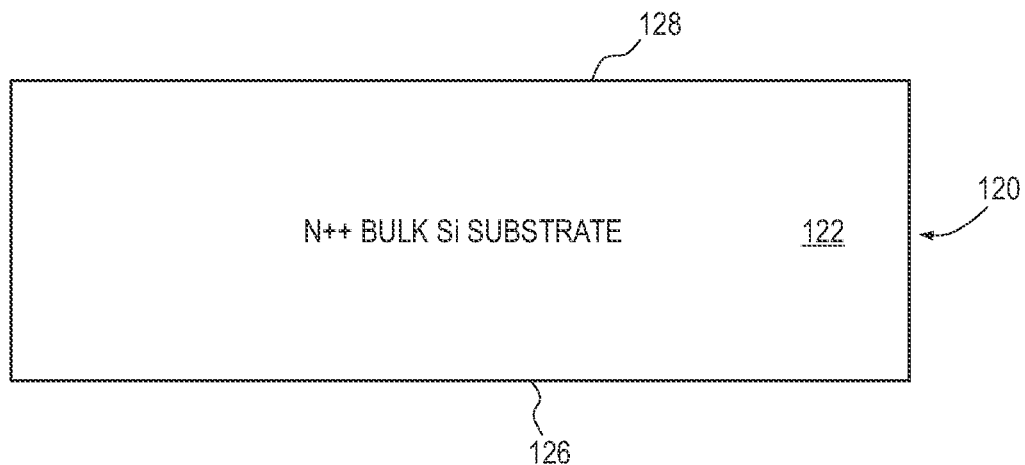
FIGS. 4a-4g illustrate a process of forming a sacrificial heteroepitaxy interface to provide a substantially defect-free SiC substrate.
Figure 4B:
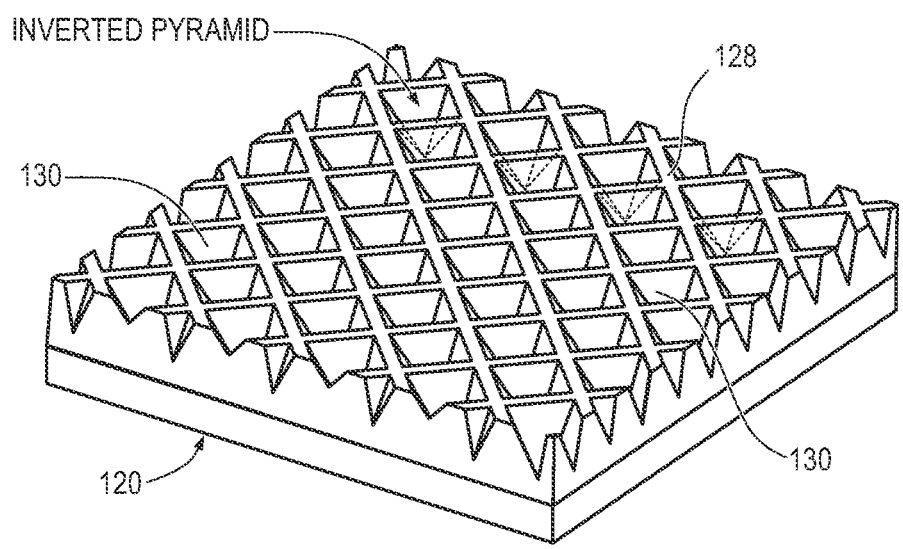

FIGS. 4a-4g illustrate a process of forming a sacrificial heteroepitaxy interface to provide a substantially defect-free SiC or 3C—SiC substrate or layer. FIG. 4a illustrates substrate 120 containing a base semiconductor material 122, such as Si, SiC, 3C—SiC, germanium, aluminum phosphide, aluminum arsenide, gallium arsenide, gallium nitride, indium phosphide, diamond, and all families of III-V and II-VI semiconductor materials for structural support. In one embodiment, substrate 120 contains N++ bulk Si with a thickness of about 350 micrometers (μm). Substrate 120 includes a first surface 126 and second surface 128 opposite the first surface 126. Substrate 120 is a sacrificial, inverted pyramid patterned, compliant, bulk Si substrate. Substrate 120 is sacrificial as it will later be removed. Surface 128 of substrate 120 is an inverted pyramid patterned, textured surface, as shown in FIG. 4b. Small inverted pyramid-shaped voids 130 are patterned and etched into surface 128 to create structured substrate 120.

The structured substrate 120 comes from the consideration that the stacking faults (SF) lie on (111) planes and can interact with each other, stopping the propagation. With two SFs laying, for example, in the (111) and (11-1) planes, the SFs can cross, and the structure is able to stop the propagation of one or even both SFs to improve the crystalline quality of the film surface because the SFs remain buried in the epilayer. The rate of SF annihilation is inversely related to SF density, however, by means of the inverted pyramid pattern, allowing for a significant drop in SF concentration just within a few microns from the heterointerface allows that defect density to decrease with increasing epitaxial layer thickness. The unique pyramid shape can concentrate SFs in small areas, enhancing the phenomenon of SF annihilation.

Figure 4C:
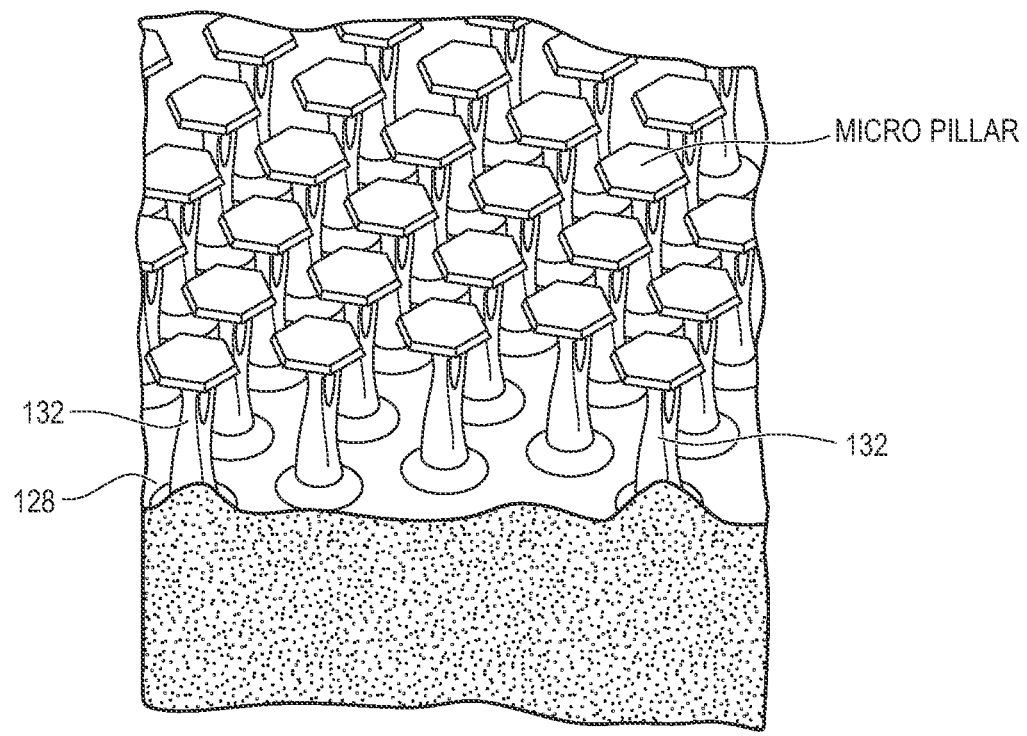
Figure 4D:
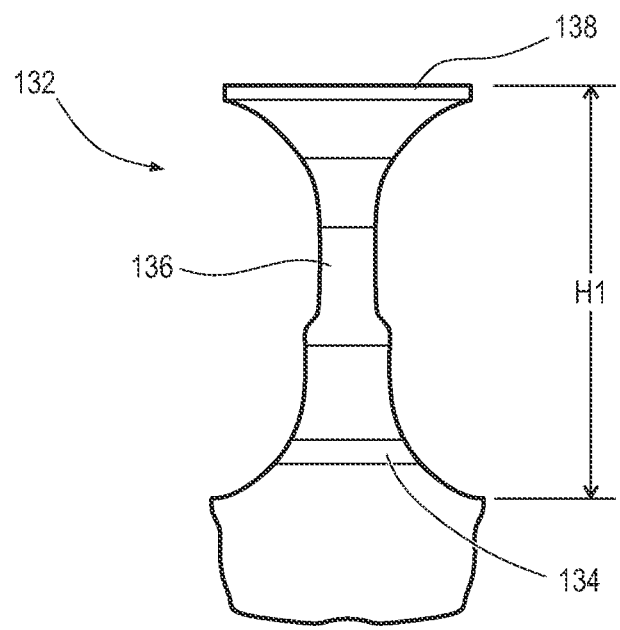

In another embodiment shown in FIG. 4c, a plurality of micropillars 132 is patterned and formed into hexagonal arrays on surface 128 of substrate 120 by a dry etching process. Micropillars 132 can be made with Si. FIG. 4d illustrates one micropillar 132 with base 134, stem 136, and pedestal 138. The height H1 of micropillar 132 is about 9.35 μm. Pedestal 138 of one micropillar 132 may contact another pedestal of an adjacent micropillar. The compliant substrate 120 with micropillars 132 releases the stress developed in 3C—SiC grown on Si substrate, due to the lattice mismatch and the different CTE between 3C—SiC and Si.

Figure 4E:
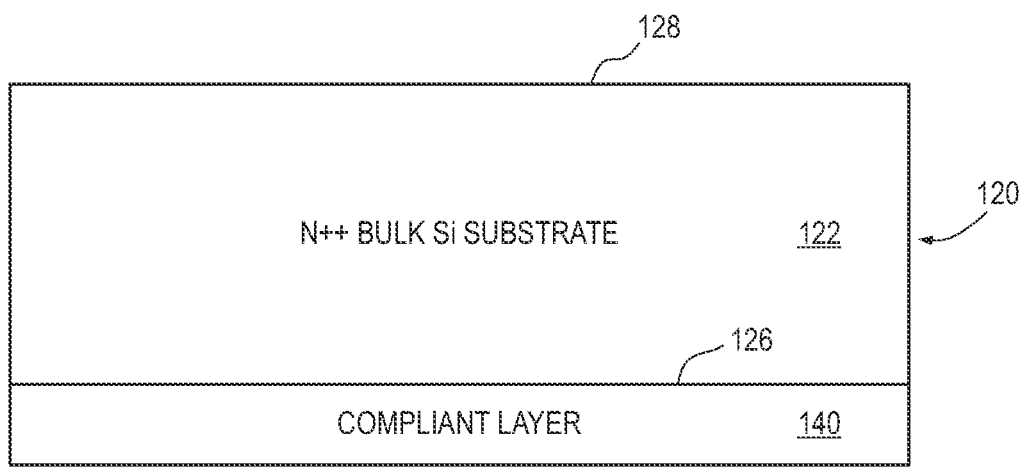

In FIG. 4e, compliant layer 140 is deposited on surface 126 using physical vapor deposition (PVD), chemical vapor deposition (CVD), plasma enhanced chemical vapor deposition (PECVD), low pressure chemical vapor deposition (LPCVD), tetraethylorthosilicate (TEOS), or other suitable deposition process. In one embodiment, compliant layer 140 includes a polysilicon or oxide layer formed using LPCVD to a thickness of 2-3 μm.

Figure 4F:
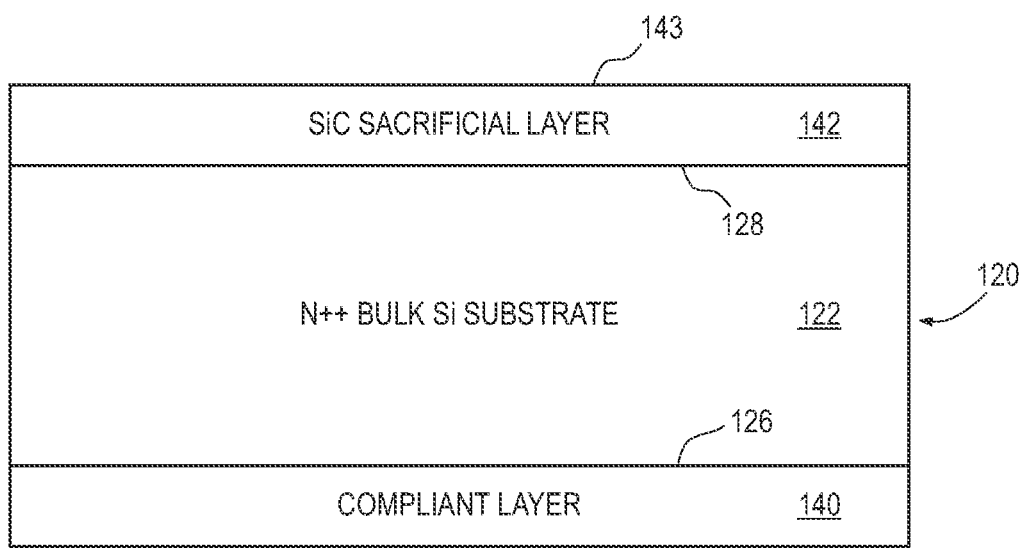

In FIG. 4f, substrate 120 and compliant layer 140 provide the foundation to grow a desired substantially defect-free SiC or 3C—SiC substrate. In particular, a thin film sacrificial layer 142 is grown on the inverted pyramid patterned and textured growth (or micro-pillar 132) surface 128. Sacrificial layer 142 is a heteroepitaxy, high defect density semiconductor layer. In one embodiment, sacrificial layer 142 is a SiC or 3C—SiC layer formed using a hot wall CVD chamber or reactor to a thickness of 3-6 μm. The heteroepitaxy growth involves dissimilar materials, e.g., SiC or 3C—SiC sacrificial layer 142 on Si substrate 120. In the hot wall CVD reactor, heat is radiated to the substrate from the chamber walls to achieve a uniform temperature distribution and uniform coating thickness. The reaction uses multiple steps at varying temperatures, including carbonization step at 1100° C. and SiC growth at 1380° C.

Figure 4G:
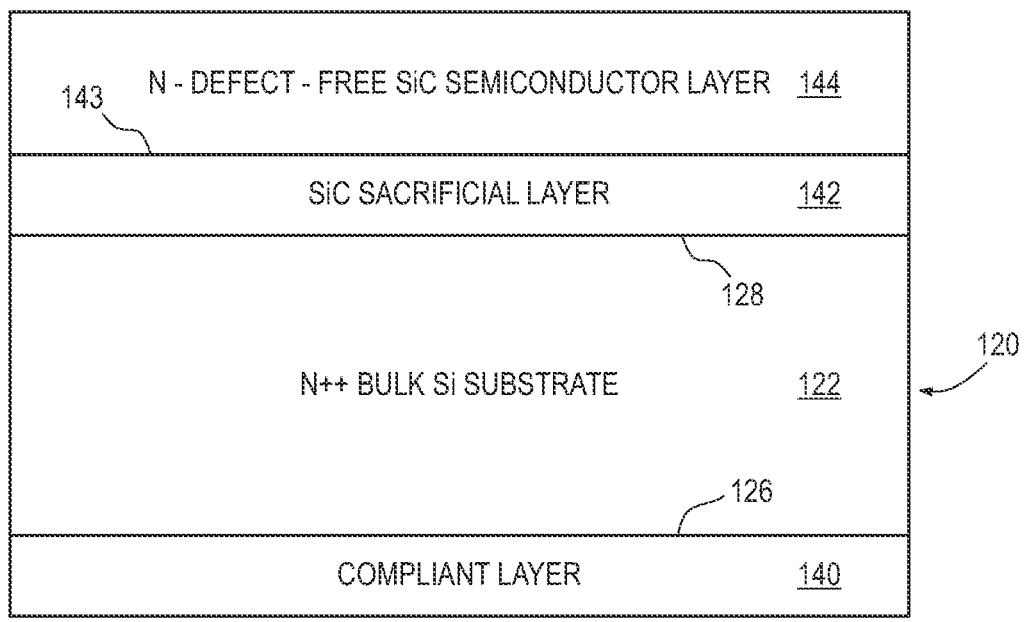

In FIG. 4g, semiconductor layer 144 is epitaxially grown over surface 143 of sacrificial layer 142. In one embodiment, semiconductor layer 144 is implanted with n-type dopant, e.g., phosphorus at $7.3e14$ atoms/cm$^3$ to form an N− SiC epi or N− 3C—SiC epi layer with a thickness of 30-60 μm.

An important structure to avoid bow warp has an epitaxial growth as follows. Six 3C—SiC on Si epi wafers exhibit growth on 1.0 mm by 152.4 mm Si substrates to ensure 250 μm of wafer bow over the total wafer diameter, growth of 4.0 μm of 1e18 n-type doped 3C—SiC (buffer layer), and growth of 6.0 μm of 2e16 n-type doped 3C—SiC (device layer) on the buffer layer.

Of particular relevance is that the contact between semiconductor material 122 (Si) and semiconductor layer 142 (SiC or 3C—SiC) involves a heterointerface between two dissimilar materials with different lattice structures and different CTE. The growth of the SiC or 3C—SiC semiconductor layers 144 over Si substrate 120, cycling over a temperature range, creates stress and strain at the hetero-boundary around surface 128, which results in defects in or around the interface regions. The density of defects can be significant at the interface region proximate to surface 128, hence semiconductor layer 142 is characterized as having a high defect density. Small inverted pyramid-shaped voids 130, or micropillars 132, formed in surface 128 operate to self-annihilate or otherwise relieve the stress and associated expansion of defects. With compliant layer 140, substrate 120 softens during extreme temperature cycles in formation of the SiC or 3C—SiC semiconductor layer 142 so the stress and strain inherent to heteroepitaxy growth can reside in, and are substantially limited to, substrate 120 and semiconductor layer 142. Defects are confined to about 3-6 µm from surface 128 into semiconductor layer 142 and about 3-6 µm from surface 128 into semiconductor material 122. The SiC or 3C—SiC semiconductor layer 144 is nearly defect-free, because the defects substantially occur in and are confined to sacrificial semiconductor layer 142.

Figure 5A:
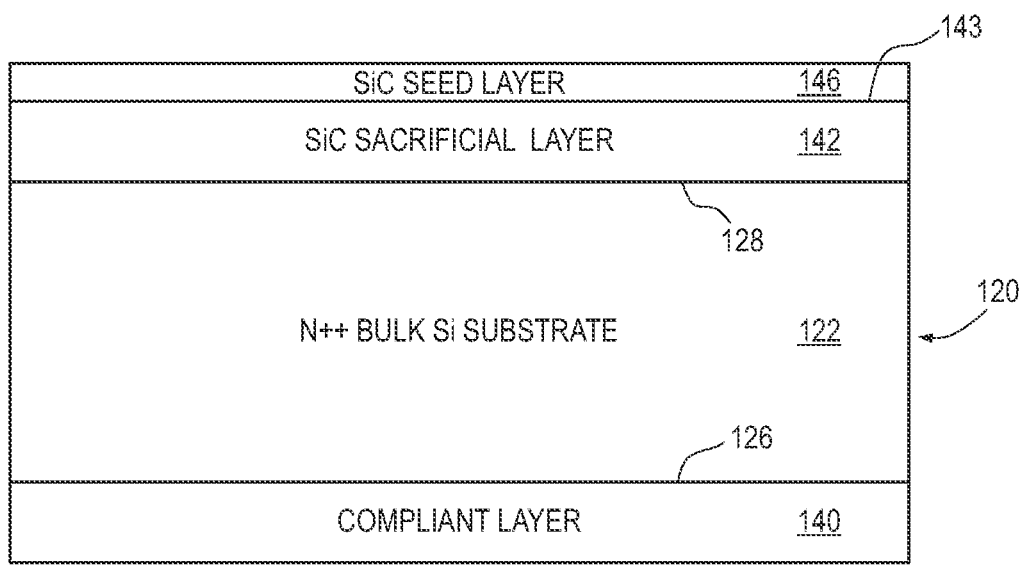
FIGS. 5a-5d illustrate another process of forming a substantially defect-free SiC substrate.

In another embodiment, continuing from FIG. 4f and as shown in FIG. 5a, seed layer 146 is epitaxially grown on surface 143 of sacrificial layer 142 at a temperature less than the melting point of base Si semiconductor material 122, i.e., about 1275-1414° C. In one embodiment, the temperature is about 1350° C. Seed layer 146 can be SiC or 3C—SiC with a thickness of 10-50 µm. In this case, sacrificial layer 142 is SiC or 3C—SiC.

Figure 5B:
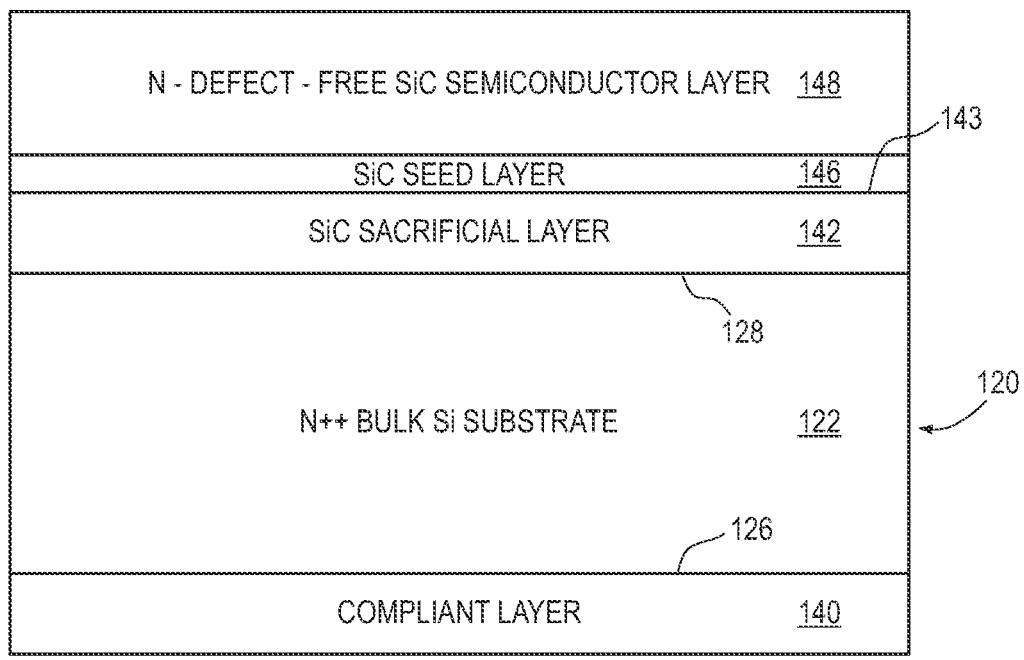

In FIG. 5b, semiconductor layer 148 is epitaxially grown over seed layer 146 to a thickness of 200 µm, at a temperature greater than the melting point of base Si semiconductor material 122 and compliant layer 140, i.e., above 1414° C. In one embodiment, the temperature is about 1700° C. Semiconductor layer 148 is implanted with n-type dopant, e.g., phosphorus at 7.3e14 atoms/cm³ to form an N- SiC epi or N- 3C—SiC epi layer with a thickness of 30-60 µm. The formation of semiconductor layer 148 substantially absorbs seed layer 146.

Figure 5C:
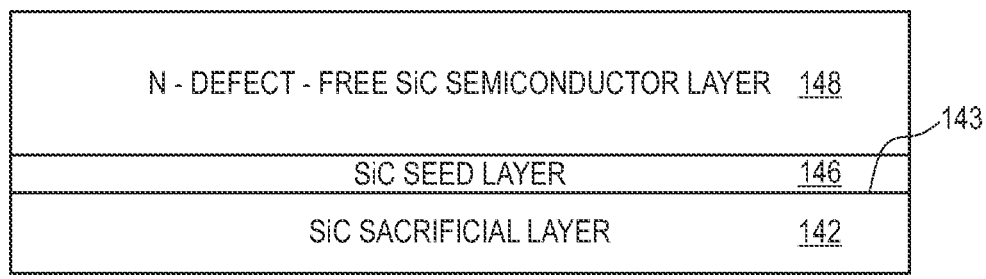

While SiC sacrificial layer 142 has a high defect density, seed layer 146 and semiconductor layer 148 have a relatively low defect density, i.e., substantially defect-free, because the defects have been confined to the SiC sacrificial layer. Using the higher melting point of SiC material as compared to Si material, a substantial portion if not all of the Si material (substrate 120 and compliant layer 140) is melted away, as shown in FIG. 5c. For example, Si material of substrate 120 and compliant layer 140 are being removed above 1500° C.

Figure 5D:
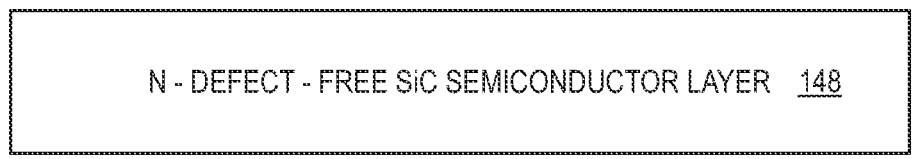

In FIG. 5d, SiC sacrificial layer 142 and any remaining portion of seed layer 146 is removed by a grinding operation, deleting any remnant of the heterointerface including defects in the sacrificial layer, leaving nearly or substantially defect-free SiC material in semiconductor layer 148. Any CTE mismatch and lattice mismatch would have been reduced or eliminated. The SiC or 3C—SiC semiconductor layer 148 is nearly or substantially defect-free, because the defects have been confined to and removed in the Si material and SiC sacrificial layer 142.

Figure 6A:
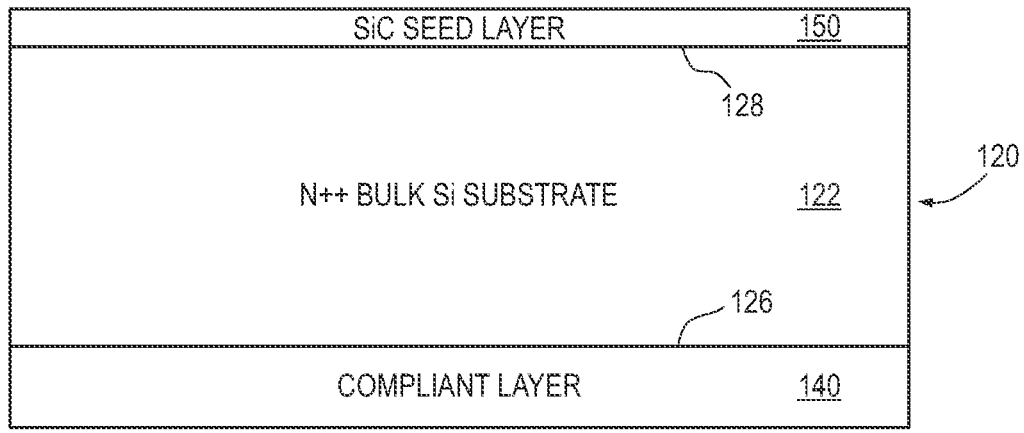
FIGS. 6a-6e illustrate another process of forming a substantially defect-free SiC substrate.

In another embodiment, continuing from FIG. 4e and as shown in FIG. 6a, seed layer 150 is epitaxially grown on surface 128 of substrate 120 at a temperature less than the melting point of base Si semiconductor material 122, i.e., about 1275-1414° C. Seed layer 150 can be SiC or 3C—SiC with a thickness of 10-50 µm.

Figure 6B:
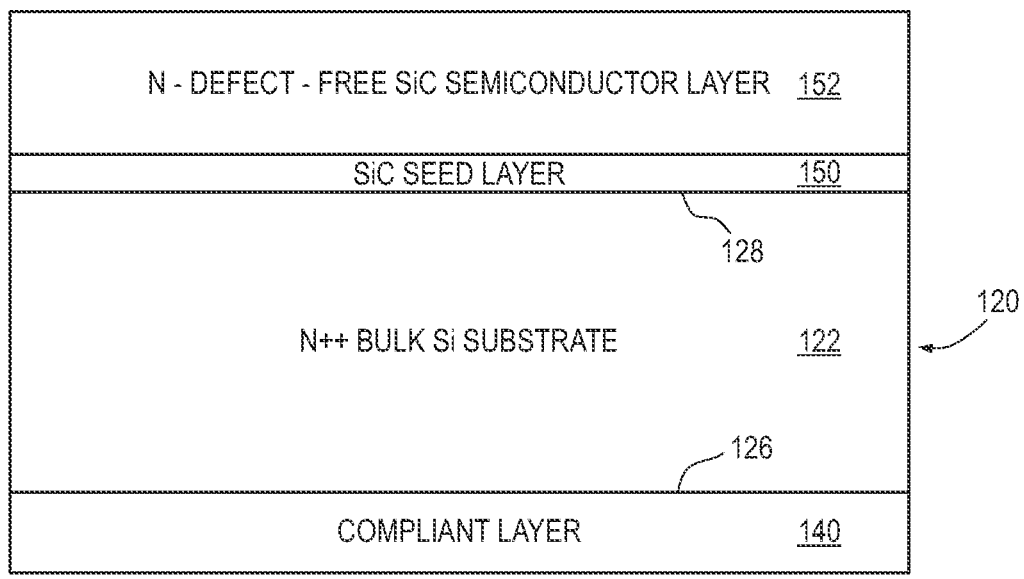

In FIG. 6b, semiconductor layer 152 is epitaxially grown over seed layer 150. In one embodiment, semiconductor layer 152 is implanted with n-type dopant, e.g., phosphorus at 7.3e14 atoms/cm³ to form an N— SiC epi or N- 3C—SiC epi layer with a thickness of 30-60 µm using hot wall CVD epitaxial growth. Si substrate 122 will contain a high defect density region proximate to surface 128 to a depth of 4-5 µm. The formation of semiconductor layer 152 substantially absorbs seed layer 150.

Figure 6C:
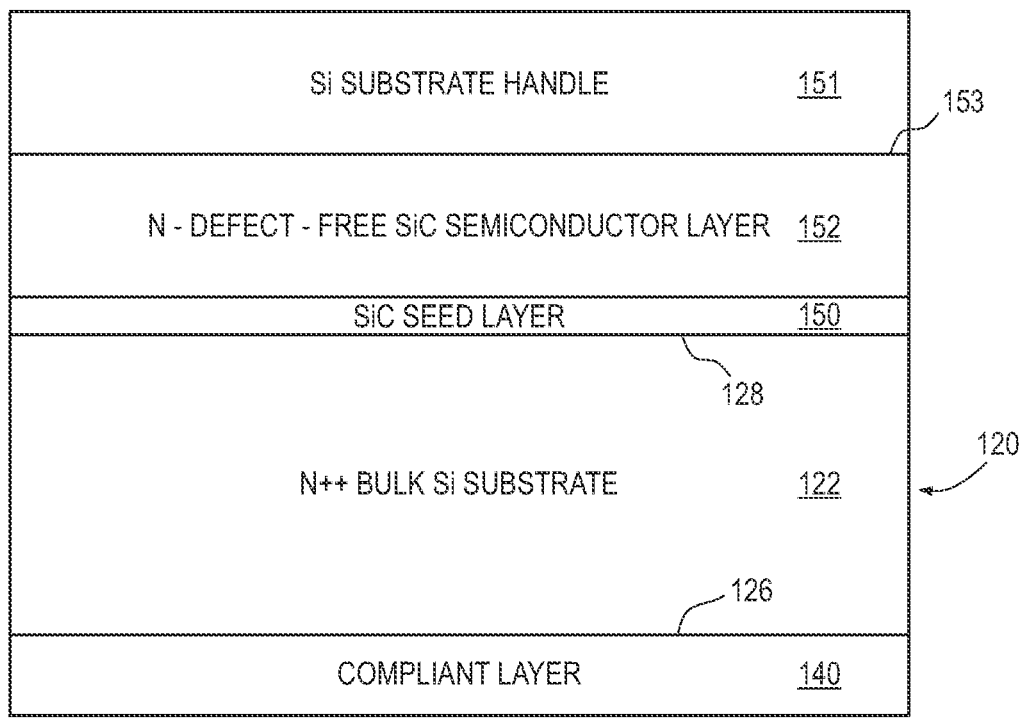
Figure 6D:
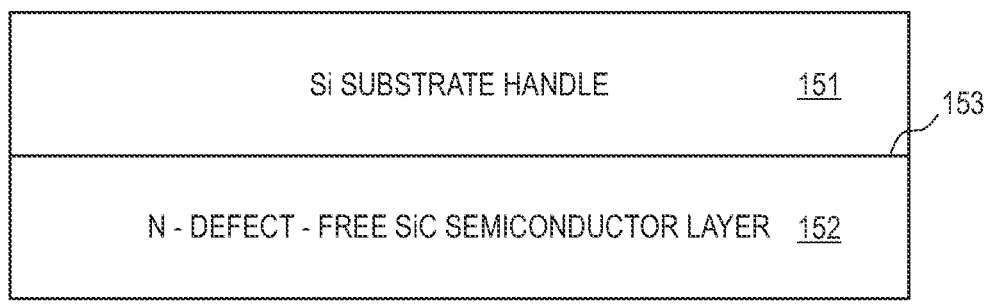
Figure 6E:
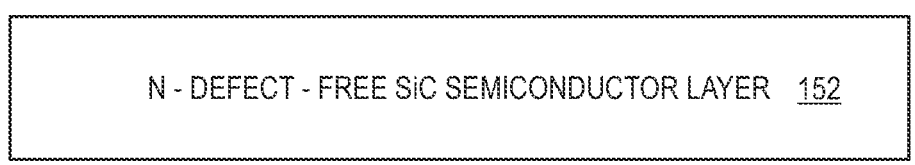

In FIG. 6c, Si substrate 151 is bonded to surface 153 of SiC semiconductor layer 152. Si substrate 151 operates a support base or handle for a grinding operation. In FIG. 6d, seed layer 150, Si substrate 122, and compliant layer 140 are removed by a grinding operation, deleting any remnant of the heterointerface including defects in the Si substrate, and leaving nearly defect-free SiC material in semiconductor layer 152. In FIG. 6e, Si substrate handle 151 is removed leaving nearly defect-free SiC material in semiconductor layer 152.

Alternatively, semiconductor layer 152 is epitaxially grown over seed layer 150 to a thickness of 200 µm, at a temperature greater than the melting point of base Si semiconductor material 122 and compliant layer 140, i.e., above 1414° C. In one embodiment, the temperature is about 1700° C. Semiconductor layer 152 is implanted with n-type dopant, e.g., phosphorus at 7.3e14 atoms/cm³ to form an N- SiC epi or N- 3C—SiC epi layer with a thickness of 30-60 µm.

While N++ bulk Si substrate 122 has a high defect density region proximate to surface 128 to a depth of 4-5 seed layer 150 and semiconductor layer 152 have a relatively low defect density, i.e., substantially defect-free, because the defects have been confined to the bulk Si substrate. Using the higher melting point of SiC material as compared to Si material, a substantial portion if not all of the Si material (substrate 120 and compliant layer 140) is melted away, deleting any remnant of the heterointerface including defects in the Si substrate, and leaving nearly defect-free SiC material in semiconductor layer 152. For example, Si material of substrate 120 and compliant layer 140 are being removed above 1500° C. Any remaining portion of seed layer 150 is removed by a grinding operation, leaving nearly defect-free SiC material in semiconductor layer 152, similar to FIG. 6e.

Figure 7A:
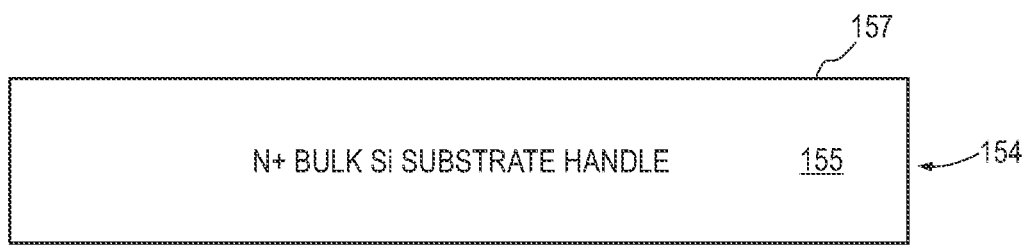
FIGS. 7a-7d illustrate a process of forming a semiconductor layer over a substrate.

FIG. 7a illustrates substrate 154 containing a base semiconductor material 155, such as Si, SiC, 3C—SiC, germanium, aluminum phosphide, aluminum arsenide, gallium arsenide, gallium nitride, indium phosphide, diamond, and all families of III-V and II-VI semiconductor materials for structural support. In one embodiment, substrate 154 is a heavily doped N+ Si substrate with a thickness of 700 µm.

Figure 7B:
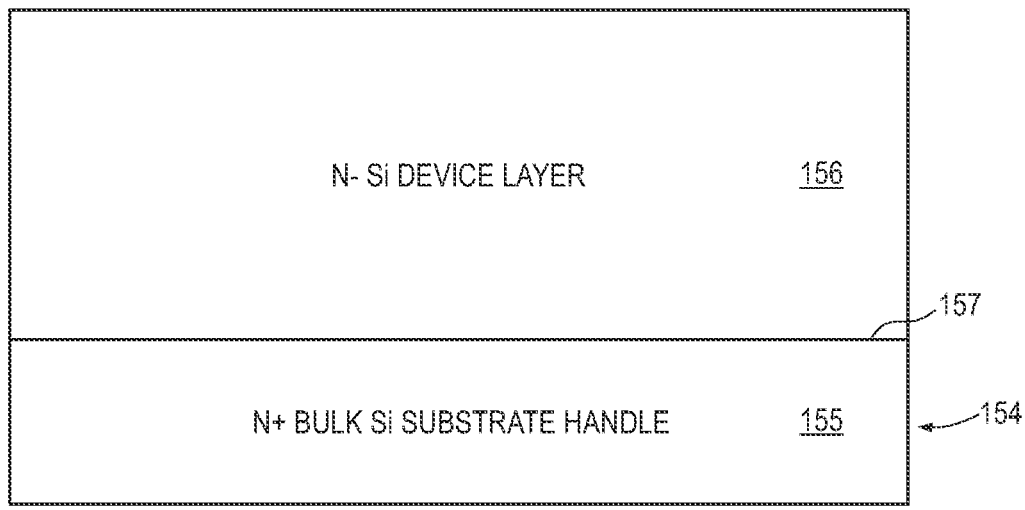

In FIG. 7b, semiconductor layer 156 is epitaxially grown on surface 157 of substrate 154. The epitaxial growth or deposition occurs in a reaction chamber at a temperature of about 750-1200° C. In one embodiment, semiconductor layer 156 is doped with phosphorus at 1e13 to 1e17 atoms/cm³ to form an N- Si epi layer with a thickness of 50-150 Semiconductor layer 156 operates as a device layer designated for formation of a semiconductor device, such as a power MOSFET or diode.

Figure 7C:
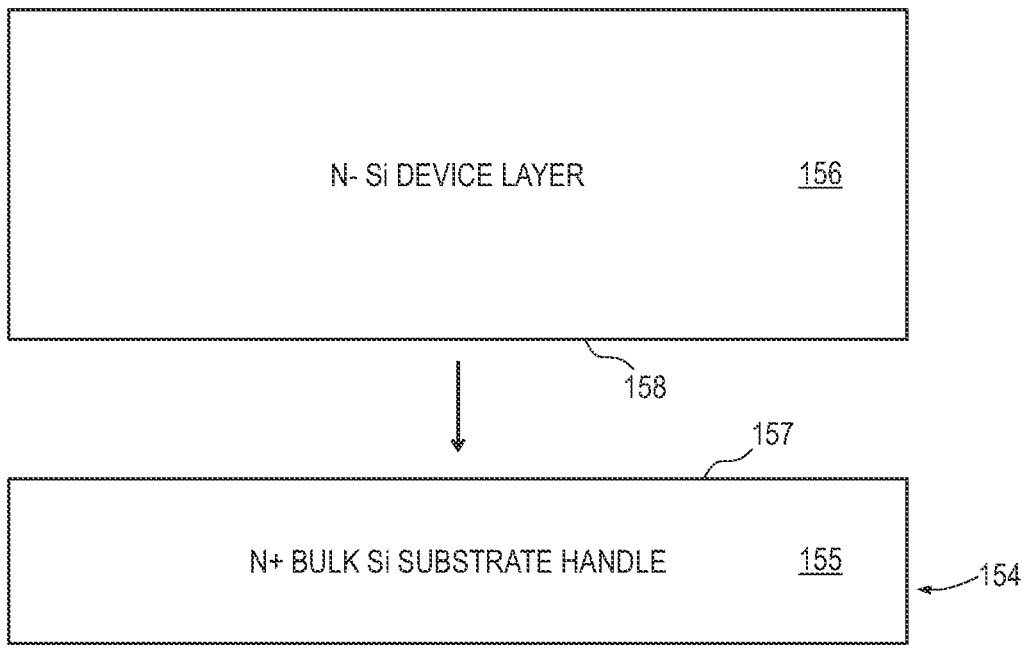
Figure 7D:
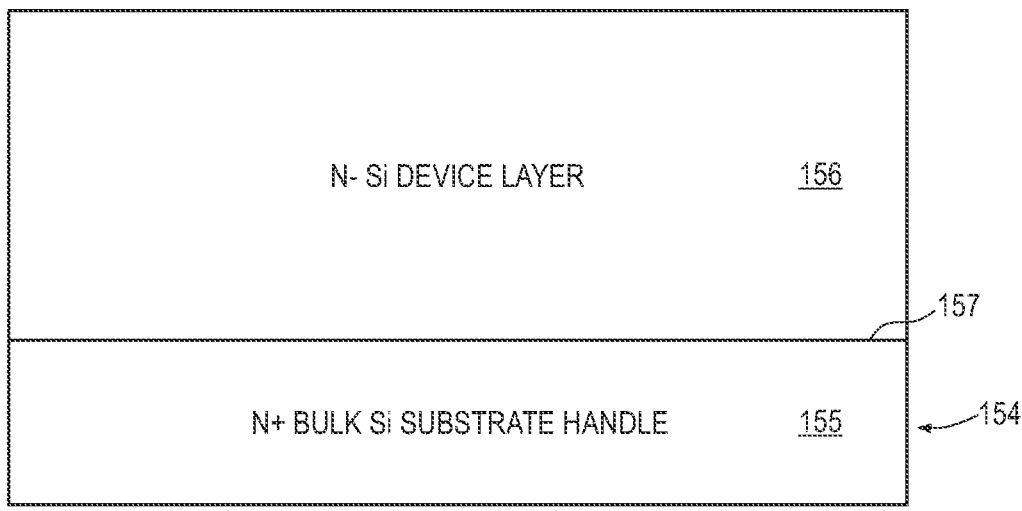

Alternatively, semiconductor layer 156 can be joined to substrate 154 using a high temperature anneal, fusion bonding, plasma activated direct wafer bonding (DWB), or other DWB process. In FIG. 7c, semiconductor layer 156 is disposed over surface 157 of substrate 154. Surface 158 of semiconductor layer 156 and surface 157 of substrate 154 are planarized, polished, and cleaned to be flat and smooth, prior to bonding. The lattice structures of semiconductor layer 156 and substrate 154 can be aligned to optimize adhesion. Water molecules can be applied to surfaces 157 and 158 to aid in the bonding process. Surface 158 of semiconductor layer 156 is brought into contact with surface 157 of substrate 154. DWB is accomplished with chemical bonds and intermolecular interactions at temperature, including van der Waals forces, hydrogen bonds, and covalent bonds, between surface 157 and surface 158. DWB temperatures range from ambient to 100's ° C. FIG. 7d shows semiconductor layer 156 direct wafer bonded to surface 157 of substrate 154.

In one embodiment shown in FIGS. 8a-8d, the combination of substrate 154 and semiconductor layer 156 from FIG. 7b or 7d is joined to semiconductor layer 144 from FIG. 4g using a high temperature anneal, fusion bonding, plasma activated DWB, or other DWB process. The semiconductor layers shown in the figures are not drawn to scale.

Figure 8A:
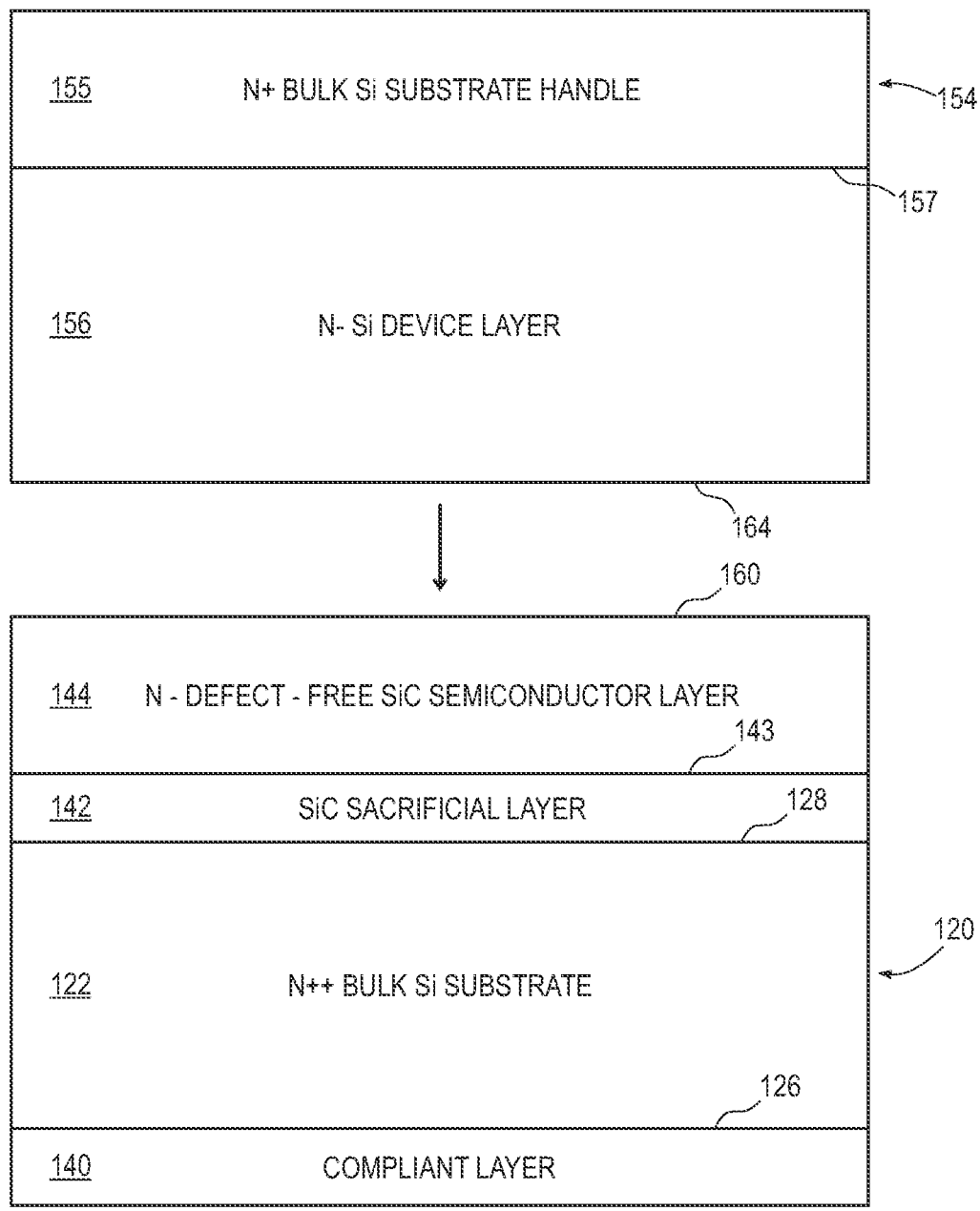
FIGS. 8a-8c illustrate a process of bonding the structure from FIG. 7d to the structure from FIG. 4g.

FIG. 8a illustrates the combination of substrate 154 and semiconductor layer 156 from FIG. 7b or 7d disposed over surface 160 of semiconductor layer 144. Surface 160 of semiconductor layer 144 and surface 164 of semiconductor layer 156 are planarized, polished, and cleaned to be flat and smooth, prior to bonding. The lattice structures of semiconductor layer 156 and semiconductor layer 144 can be aligned to optimize adhesion. Water molecules can be applied to surfaces 160 and 164 to aid in the bonding process. Surface 164 of semiconductor layer 156 is brought into contact with surface 160 of semiconductor layer 144. DWB is accomplished with chemical bonds and intermolecular interactions at temperature, including van der Waals forces, hydrogen bonds, and covalent bonds, between surface 160 and surface 164. DWB temperatures range from ambient to 100's ° C.

Figure 8B:
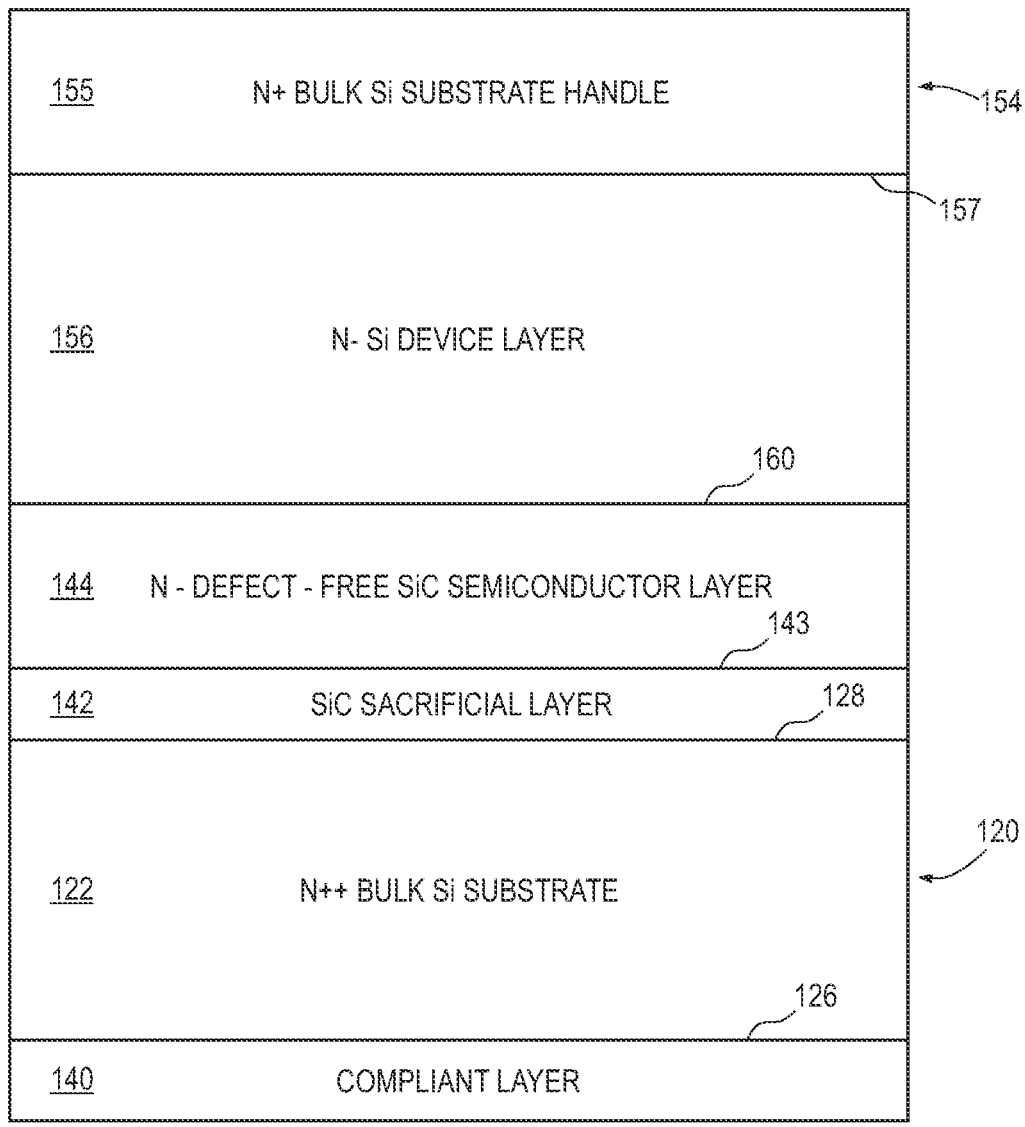

FIG. 8b shows semiconductor layer 156 direct wafer bonded to surface 160 of semiconductor layer 144. Surface 160 of semiconductor layer 144 is substantially oxide/defect-free Si face to enable direct covalent bonding to Si face of surface 164 of semiconductor layer 156. The interface between semiconductor layer 144 and semiconductor layer 156 exhibits a strong bond with little or no defects in the crystalline structure.

Figure 8C:
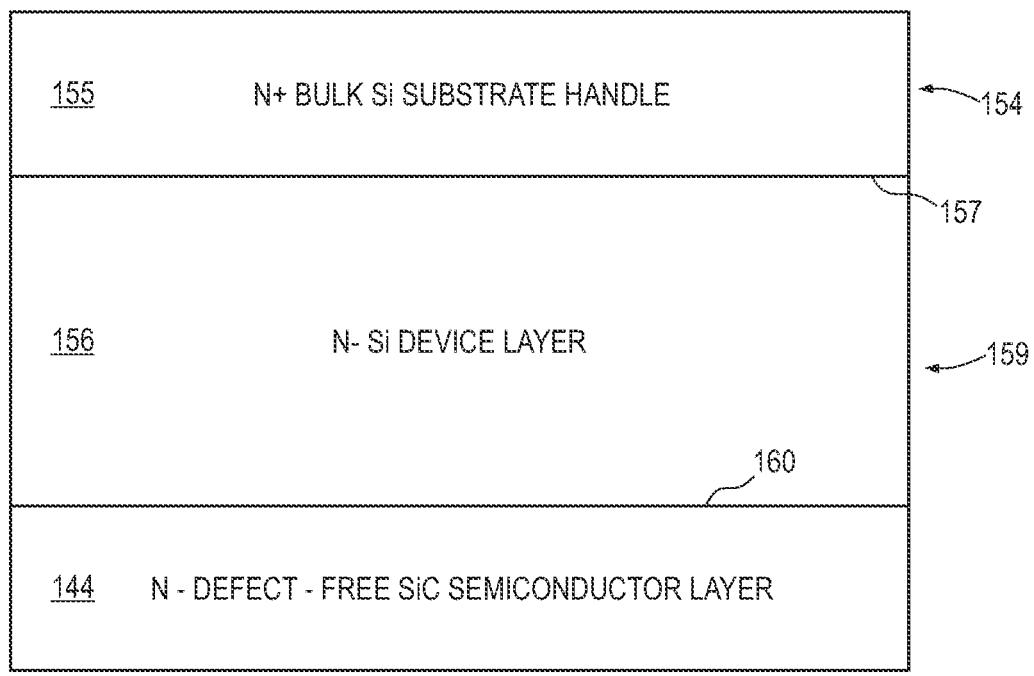

In FIG. 8c, compliant layer 140, sacrificial substrate 120, and sacrificial semiconductor layer 142 are removed by chemical etching, CMP, mechanical peel-off, mechanical grinding, thermal bake, UV light, or wet stripping, leaving N+ Si substrate 154, N− semiconductor device layer 156, and substantially defect-free N− SiC or 3C—SiC semiconductor layer 144. The removal of the sacrificial layers 120 and 142 takes away or eliminates the defects formed by the heteroepitaxial interface and associated lattice mismatch and different CTEs of the dissimilar materials. The above process allows for the formation of defects at the heteroepitaxial interface but confines the defects to the sacrificial layers and then removes the defective material leaving nearly or substantially defect-free semiconductor layer 144 in engineered substrate 159.

Figure 9A:
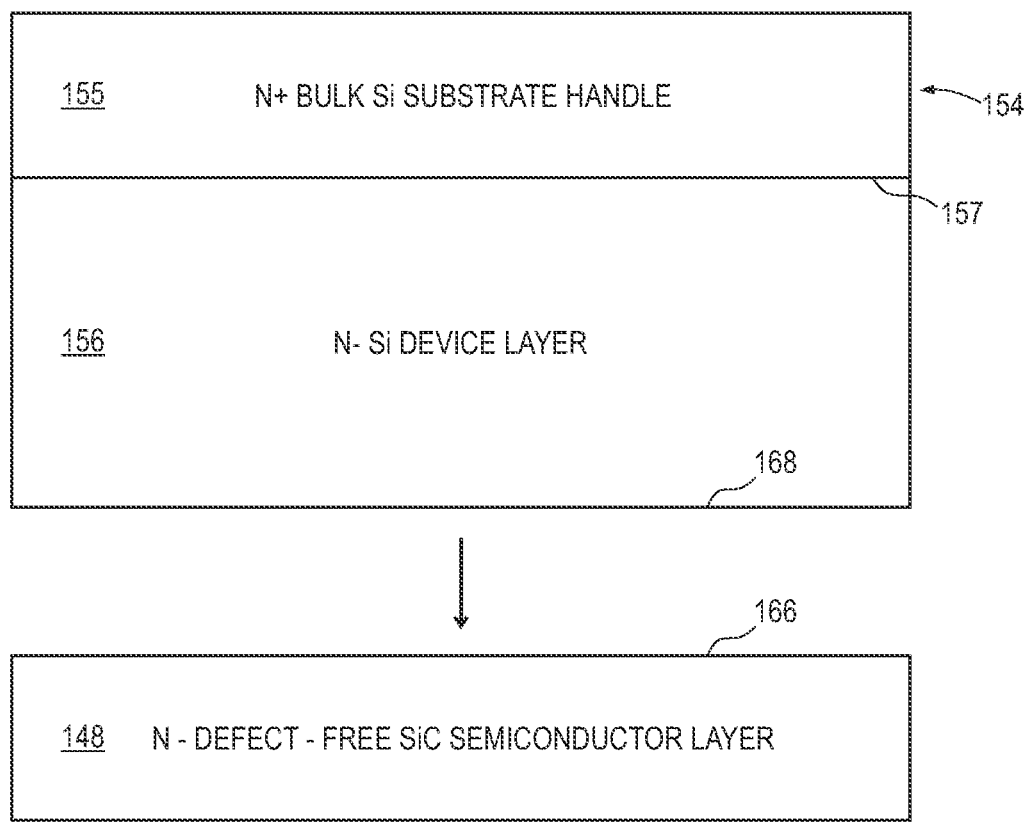
FIGS. 9a-9b illustrate a process of bonding the structure from FIG. 7d to the structure from FIG. 5d or 6e.
Figure 9B:
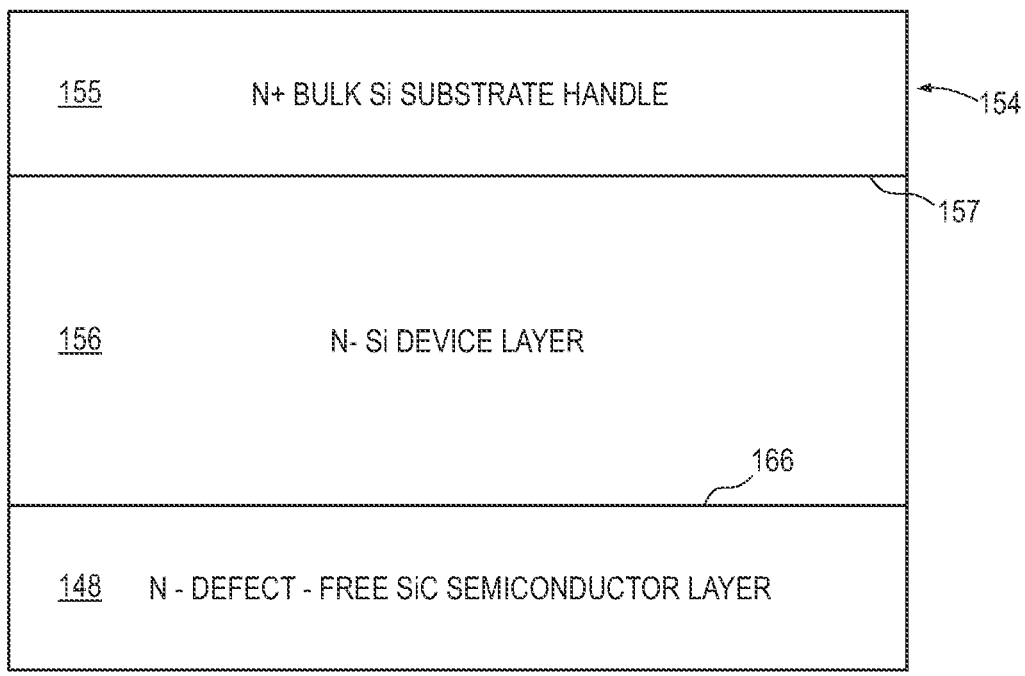

In another embodiment shown in FIGS. 9a-9b, the combination of substrate 154 and semiconductor layer 156 from FIG. 7b or 7d is joined to semiconductor layer 148 from FIG. 5d or semiconductor layer 152 from FIG. 6e using a high temperature anneal, fusion bonding, plasma activated DWB, or other DWB process. The following discussion uses semiconductor layer 148, although the same applies to semiconductor layer 152.

FIG. 9a illustrates the combination of substrate 154 and semiconductor layer 156 from FIG. 7b or 7d disposed over surface 166 of semiconductor layer 148. Surface 166 of semiconductor layer 148 and surface 168 of semiconductor layer 156 are planarized, polished, and cleaned to be flat and smooth, prior to bonding. The lattice structures of semiconductor layer 156 and semiconductor layer 148 can be aligned to optimize adhesion. Water molecules can be applied to surfaces 166 and 168 to aid in the bonding process. Surface 168 of semiconductor layer 156 is brought into contact with surface 166 of semiconductor layer 148. DWB is accomplished with chemical bonds and intermolecular interactions at temperature, including van der Waals forces, hydrogen bonds, and covalent bonds, between surface 166 and surface 168. DWB temperatures range from ambient to 100's ° C.

FIG. 9b shows semiconductor layer 156 direct wafer bonded to surface 166 of semiconductor layer 148. Surface 166 of semiconductor layer 148 is substantially oxide/defect-free Si face to enable direct covalent bonding to Si face of surface 168 of semiconductor layer 156. The interface between semiconductor layer 148 and semiconductor layer 156 exhibits a strong bond with little or no defects in the crystalline structure. A similar bonding can be done with semiconductor layer 152.

Figure 10A:
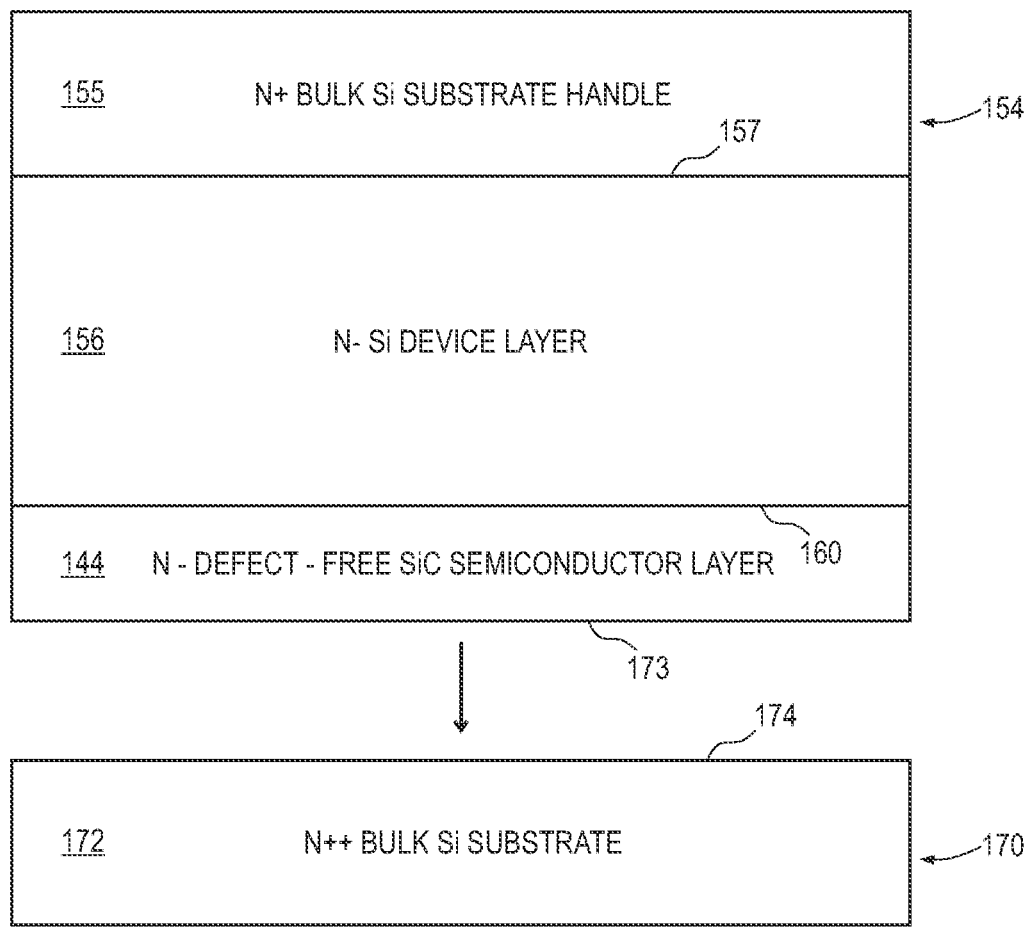
FIGS. 10a-10d illustrate a process of bonding the structure from FIG. 8c or 9b to a substrate.

The structure from FIG. 8c or FIG. 9b is joined to substrate 170 using a high temperature anneal, fusion bonding, plasma activated DWB, or other DWB process. In FIG. 10a, the structure from FIG. 8c or 9b is disposed over surface 174 of substrate 170. Substrate 170 contains semiconductor material 172. In one embodiment, semiconductor material 172 is N++ Si or SiC. Surface 173 of semiconductor layer 144 and surface 174 of substrate 170 are planarized, polished, and cleaned to be flat and smooth, prior to bonding. The lattice structures of semiconductor layer 144 and substrate 170 can be aligned to optimize adhesion. Water molecules can be applied to surfaces 173 and 174 to aid in the bonding process. Surface 173 of semiconductor layer 144 is brought into contact with surface 174 of substrate 170. DWB is accomplished with chemical bonds and intermolecular interactions at temperature, including van der Waals forces, hydrogen bonds, and covalent bonds, between surface 173 and surface 174. DWB temperatures range from ambient to 100's ° C.

Figure 10B:
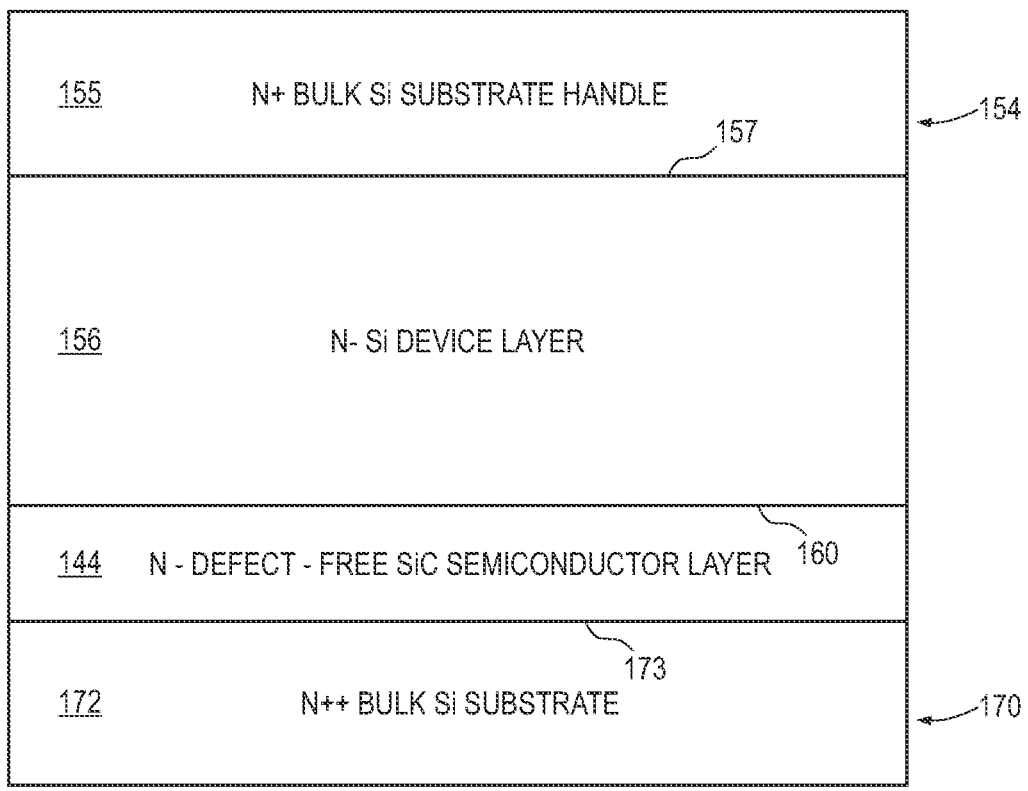

FIG. 10b shows semiconductor layer 144 direct wafer bonded to surface 174 of substrate 170. Substrate 170 operates as a handle or leverage point to remove substrate 154, without damage to semiconductor layer 144. Substrate 154 is removed by chemical etching, CMP, mechanical peel-off, mechanical grinding, thermal bake, UV light, or wet stripping.

Figure 10C:
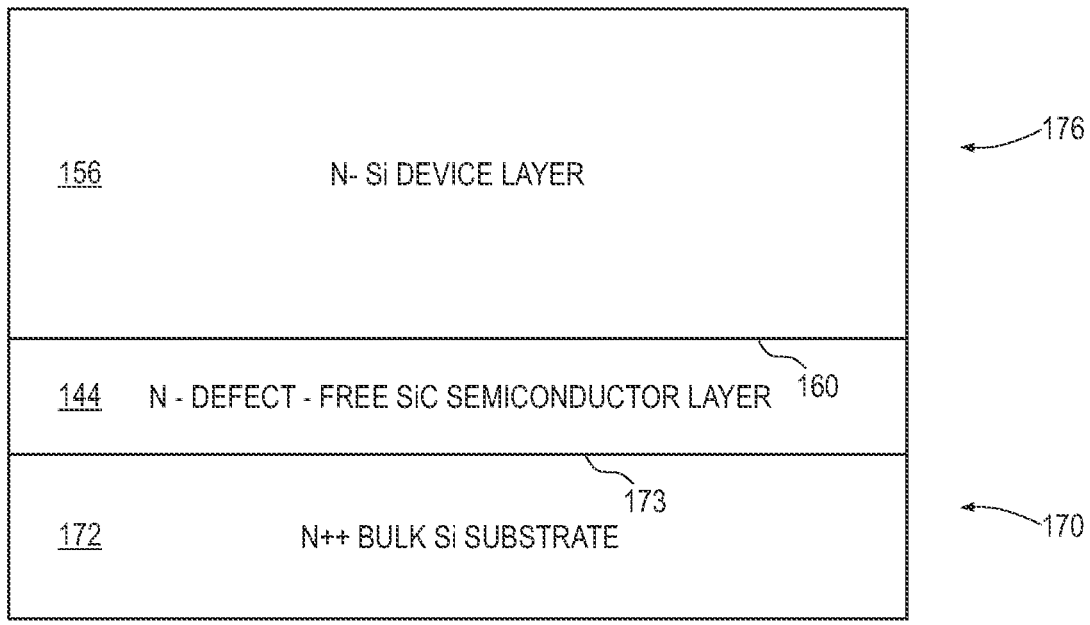

FIG. 10c shows SiC or 3C—SiC engineered substrate 176 containing N− Si semiconductor device layer 156, substantially defect-free N− SiC or 3C—SiC semiconductor layer 144, and N++ Si or SiC substrate 170, following removal of substrate 154. The sacrificial semiconductor layer 142 or Si substrate 120 containing substantially all the defects resulting from the heteroepitaxy interface has been removed, leaving semiconductor layer 144 near or substantially defect-free. In the prior art, work has focused on reducing defects. The present invention is not based on reducing defect generation, as discussed in the Background, but rather is about confining the defects to semiconductor layer 142 or Si substrate 120, and then removing the high defect density layer 142 or Si substrate 120. Engineered substrate 176 can be made at substantially less cost than conventional SiC substrates, while achieving near or substantially defect-free SiC base material.

Figure 10D:
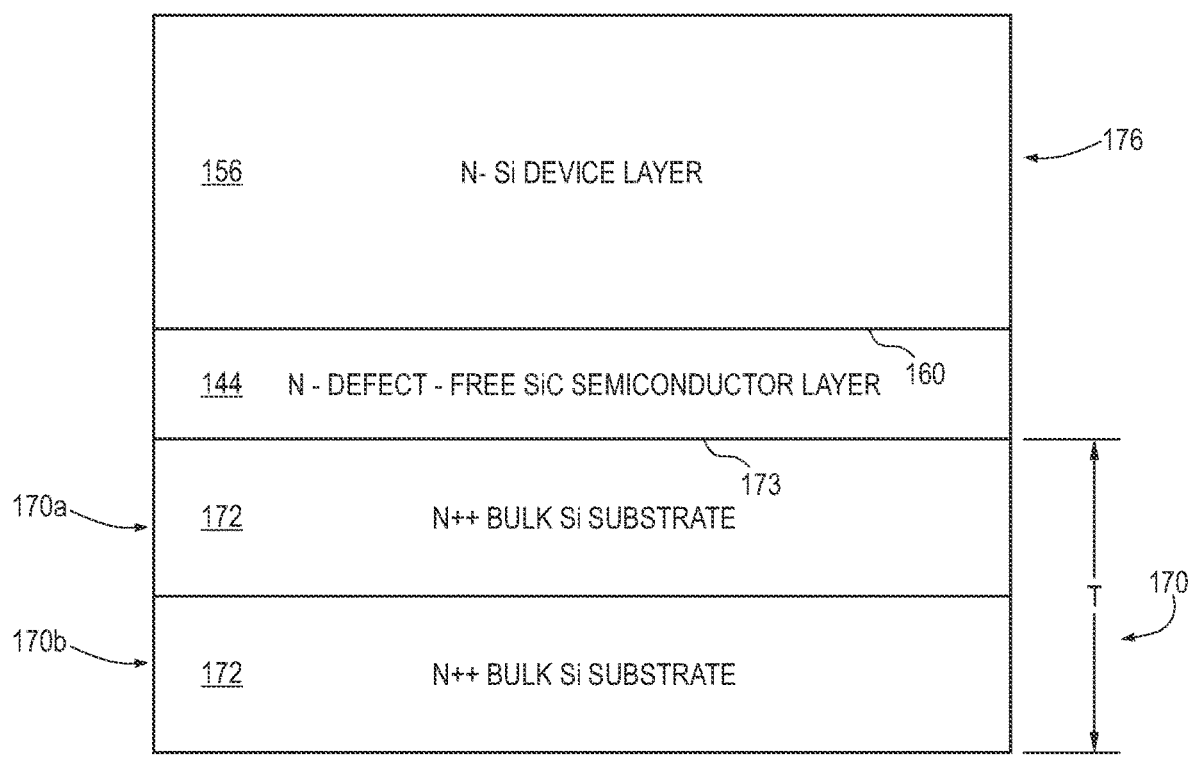

In the case of the Si epi layer grown on the SiC epi layer, as described in FIG. 10c, there may be, in some cases, warpage propagated through the Si epi layer due to mismatch in the coefficient of thermal expansion between the Si epi layer and SiC epi layer. In addition, there is a possible lattice mismatch and other stacking defects between the Si epi layer and SiC epi layer creating stress at the junction between the Si epi layer and SiC epi layer. To overcome these possible issues, including the potential warpage, FIG. 10d shows substrate 170 made with two or more heavily doped N++ Si substrates 170a and 170b bonded together using DWB, as described in FIGS. 10a-10c, with a thickness T=1000 µm. Multiple substrates can be bonded together using DWB to create a thick N++ Si substrate 170. The thick multi-layer Si substrate 170a-170b using DWB reduces or eliminates the potential warpage noted for semiconductor layer 144.

The SiC or 3C—SiC engineered substrate 176, as described in FIGS. 4-10, can be used as a foundation to form a variety of semiconductor devices. For example, engineered substrate 176 can be used as a SiC or 3C—SiC foundation to form a high voltage power MOSFET.

FIGS. 11a-11k illustrate a novel 1200 volt breakdown silicon super-junction metal oxide semiconductor power transistor (SJMOS) with a silicon-carbide engineered drain to take advantage of the low on resistance performance from wide band gap (WBG) materials. By further merging high volume micro-electro-mechanical systems (MEMS) manufacturing techniques to enable structures robust to harsh space radiation environments and provide a new class of vertical-power transistors. The merger of SJMOS structures with MEMS manufacturing techniques and WBG material (collectively SMW) enables devices that, for example, can sustain 1200V blocking with no heavy-ion-induced permanent destructive effects upon exposure to high energy radiation of 87 Mev-cm$^2$/mg while delivering $R_{DSON}$ of 90 milliohms at ID max=40 A.

Figure 11A:
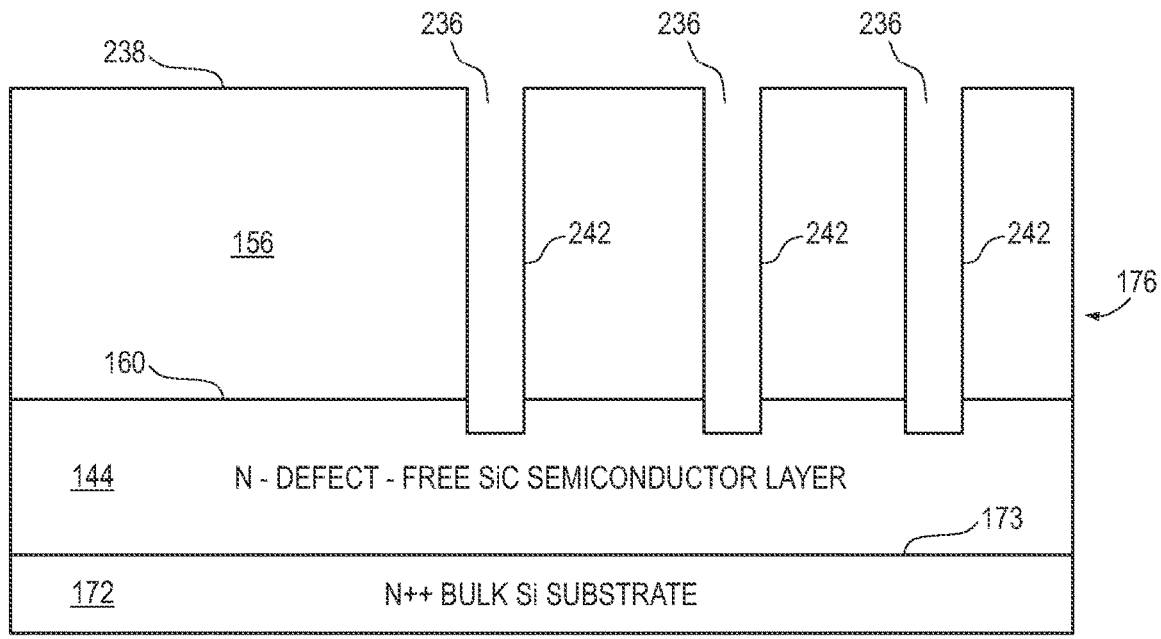
FIGS. 11a-11k illustrate forming a high-breakdown voltage trench gate power MOSFET on the substantially defect-free SiC substrate.

Continuing from the engineered substrate 176 from FIG. 10c, trenches 236 are formed from surface 238 through semiconductor layer 156 and extending past surface 160 into defect-free SiC semiconductor layer 144, as shown in FIG. 11a. Semiconductor layer 144 can be implemented with any of the embodiments of FIGS. 4-10. Trenches 236 can be formed by deep reactive ion etching (DRIE) with a width of 3-6 µm and depth of 50-60 µm for 600 v and 100-110 µm for 1200 v. The DRIE is a highly anisotropic etch process used to create deep penetration, steep-sided holes, cavities, and trenches in wafers/substrates, typically with high aspect ratios. DRIE utilizes an ionized gas or plasma, such as sulfur hexafluoride ($SF_6$), to remove material from semiconductor layers 144 and 156. DRIE technology permits deeper trenches 236 with straighter sidewalls. To create deep anisotropic etching of silicon, the etch process switches between different plasma chemistries to provide fluorine-based etching of the silicon while protecting the sidewall of the growing feature with a fluorocarbon layer. A $C_4F_8$ plasma deposits a fluoropolymer passivation layer onto the mask and into the etched feature. A bias from the platen causes directional ion bombardment resulting in removal of the fluoropolymer from the base of the feature and the mask. The fluorine free radicals in the $SF_6$ plasma etch the exposed silicon at the base of the etch feature isotropically. The DRIE process repeats multiple times to achieve a vertical etch profile for trenches 236. Alternatively, trenches 236 can be formed by laser direct ablation (LDA), plasma etching, reactive ion etching (RIE), sputter etching, vapor phase etching, and chemical etching. A first mask (not shown) is typically formed over surface 238 to isolate trenches 236 during the etching process.

Figure 11B:
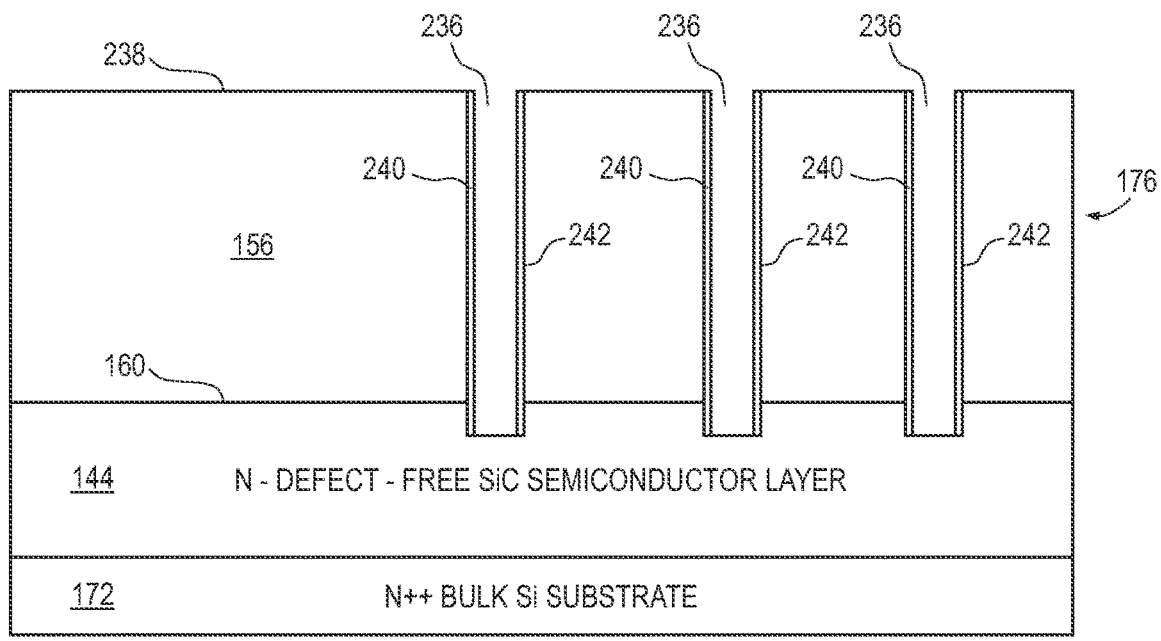
Figure 11C:
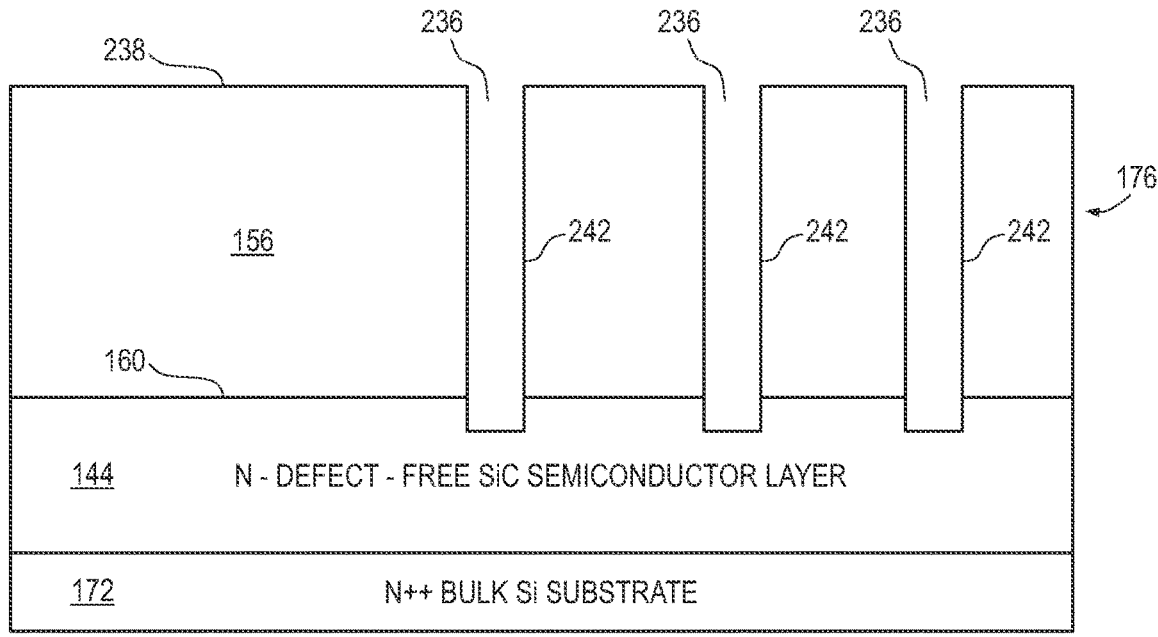

The sidewalls 242 of each trench 236 can be smoothed using an isotropic plasma etch and may be used to remove a thin layer of silicon, e.g., 100-1000 Angstroms (A) from the trench sidewalls. Alternatively, a sacrificial thermal oxide or silicon dioxide layer 240 can be grown on sidewall surfaces 242 of trenches 236, as shown in FIG. 11b. The sacrificial thermal oxide 240 is then removed using an etch, such as a buffered oxide etch, or a diluted hydrofluoric (HF) acid etch, or other wet chemistry followed by HF vapor phase fuming, to smooth the inner wall, as shown in FIG. 11c. Another sacrificial thermal oxide layer 240 is again grown on sidewalls 242 of trenches 236, similar to FIG. 11b. The sacrificial thermal oxide layer 240 is again removed by wet chemistry followed by HF vapor phase fuming to smooth the inner wall, similar to FIG. 11c. The process of repetitive growth of thermal oxide and removal continues multiple times, in accordance with FIGS. 11b-11c, until sidewall 242 of trench 236 is smooth. By eliminating the scalloping from the DRIE etch and using sacrificial thermal oxide layer 240 followed by HF fuming or any oxide and silicon etches, sidewall 242 can be smoothed to a tapered form. The use of the smoothing techniques can produce smooth trench surfaces with rounded corners while removing residual stress and unwanted contaminates.

Figure 11D:
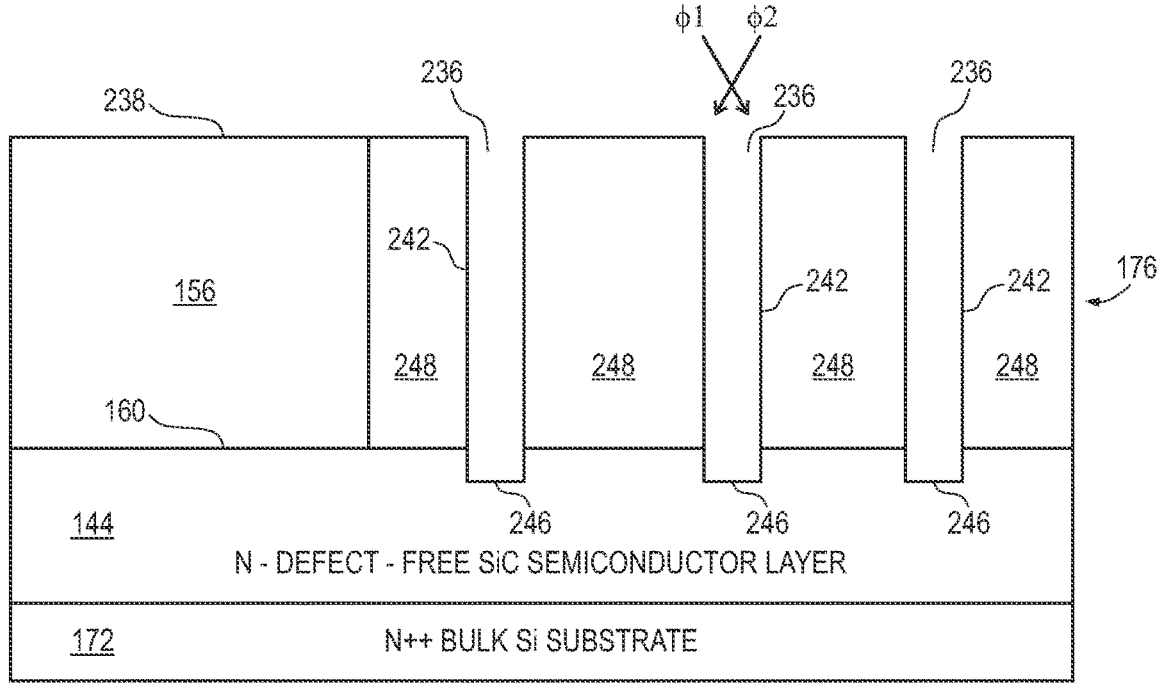

In FIG. 11d, sidewalls 242 of trenches 236 are implanted or doped with a dopant, which may occur at predetermined angles $\Phi 1$, $\Phi 2$. The dopant can be n-type material or p-type material, depending on the type of semiconductor device being made. MOSFET 280 from FIG. 11k can be an n-channel device (N-MOS) or a p-channel device (P-MOS), where "p" denotes a positive carrier type (hole) and "n" denotes a negative carrier type (electron). Although the present embodiment is described in terms of an N-MOS device, the opposite type semiconductor material can be used to form a P-MOS device.

In various implantation steps described herein, the doping is performed by ion implantation, solid diffusion, liquid diffusion, spin-on deposits, plasma doping, vapor phase doping, laser doping, or the like. Doping with boron (B), aluminum (Al), or gallium (Ga) results in a more p-type region, and doping with phosphorus (P), antimony (Sb), or arsenic (As) impurities results in n-type region 248. Other dopants may be utilized, such as bismuth (Bi) and indium (In), depending on the material of the substrate and the desired strength of the doping.

The implantation angles are determined by the width of trenches 236 and the desired doping depth, and is typically from about 2° to 12° from vertical. The implant is done at angles $\Phi 1$, $\Phi 2$ so that bottom 246 of each trench 236 is not implanted. Preferably, the implantation occurs between surface 238 and surface 160 to form n region 248. The implant is performed at an energy level of about 30-200 kiloelectron-Volts (KeV) with a dose between 1e13 and 1e17 atoms/cm$^3$. The doping preferably occurs with the aid of a mask (not shown) placed over surface 238 of semiconductor layer 156. Following implanting, a drive-in step at a temperature of up to 1200° C. may be performed for up to 12 hours. In another embodiment, there is no doping performed as region 248 is not required.

Figure 11E:
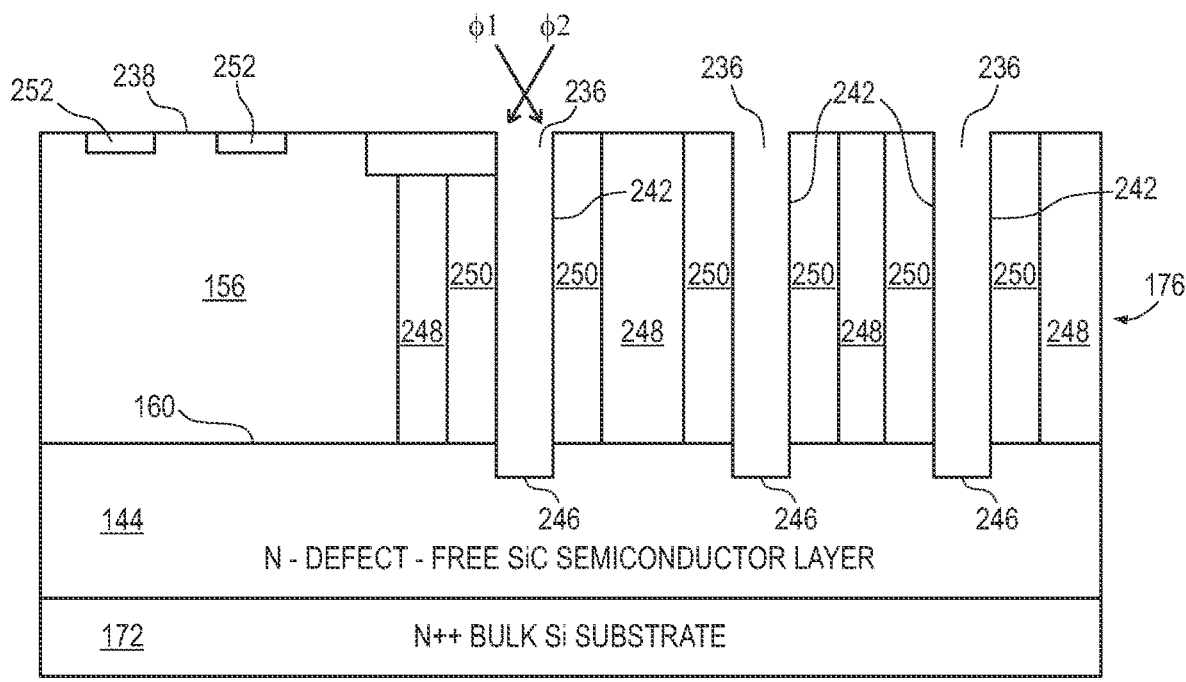

In FIG. 11e, sidewalls 242 of trenches 236 are implanted with a p-type dopant, such as boron, aluminum, or gallium impurities, with a dose of about 1e16 atoms/cm$^3$ to form p regions 250 with a width of about 1.0 µm. Alternatively, sidewalls 242 of trenches 236 are implanted with a p-type dopant, such as boron, aluminum, or gallium impurities, with a dose of 1e14 to 1e17 atoms/cm$^3$ to form p regions 250 with a corresponding width. The p-implant leaves columns of n region 248 and columns of p region 250. The columns of n region 248 have equal and opposite charge as the columns of p region 250. P-type dopant is also implanted in the termination region of semiconductor layer 156 to form p rings 252. The p-implants can be performed sequentially or simultaneously. The n-type dopant and p-type dopant drive-in may occur after each implantation step, or simultaneously with the implant.

Figure 11F:
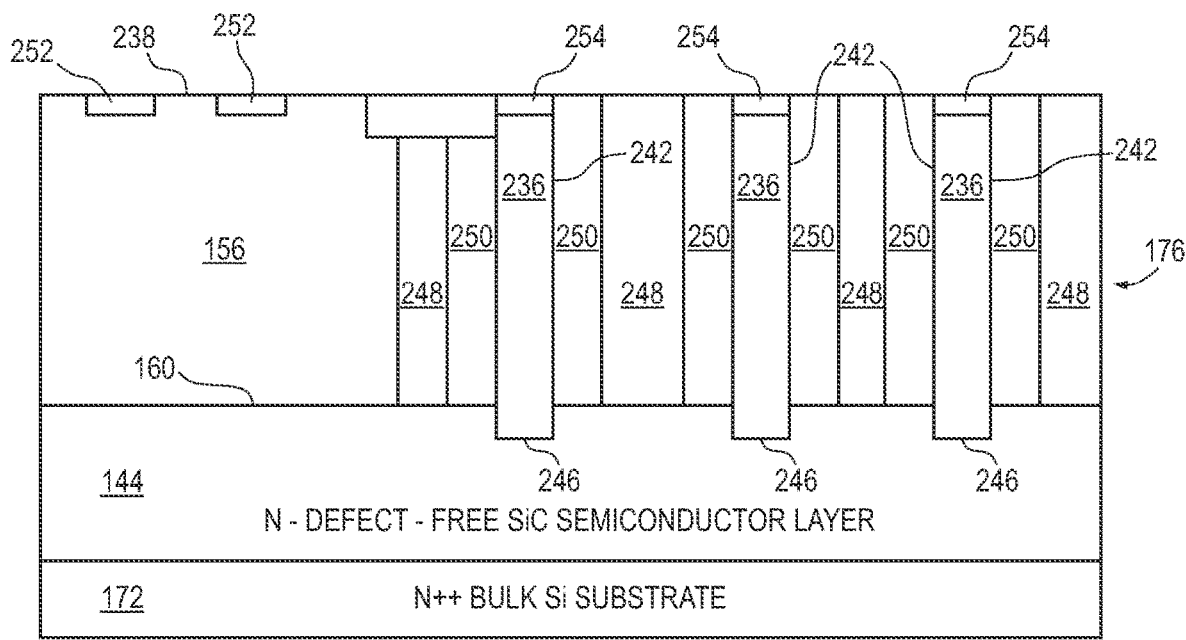

In FIG. 11f, insulating material 254 is deposited in trenches 236. In one embodiment, insulating material 254 completely fills trenches 236. Alternatively, insulating material 254 is formed over trench 236 using a MEMS layer transfer or layer bonding process to form a cap over the trench, as it is not necessary to completely fill trenches 236 with insulating material, see further description in FIGS. 18a-18d. Insulating material or cap 254 is bonded to semiconductor layer 156 to cover trench 236. Using the MEMS layer transfer process to cap trench 236, there is no need to fill the trench with any material. Insulating material 254 can be polysilicon, re-crystallized polysilicon, single crystal silicon, or semi-insulating polycrystalline silicon (SIPOS). Insulating material 254 can also be silicon dioxide (SiO2), silicon nitride (Si3N4), silicon oxynitride (SiON), tantalum pentoxide (Ta2O5), aluminum oxide (Al2O3), polyimide, benzocyclobutene (BCB), polybenzoxazoles (PBO), or other suitable insulating or dielectric material. In one embodiment, insulating material 254 is SIPOS deposited into trenches 236 using a spun-on-glass (SOG) technique. The amount of oxygen content in the SIPOS is chosen to be between 2% and 80% to improve the electrical characteristics of the active region. Increasing the amount of oxygen content is desirable for electrical characteristics, but varying the oxygen content also results in altered material properties. Higher oxygen content SIPOS thermally expands and contracts differently from the surrounding silicon which may lead to undesirable fracturing or cracking, especially near the interface of differing materials. Accordingly, the oxygen content of the SIPOS is optimally selected to achieve the most desirable electrical characteristics without an undesirable impact on mechanical properties.

Figure 11G:
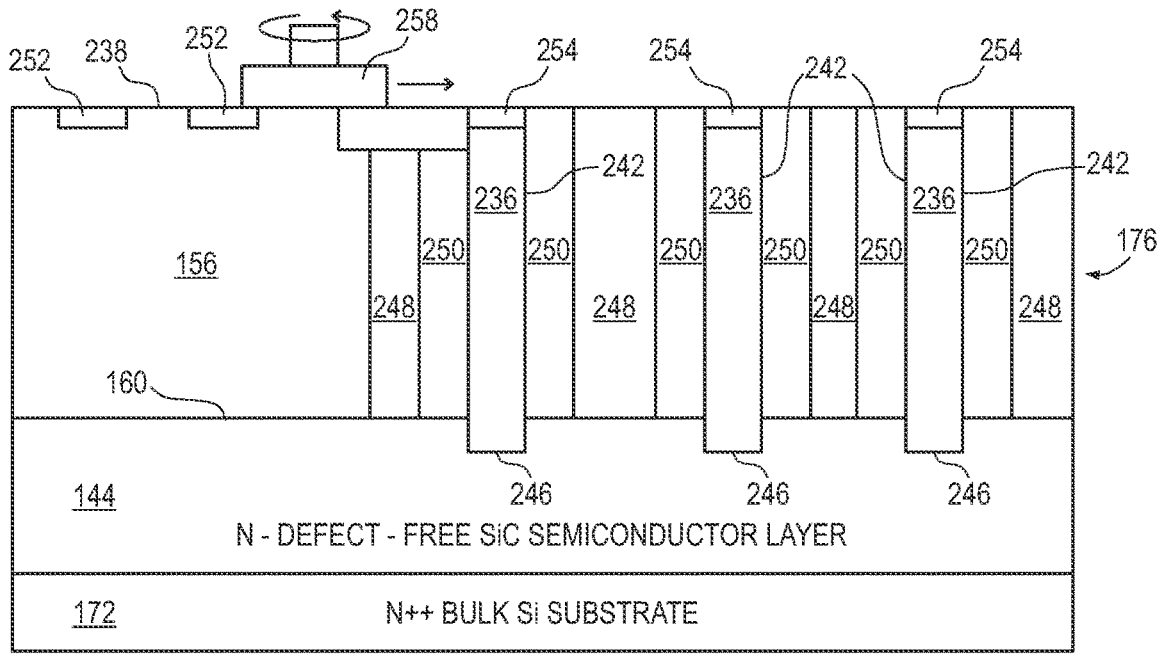

Insulating material 254 can also be deposited in trenches 236 using other techniques, such as low pressure (LP) chemical vapor deposition (CVD), tetraethylorthosilicate (TEOS), or other suitable oxide deposition process. Insulating material 254 can be deposited in trenches 236 by a reflow process. After depositing insulating material 254, surface 238 is planarized by grinder 258 or chemical-mechanical polishing (CMP), as shown in FIG. 11g.

Figure 11H:
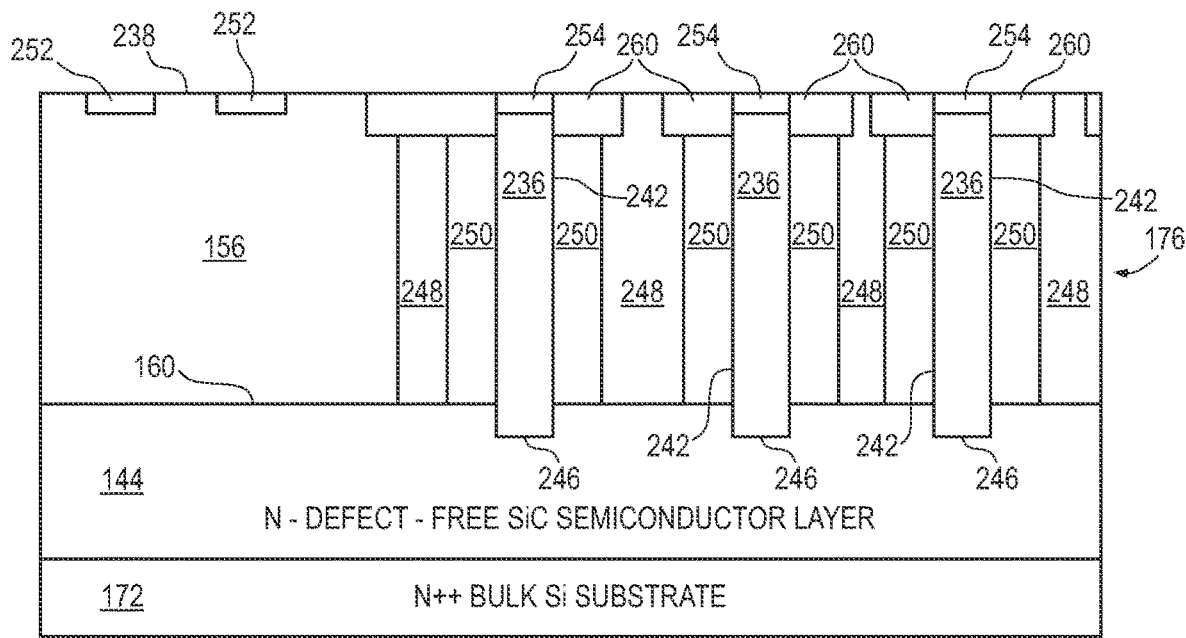

In FIG. 11h, a p-type dopant, such as boron, aluminum, or gallium impurities, is implanted to form p body regions 260 proximate to surface 238 of semiconductor layer 156. In the case of ion implantation of the p-type dopant into n region 248 and p regions 250, one embodiment can utilize an energy level of about 30-1000 KeV with a dose of 1e17 atoms/cm$^3$, followed by a high temperature drive-in step, e.g., a diffusion. Other implants can be deposited at appropriate dosages and energy levels. P body regions 260 can be formed at least partially by performing ion implantation of sidewalls 242 of trenches 236, prior to depositing insulating material 254 into the trenches. P body regions 260 operate as inversion layers to provide conduction channels through the semiconductor device. An oxide layer (not shown) can be formed over surface 238 as a mask for the implantation of p body regions 260, although no mask is needed for the ion implantation.

Figure 11I:
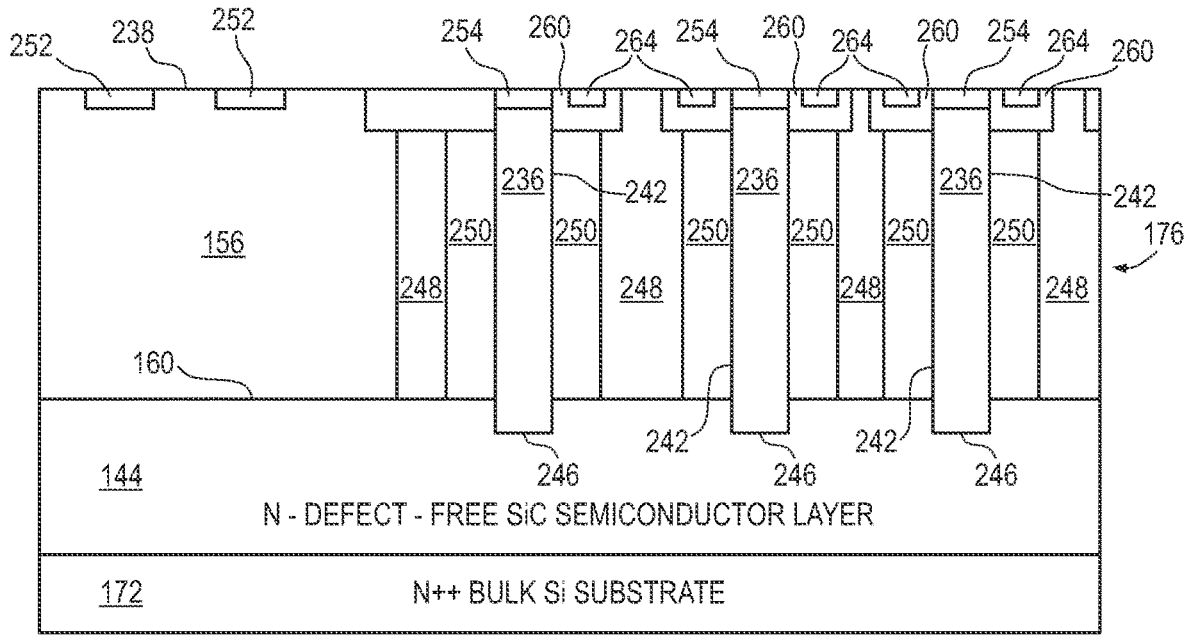

In FIG. 11i, source regions 264 are formed within p body regions 260 proximate to surface 238. Source regions 264 are heavily doped n+ type regions, formed similar to p body regions 260. The orientation of source regions 264 with respect to p body regions 260 can be varied depending upon the configuration of MOSFET 280, see FIG. 11k.

Figure 11J:
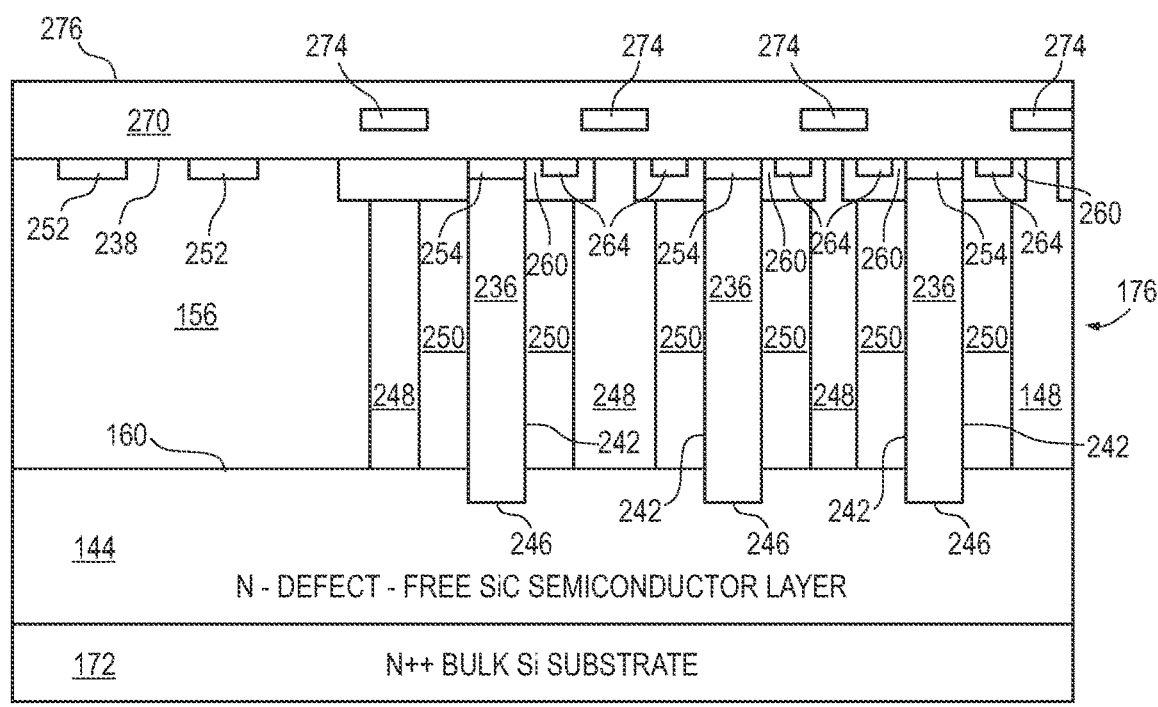

In FIG. 11j, interlayer dielectric or insulating layer 270 and gate regions 274 are formed over surface 238 of semiconductor layer 156. Gate regions 274 can be metal, doped polysilicon, amorphous silicon, or combination thereof. In one embodiment, a first portion of insulating layer 270 is formed. Insulating layer 270 contains one or more layers of SiO2, Si3N4, SiON, Ta2O5, Al2O3, polyimide, BCB, PBO, or other suitable insulating or dielectric material. Insulating layer 270 is formed using PVD, CVD, screen printing, spin coating, spray coating, sintering, or thermal oxidation. Gate regions 274 are formed over the first portion of insulating layer 270. A second portion of interlayer dielectric or insulating layer 270 is formed over the first portion of the insulating layer and gate regions 274 to cover the gate regions. Surface 276 of insulating layer 270 can then be planarized and/or polished. In some embodiments, the first portion of insulating layer 270 can be used as a mask to form source regions 264.

Figure 11K:
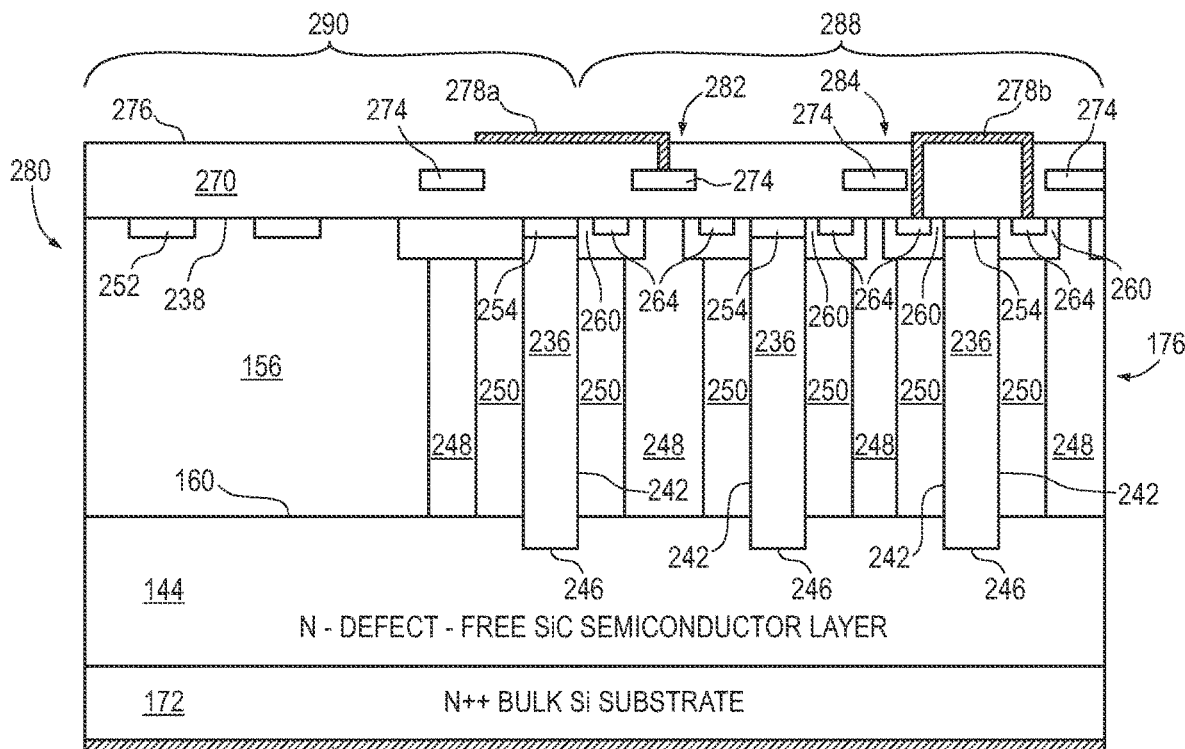

In FIG. 11k, a plurality of vias is formed through insulating layer 270 to source regions 264 and gate regions 274. The vias are filled with conductive material and connect to conductive layers 278a and 278b. Conductive layers 278a and 278b can be one or more layers of Al, Cu, Sn, Ni, Au, Ag, or other suitable electrically conductive material formed using patterning with PVD, CVD, sputtering, electrolytic plating, electroless plating process, or other suitable metal deposition process. Conductive layer 278a makes electrical contact to gate region 274, and conductive layer 278b makes electrical contact to source regions 264. Conductive layers 278a and 278b can be electrically isolated or electrically common depending on the configuration and operation of MOSFET 280. As a vertical device, the drain of MOSFET 280 is provided by n region 248 (n drift region), n-type semiconductor layer 144 and 156, and n-type substrate 170. Current flow path includes conductive layer 278b, source regions 264, the channel below gate region 274, and the n-type layers to the backside drain contact 292.

MOSFET 280 is a multi-cell vertical power MOSFET having applications in DC-DC power converters, aerospace, and general purpose portable electrical devices. FIGS. 11a-11k illustrate two cells 282 and 284 in active region 288. The MOSFET cells are electrically connected in parallel to form a power MOSFET for high current carrying capacity. Semiconductor layers 144 and 156 and semiconductor material 172 in substrate 170 represent an WBG engineered drain that enhances the device breakdown voltage to 1200V and reduces $R_{DSON}$. The structure of MOSFET 280 has a feature size that is scalable to reduce cell size and provide a higher cell density, which increases the number of cells in the MOSFET and reduces $RDS_{ON}$ to about 90 milliohms at maximum drain current $I_D$ of 40 amperes. Termination region 290 is the location around a perimeter of MOSFET 280.

Figure 12:
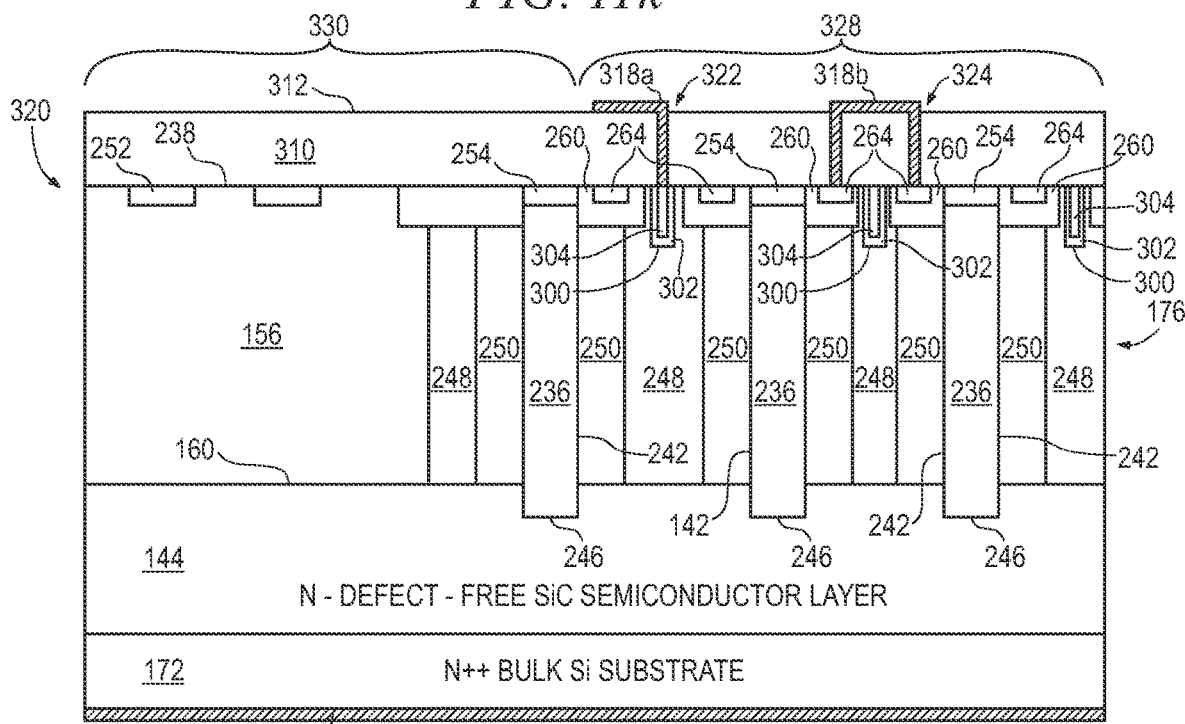
FIG. 12 illustrates another high-breakdown voltage trench gate power MOSFET on the substantially defect-free SiC substrate.

FIG. 12 illustrates an alternate embodiment of the power MOSFET with a trench gate structure. The same reference numbers are used in FIGS. 11a-11k and FIG. 12 where the function and operation are similar. Continuing from FIG. 11i, a first gate trench 300 is formed in n region 248 between p body regions 260. Gate trench 300 is filled with insulating material 302. A second gate trench is formed in insulating material 302 and filled with metal, doped polysilicon, amorphous silicon, or a combination thereof, to form gate regions 304. An interlayer dielectric or insulating layer 310 is formed over surface 238 of semiconductor layer 156. Surface 312 of insulating layer 310 can then be planarized and/or polished.

A plurality of vias is formed through insulating layer 310 to source regions 264 and gate regions 304. The vias are filled with conductive material and connect to conductive layers 318a and 318b. Conductive layers 318a and 318b can be one or more layers of W, Al, Cu, Sn, Ni, Au, Ag, or other suitable electrically conductive material formed using patterning with PVD, CVD, sputtering, electrolytic plating, electroless plating process, or other suitable metal deposition process. Conductive layer 318a makes electrical contact to gate region 304, and conductive layer 318b makes electrical contact to source regions 264. Conductive layers 318a and 318b can be electrically isolated or electrically common depending on the configuration and operation of MOSFET 320. As a vertical device, the drain of MOSFET 320 is provided by n region 248 (n drift region), n-type semiconductor layers 144 and 156, and n-type substrate 170. Current flow path includes conductive layer 318b, source regions 264, the channel below gate region 304, and the n-type layers to the backside drain contact 292.

MOSFET 320 is a multi-cell vertical power MOSFET having applications in DC-DC power converters, aerospace, and general purpose portable electrical devices. FIG. 12 illustrates two cells 322 and 324 in active region 328. Trench gate regions 304 further reduce cell size and provide a higher cell density. The MOSFET cells are electrically connected in parallel to form a power MOSFET for high current carrying capacity. Termination region 330 is the location around a perimeter of MOSFET 320.

Power MOSFETs 280 and 320 are designed for high-breakdown voltage, high reliability, lightweight, low voltage, e.g., 3.3 VDC, and low $R_{DSON}$ applications, e.g., 90 milliohms at $I_D$=40 A, such as DC to DC converters, aerospace, and high-performance computing. In particular, power MOSFETs 280 and 320 merge MEMS, super-junction, and WBG engineered drain to achieve the high-breakdown voltage performance, radiation hardness, manufacturability, low cost, lightweight, and low $RDS_{ON}$. Radiation immunity can be further increased when vanadium is doped into SiC semiconductor layer 144 to introduce deep energy level transfer into the SiC.

The semiconductor structure between surface 160 and surface 238 substantially represents a super-junction semiconductor device. The super-junction cells 282, 284 account for the total breakdown voltage capability. The 1200 v breakdown capacity is useful of efficient power distribution systems in aerospace applications, where the above advantages are particularly important. Near defect-free SiC semiconductor layer 144 together with Si device layer 156 provides the desired 1200 v.

The structure of MOSFET 280, 320 has a feature size that is scalable to reduce cell size and provide a higher cell density, which increases the number of cells in the MOSFET and reduces $RDS_{ON}$ to about 90 milliohms at maximum drain current $I_D$ of 40 amperes. The high-breakdown voltage characteristics of FIG. 16 can be applied to an IGBT, CTIGBT, thyristor, diode, and other MOS gated devices.

By leveraging the inherent benefits of MEMS manufacturing techniques and embedding SiC into the drain of the SJMOS structure, a new approach to the design and manufacture of robust radiation hardening processes provides suitable for the deep space environment. The early super-junction products demonstrated a substantial competitive advantage with respect to Rdson*area product that allows for a 5× improvement over standard planar MOSFETs. Embedding SiC into the drain has the potential to improve device parametric performance by another 5× plus enhances radiation hardness to meet SEGR performance for 1200V devices. The merger of SJMOS structures-MEMS manufacturing techniques-WBG material creates a new class of merged power semiconductor devices that in this case has the potential to sustain 1200V blocking with no heavy-ion-induced permanent destructive effects upon exposure to high energy radiation of 87 Mev-cm²/mg while delivering Rdson of 90 milliohms at ID max=40 A.

Figure 13B:
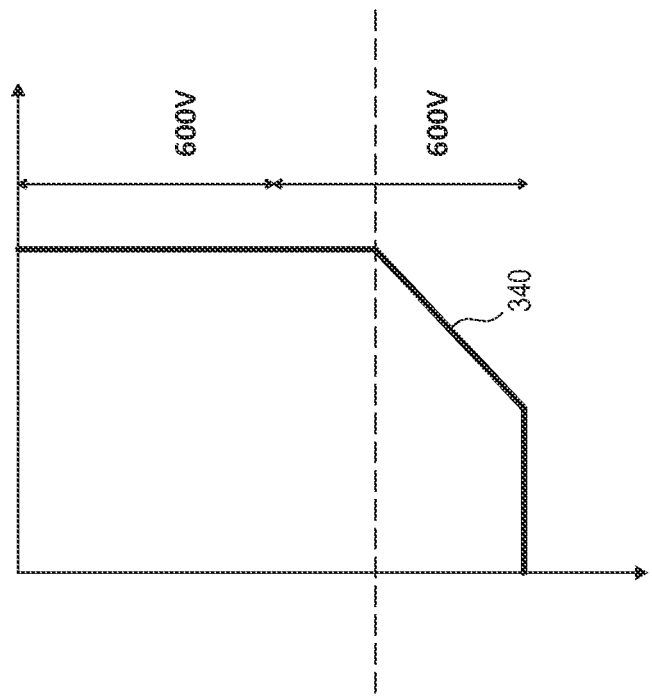
FIGS. 13a-13b illustrate the power MOSFET cell and breakdown voltage curve.
Figure 13A:
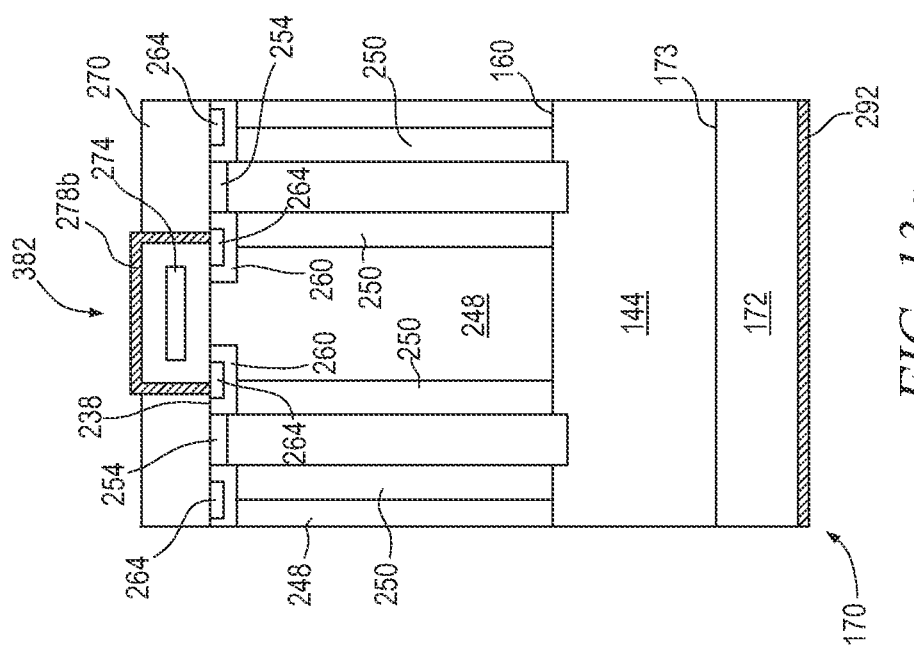

FIGS. 13a and 13b illustrate one MOSFET cell 382 and voltage breakdown curve 340, expressed as energy over volts per centimeter [E/(V/cm)]. The super-junction cell 382 accounts for the total breakdown voltage capability. The 1200 v breakdown capacity is useful of efficient power distribution systems in aerospace applications, where the above advantages are particularly important.

The above described SiC and 3C—SiC drain engineered super-junction power MOSFETS enable high-efficiency, low-mass, and low-volume power distribution systems by significantly improving the electrical performance. The heterojunction epitaxial high voltage structures of FIGS. 11a-11k and 12 enable the applied voltage of 1200 V to be divided across the two epitaxial layers 144 and 156. The super-junction MOSFET (SJMOS) structure is built into semiconductor layer 156 using MEMS manufacturing, such as ion implantation of DRIE etched deep trench sidewalls to create the p and n super-junction columns and the layer transfer techniques to seal the top of the deep trench eliminate any need for refill of the deep sidewall trench with TEOS. The SJMOS enables even lower on resistance in semiconductor layer 156 while also supporting the high blocking voltage. The MEMS layer transfer processing provides for scaling of the current handling capability of the super-junction devices by optimization and scaling of the cell PN pitch by driving to smaller feature size photolithography, such as 0.18 µm CMOS.

The high-breakdown voltage characteristics of FIGS. 11a-11k and 12 can be applied to an insulated gate bipolar transistor (IGBT), cluster trench insulated gate bipolar transistor (CTIGBT), thyristor, and other MOS gated devices.

Figure 14A:
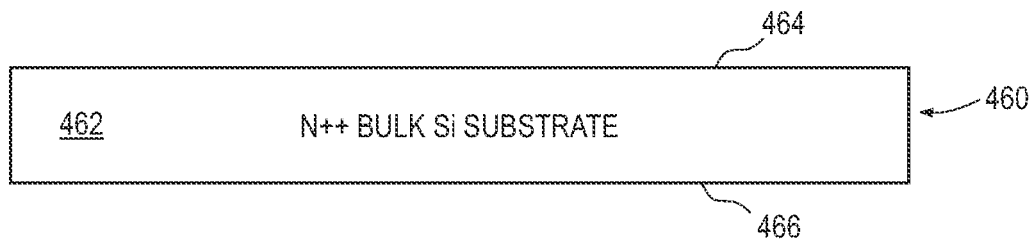
FIGS. 14a-14j illustrate a process of forming a radiation hardened substantially defect-free SiC substrate.

In another embodiment, shown in FIG. 14a, bulk substrate 460 contains semiconductor material 462, such as Si, SiC, 3C—SiC, germanium, aluminum phosphide, aluminum arsenide, gallium arsenide, gallium nitride, indium phosphide, diamond, and all families of III-V and II-VI semiconductor materials for structural support. In one embodiment, semiconductor material 462 is 4H or 6H SiC with a thickness of 450 µm. Substrate 460 includes a first surface 464 and second surface 466 opposite the first surface 464.

Figure 14B:
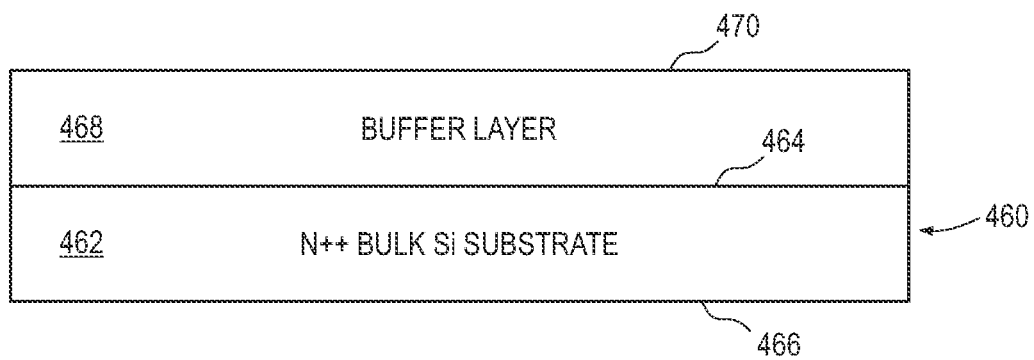

In FIG. 14b, semiconductor layer 468 is epitaxially grown over surface 464 of substrate 460. In one embodiment, semiconductor layer 468 is N+ SiC or 3C—SiC buffer layer with a thickness of 60 µm using a MEMS layer transfer process. The semiconductor layers shown in FIGS. 14a-14j are not drawn to scale.

Figure 14C:
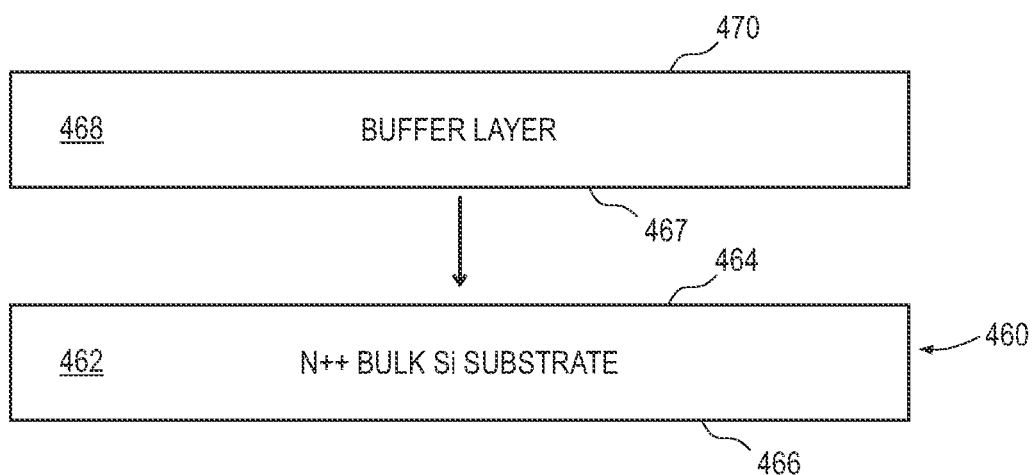
Figure 14D:
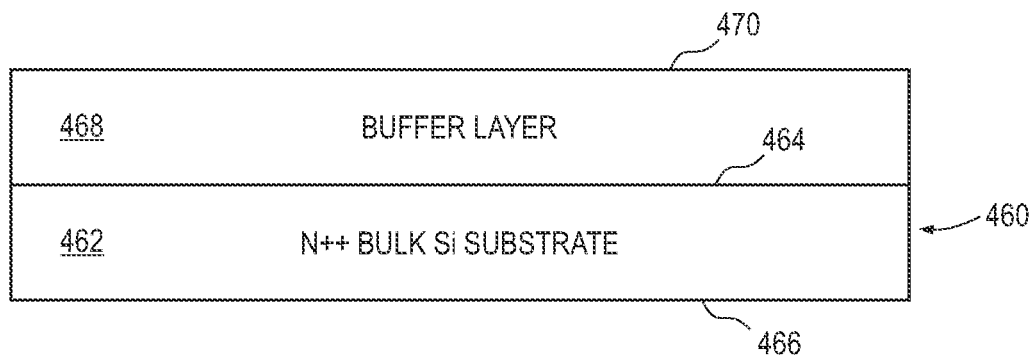

Alternatively, semiconductor layer 468 can be joined to substrate 460 using a high temperature anneal, fusion bonding, plasma activated DWB, or other DWB process. In FIG. 14c, semiconductor layer 468 is disposed over surface 464 of substrate 460. Surface 467 of semiconductor layer 468 and surface 464 of substrate 460 are planarized, polished, and cleaned to be flat and smooth, prior to bonding. The lattice structures of semiconductor layer 468 and substrate 460 can be aligned to optimize adhesion. Water molecules can be applied to surfaces 464 and 467 to aid in the bonding process. Surface 467 of semiconductor layer 468 is brought into contact with surface 464 of substrate 460. DWB is accomplished with chemical bonds and intermolecular interactions at temperature, including van der Waals forces, hydrogen bonds, and covalent bonds, between surface 464 and surface 467. DWB temperatures range from ambient to 100's ° C. FIG. 14d shows semiconductor layer 468 direct wafer bonded to surface 464 of substrate 460.

Figure 14E:
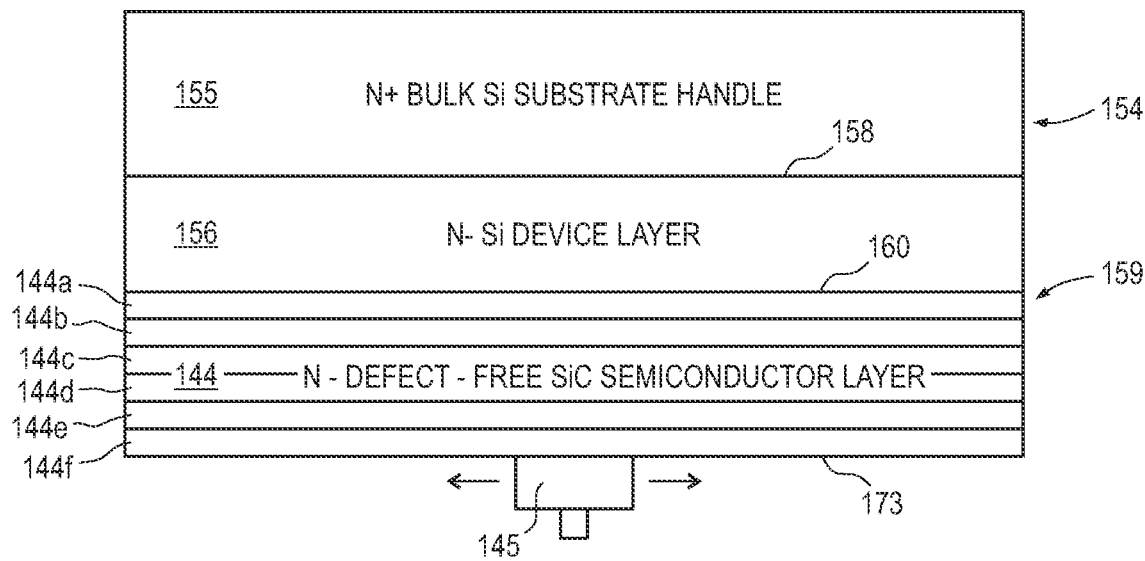

FIG. 14e shows engineered substrate 159 from FIG. 6c. The substantially defect-free SiC or 3C—SiC semiconductor layer 144 contains alternating layers or elements of the semiconductor material, e.g., Si and carbon. As an illustration, layer 144a is carbon, layer 144b is the element Si, layer 144c is the element carbon, layer 144d is Si, layer 144e is carbon, layer 144f is Si, and so on. In one embodiment, substantially defect-free SiC or 3C—SiC semiconductor layer 144, as formed, has an exposed surface 173 of layer 144f containing Si. Semiconductor layer 144 is typically grown on a Si wafer so layer 144f will be Si.

Alternatively, a portion of semiconductor layer 144 is removed by grinding with grinder 145 to expose layer 144f of Si. The portion of semiconductor layer 144 can be removed by etching or LDA to expose semiconductor layer 144f of Si. In any case, surface 173 is a Si face.

Figure 14F:
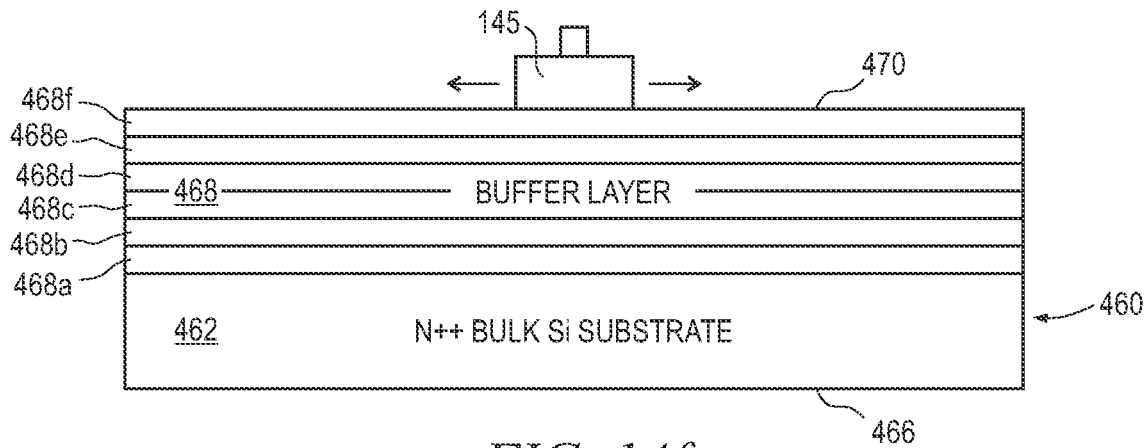

In a similar manner, SiC or 3C—SiC semiconductor layer 468 contains alternating layers or elements of the semiconductor material, e.g., Si and carbon, as shown in FIG. 14f. As an illustration, layer 468a is the element Si, layer 468b is the element carbon, layer 468c is Si, layer 468d is carbon, layer 468e is Si, layer 468f is carbon, and so on. In one embodiment, SiC or 3C—SiC semiconductor layer 468, as formed, has an exposed surface 470 of layer 468f containing carbon. Semiconductor wafer 462 is typically 4H—SiC so layer 468f will be carbon.

Alternatively, a portion of semiconductor layer 468 is removed by grinding with grinder 145 to expose layer 468f of carbon. The portion of semiconductor layer 468 can be removed by etching or LDA to expose layer 468f of carbon. In any case, surface 470 is a carbon face. In another embodiment, surface 173 can be the carbon face and surface 470 can be the Si face by selective formation or removal of respective material.

Figure 14G:
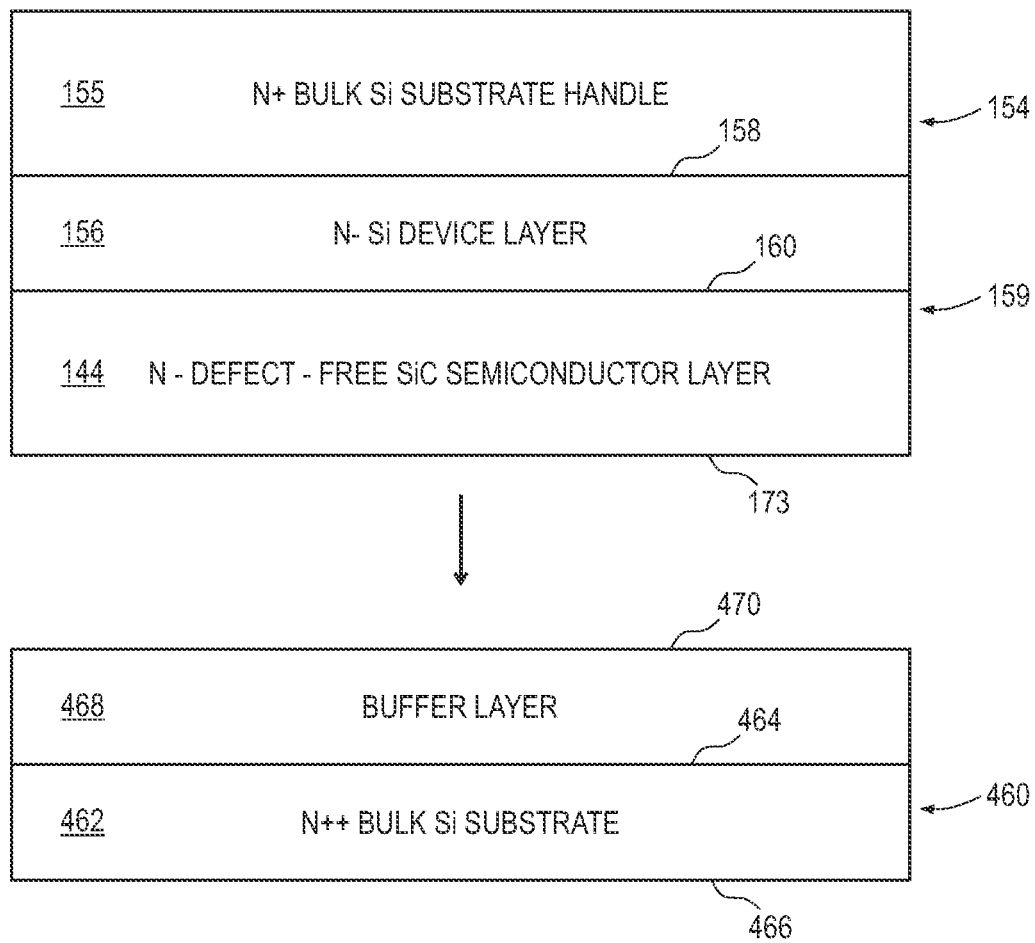

In FIG. 14g, semiconductor layer 144 is joined to semiconductor layer 468 using a high temperature anneal, fusion bonding, plasma activated DWB, or other DWB process. Engineered substrate 159 with an exposed Si face from semiconductor layer 144 is disposed over carbon face surface 470 of semiconductor layer 468. Surface 173 of semiconductor layer 144 and surface 470 of semiconductor layer 468 are planarized, polished, and cleaned to be flat and smooth with respective Si face and carbon face, prior to bonding. The lattice structures of semiconductor layer 144 and semiconductor layer 468 can be aligned to optimize adhesion. Water molecules can be applied to surfaces 173 and 470 to aid in the bonding process. Surface 173 of semiconductor layer 144 is brought into contact with surface 470 of semiconductor layer 468. DWB is accomplished with chemical bonds and intermolecular interactions at temperature, including van der Waals forces, hydrogen bonds, and covalent bonds, between surface 173 and surface 470. DWB temperatures range from ambient to 100's ° C.

Figure 14H:
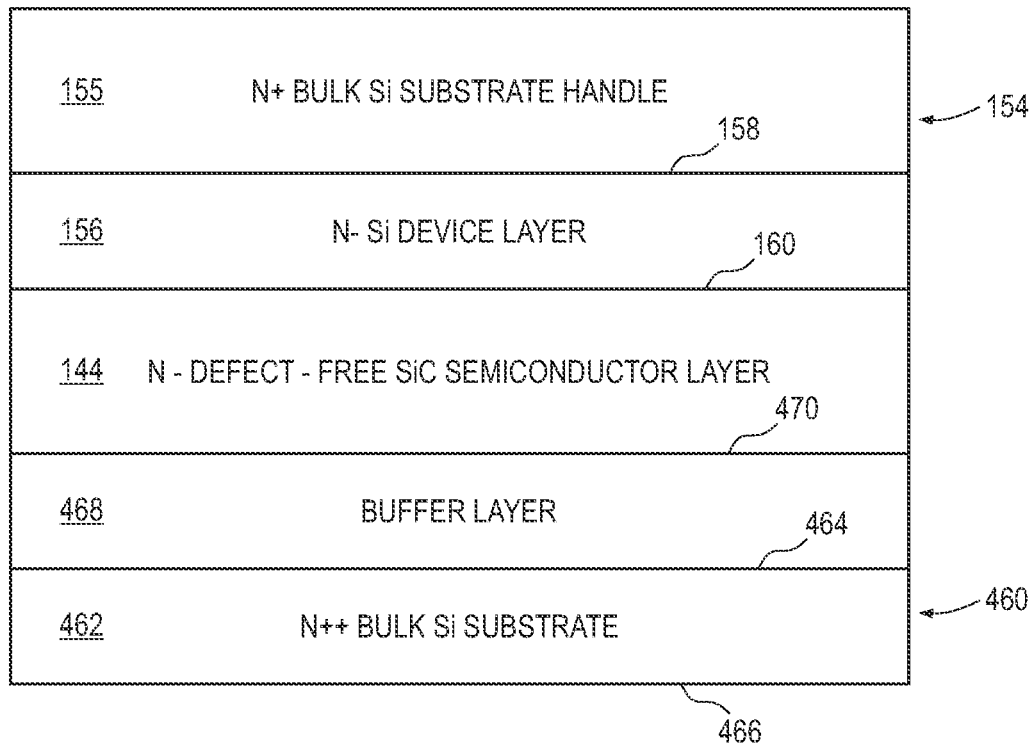

FIG. 14h shows engineered substrate 159 direct wafer bonded to surface 470 of semiconductor layer 468. Substrate 154 is removed by chemical etching, CMP, mechanical peel-off, mechanical grinding, thermal bake, UV light, or wet stripping.

Figure 14I:
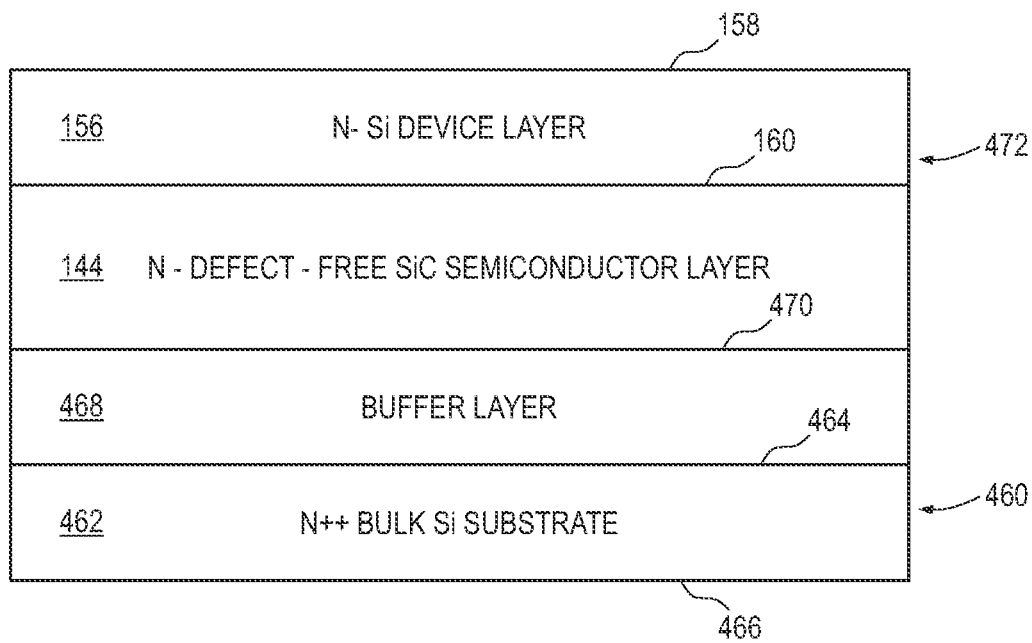

FIG. 14i shows SiC or 3C—SiC engineered substrate 472 containing N− Si or SiC semiconductor layer 156, substantially defect-free N− SiC or 3C—SiC semiconductor layer 144, N− SiC or 3C—SiC semiconductor layer 468, and N++ Si or SiC substrate 460, following removal of substrate 154. The Si face of surface 173 and carbon face of surface 470 provide good charge transport with robust characteristics against radiation, i.e., a radiation hardened engineered substrate. Radiation immunity can be further increased when Vanadium is doped into SiC semiconductor layer 144 to introduce deep energy level transfer into the SiC.

Figure 14J:
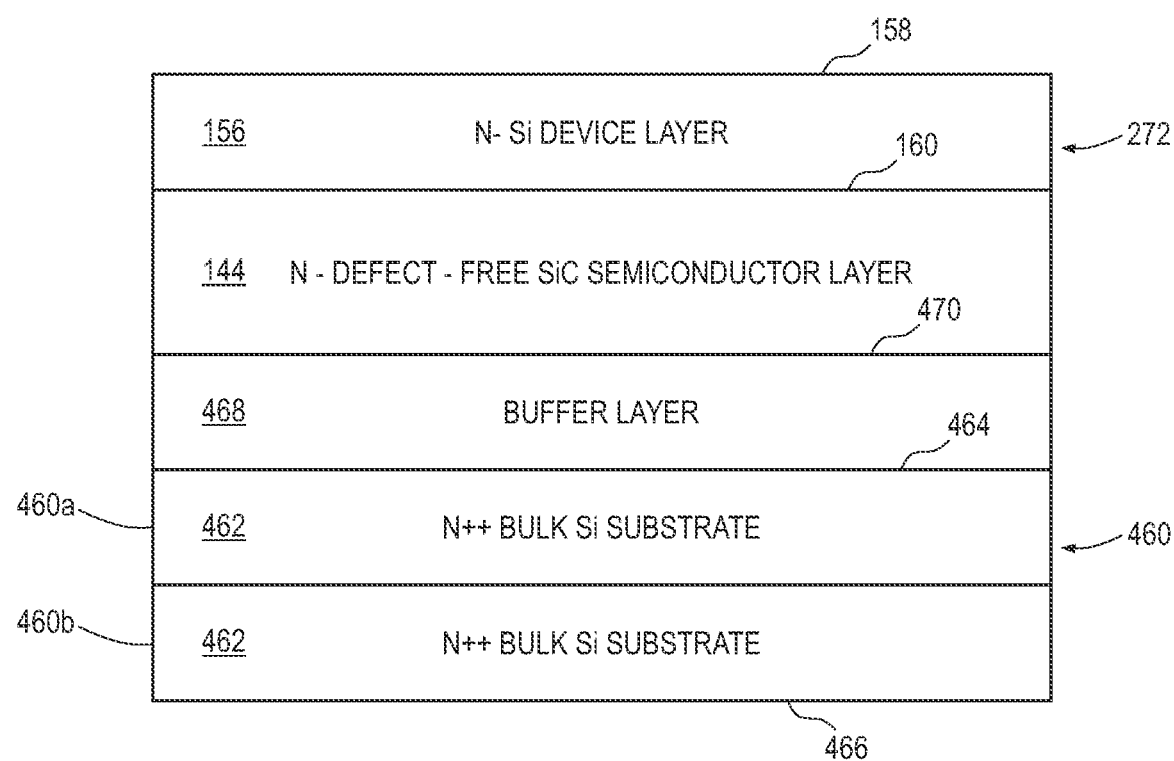

In the case of the Si epi layer grown on the SiC epi layer, as described in FIG. 14i, there may be, in some cases, warpage propagated through the Si epi layer due to mismatch in the coefficient of thermal expansion between the Si epi layer and SiC epi layer. In addition, there is a possible lattice mismatch and other stacking defects between the Si epi layer and SiC epi layer creating stress at the junction between the Si epi layer and SiC epi layer. To overcome these possible issues, including the potential warpage, FIG. 14j shows substrate 460 made with two or more heavily doped N++ Si substrates 460a and 460b bonded together using DWB, as described in FIGS. 14c-14d, with a thickness T=1000 μm. Multiple substrates can be bonded together using DWB to create a thick N++ Si substrate 460. The thick multi-layer Si substrate 460a-460b using DWB reduces or eliminates the potential warpage noted for semiconductor layers 144 and 468.

The SiC or 3C—SiC radiation hardened engineered substrate 472, as described in FIGS. 14a-14j, can be used as a foundation to form a variety of semiconductor devices. For example, radiation hardened engineered substrate 472 can be used as a SiC or 3C–SiC foundation to form a high voltage power MOSFET or high voltage diode.

Figure 15:
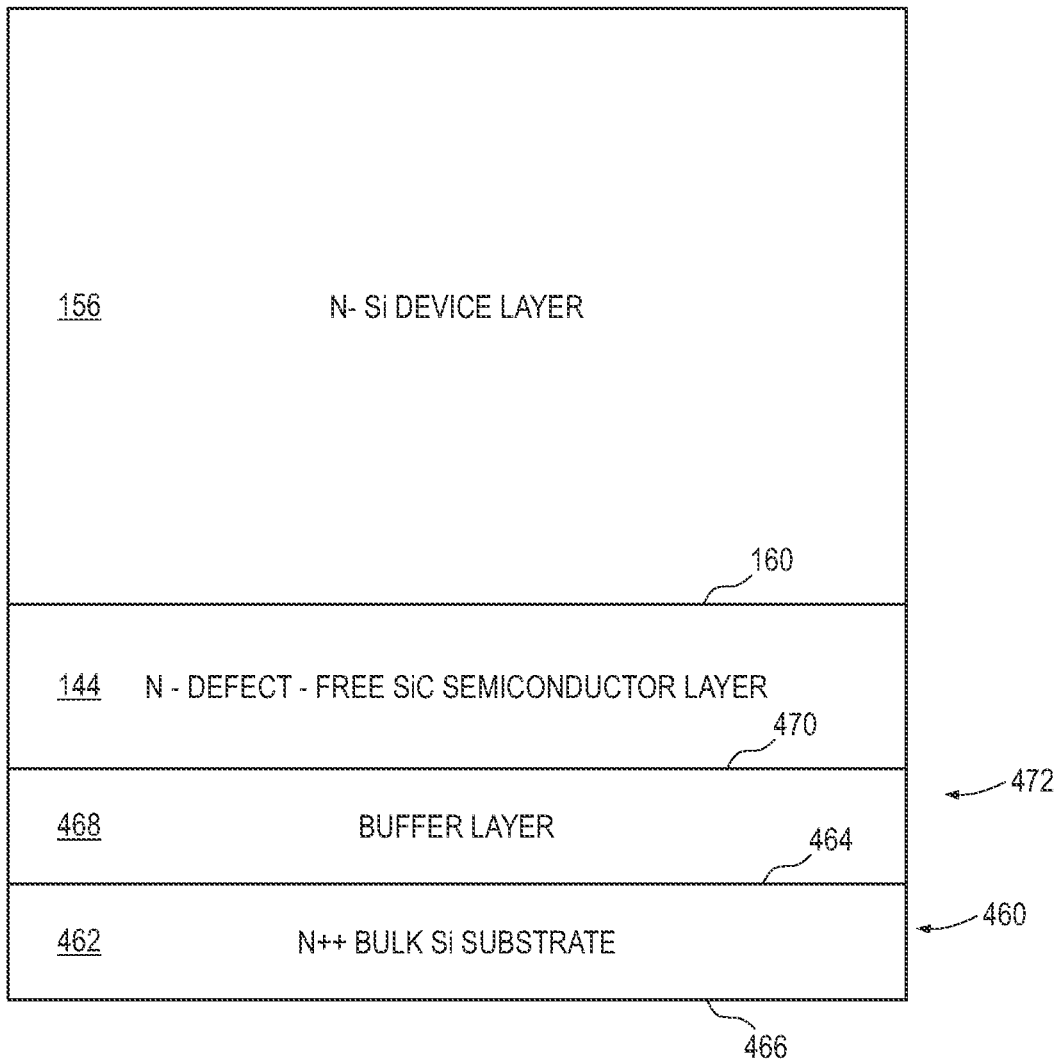
FIG. 15 illustrates the radiation hardened substantially defect-free SiC substrate.

FIG. 15 shows the SiC or 3C—SiC radiation hardened engineered substrate 472, with semiconductor device layer 156 expanded for purposes of illustration to show placement of device components. The semiconductor layers shown in the figures are not drawn to scale.

Figure 16:
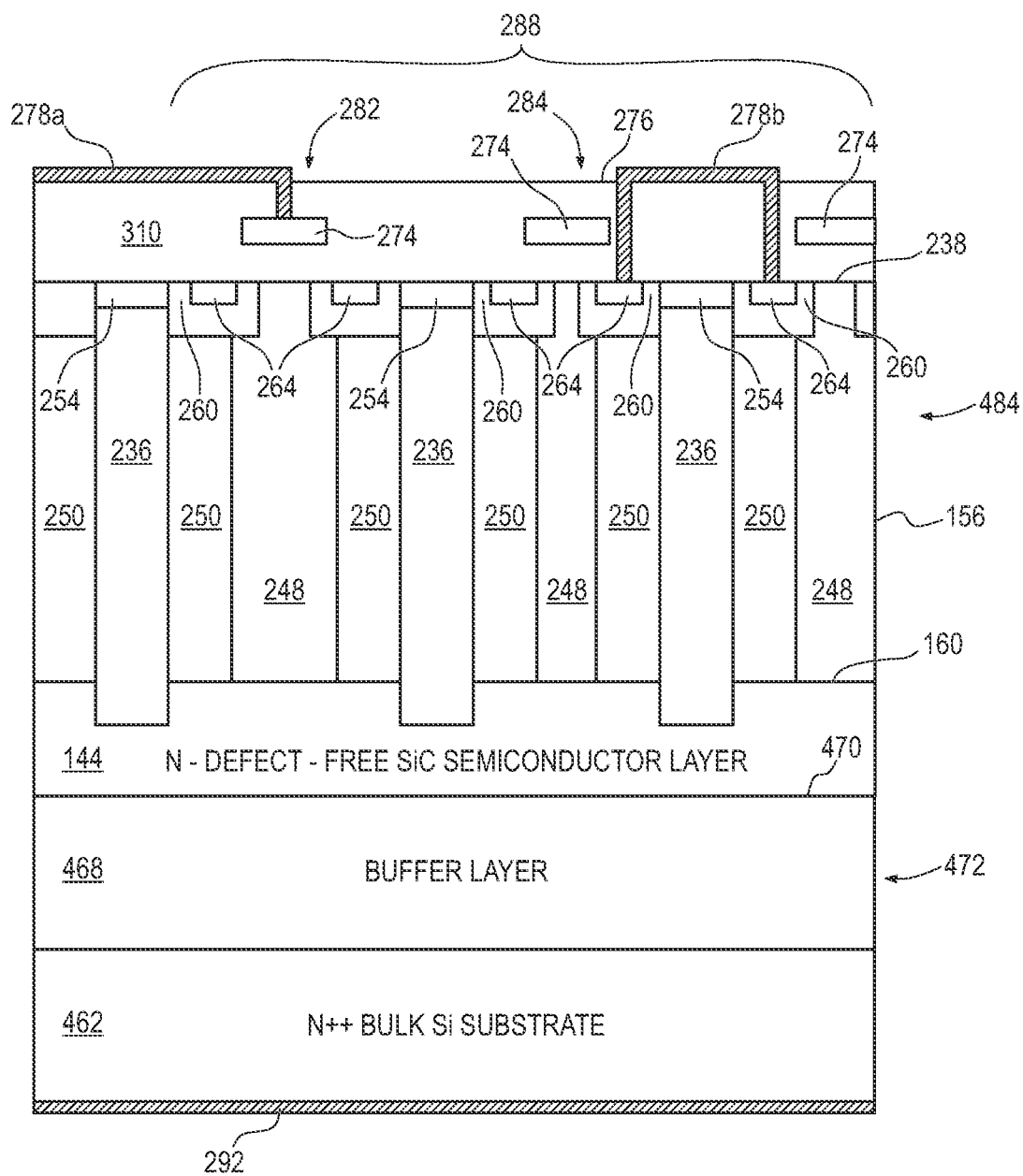
FIG. 16 illustrates a high-breakdown voltage power MOSFET cell formed on the radiation hardened substantially defect-free SiC substrate.

FIG. 16 shows high voltage power MOSFET 484 formed in semiconductor device layer 156, as described in FIGS. 11a-11k and using the same reference numbers. MOSFET 484 is a multi-cell vertical power MOSFET having applications in AC-DC and DC-DC power converters, aerospace, and general purpose portable electronic devices. MOSFET 484 is designed for high-breakdown voltage, radiation hardened, high reliability, lightweight, low voltage, and low on resistance applications, such as DC to DC converters, aerospace, and high-performance computing. In particular, MOSFET 484 merges MEMS, super-junction, and WBG engineered cathode to achieve the high breakdown voltage, performance, manufacturability, low cost, lightweight, and low on resistance. FIG. 16 illustrates two cells 282 and 284 in active region 288. The MOSFET cells are electrically connected in parallel to form a power MOSFET for high current carrying capacity. Engineered substrate 472 represents a WBG engineered drain that enhances the device breakdown voltage to 1200V and reduces $R_{DSON}$, while providing radiation hardening protection, particularly for total ion dose performance. MOSFET 472 is a high voltage super-junction MOSFET with a higher Vds failure threshold for SEE, SEB, and SEGR events.

The semiconductor structure between surface 160 and surface 238 substantially represents a super-junction semiconductor device. The super-junction cells 282, 284 account for the total breakdown voltage capability. The 1200 v breakdown capacity is useful of efficient power distribution systems in aerospace applications, where the above advantages are particularly important. MOSFET 484 can sustain 1200 v blocking with no heavy ion-induced permanent destructive effects upon exposure to high energy radiation of 87 Mev cm$^2$/mg. Near defect-free SiC semiconductor layer 144 together with Si device layer 156 provides the desired 1200 v.

The structure of MOSFET 484 has a feature size that is scalable to reduce cell size and provide a higher cell density, which increases the number of cells in the MOSFET and reduces $RDS_{ON}$ to about 90 milliohms at maximum drain current $I_D$ of 40 amperes. Power MOSFET 484 can sustain 1200v blocking, while delivering low Rdson of 90 milliohms at ID max=40 A. The high-breakdown voltage characteristics of FIG. 16 can be applied to an IGBT, CTIGBT, thyristor, diode, and other MOS gated devices. For example, power MOSFET 484 from FIG. 16 can be formed on engineered substrate 176.

By leveraging the inherent benefits of MEMS manufacturing techniques and embedding SiC into the drain of the SJMOS structure, a new approach to the design and manufacture of robust radiation hardening processes provides suitable for the deep space environment. The early super-junction products demonstrated a substantial competitive advantage with respect to Rdson*area product that allows for a 5× improvement over standard planar MOSFETs. Embedding SiC into the drain has the potential to improve device parametric performance by another 5× plus enhances radiation hardness to meet SEGR performance for 1200V devices. The merger of SJMOS structures-MEMS manufacturing techniques-WBG material creates a new class of merged power semiconductor devices that in this case has the potential to sustain 1200V blocking with no heavy-ion-induced permanent destructive effects upon exposure to high energy radiation of 87 Mev-cm$^2$/mg while delivering Rdson of 90 milliohms at ID max=40 A.

Figure 17:
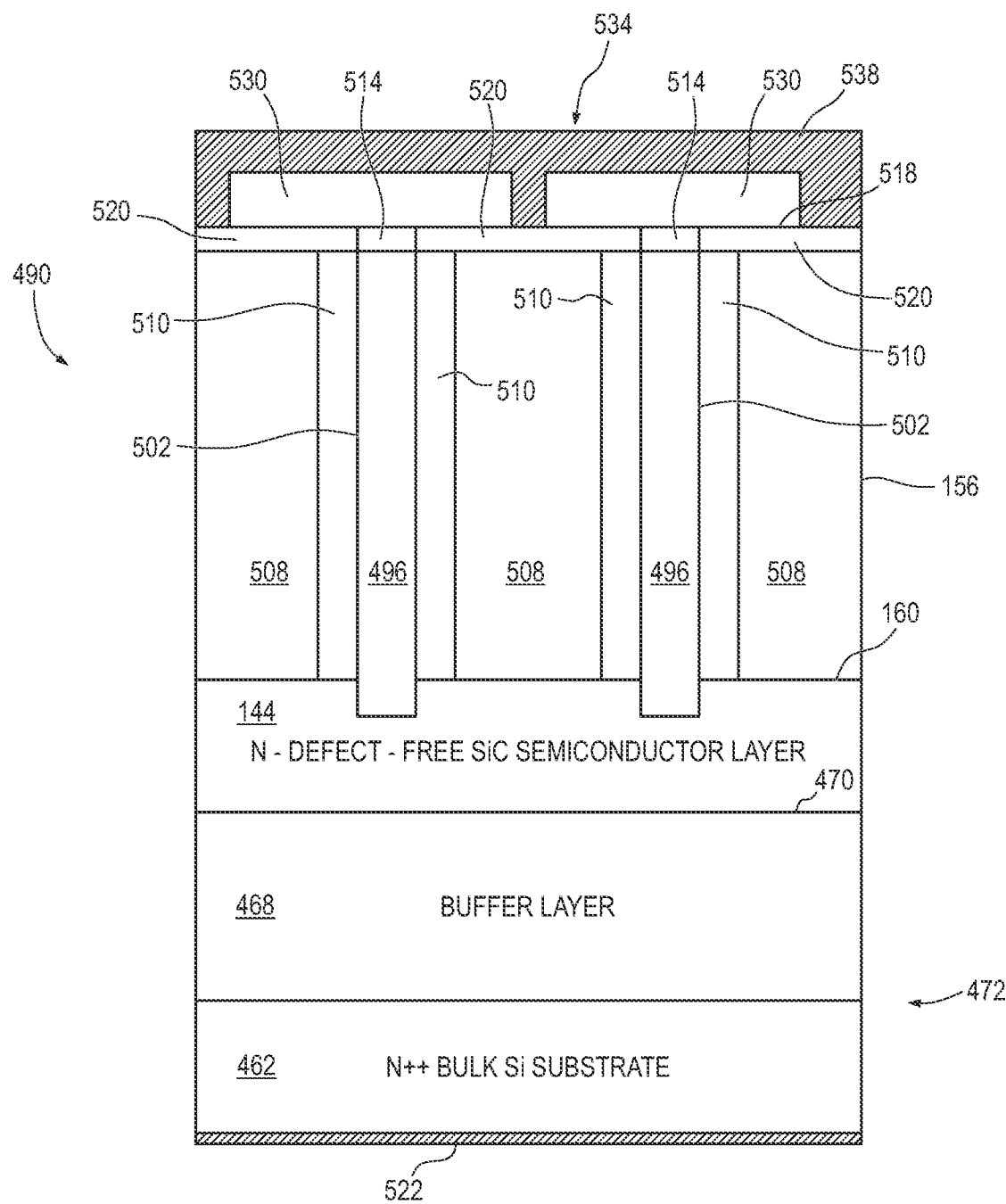
FIG. 17 illustrates a high-breakdown voltage diode formed on the radiation hardened substantially defect-free SiC substrate.

In another embodiment, continuing from FIG. 10, high voltage power diode 490 is formed in semiconductor device layer 156, as shown in FIG. 17. Trenches 496 are formed through semiconductor layer 156 and extending past surface 160 into semiconductor layer 144. Trenches 496 can be formed by DRIE with a width of 3-6 μm and depth of 50-60 μm for 600 v and 100-110 for 1200 v. Alternatively, trenches 496 can be formed by LDA, plasma etching, RIE, sputter etching, vapor phase etching, and chemical etching. Sidewalls 502 of trenches 496 are implanted or doped with a dopant, which may occur at predetermined angles. The dopant can be n-type material to form n region 508. The implant is performed at an energy level of about 30-200 KeV with a dose ranging from about 1e13 to 1e17 atoms/cm$^3$. Sidewalls 502 of trenches 496 are implanted with a p-type dopant, such as boron, aluminum, or gallium impurities, to form p regions 510 with a width of about 1.0 μm. The p-implant leaves columns of n region 508 and columns of p region 510. The columns of n region 508 have equal and opposite charge as the columns of p region 510.

An insulating material 514 is deposited in trenches 496. In one embodiment, insulating material 514 completely fills trenches 496. Alternatively, insulating material 514 forms a cap over trenches 496, as it is not necessary to completely fill trenches 496 with insulating material. After depositing insulating material 514, surface 518 is planarized by CMP. A p-type dopant, such as boron, aluminum, or gallium impurities, is implanted to form p body regions 520 proximate to surface 518 of semiconductor layer 156. As a vertical device, the anode of diode 490 is provided by p region 520, and the anode is provided by n region 508, SiC or 3C—SiC radiation hardened engineered substrate 472 to the backside contact 522. An interlayer dielectric or insulating layer 530 is formed over surface 518 of semiconductor layer 156. A plurality of vias is formed through insulating layer 530 and extending to p regions 520. The vias are filled with conductive material and connect to conductive layer 538. Diode 490 contains an array of cells such as cell 534 to achieve the high-breakdown voltage, high reliability, lightweight, low voltage, and low on resistance.

Diode 490 is designed for high-breakdown voltage, radiation hardened, high reliability, lightweight, low voltage, and low on resistance applications, such as DC to DC converters, aerospace, and high-performance computing. In particular, diode 490 merges MEMS, super-junction, and WBG engineered cathode to achieve the high breakdown voltage, performance, manufacturability, low cost, lightweight, and low on resistance. The semiconductor structure between surface 160 and surface 518 substantially represents a super-junction semiconductor device. The super-junction cell 534 accounts for the total breakdown voltage capability. The 1200 v breakdown capacity is useful of efficient power distribution systems in aerospace applications, where the above advantages are particularly important. Diode 490 can sustain 1200 v blocking with no heavy ion-induced permanent destructive effects upon exposure to high energy radiation of 87 Mev cm$^2$/mg. The high-breakdown voltage characteristics can be applied to an IGBT, CTIGBT, thyristor, power MOSFET, and other MOS gated devices.

Power MOSFET 484 and diode 490 are applicable to electronic equipment in aerospace, personal computers, energy systems, telecommunication systems, audio-video equipment, consumer electronics, automotive components, portable electronics, data processing centers, LED lighting, electric vehicles, and other applications which utilize integrated circuits or semiconductor chips.

Figure 18A:
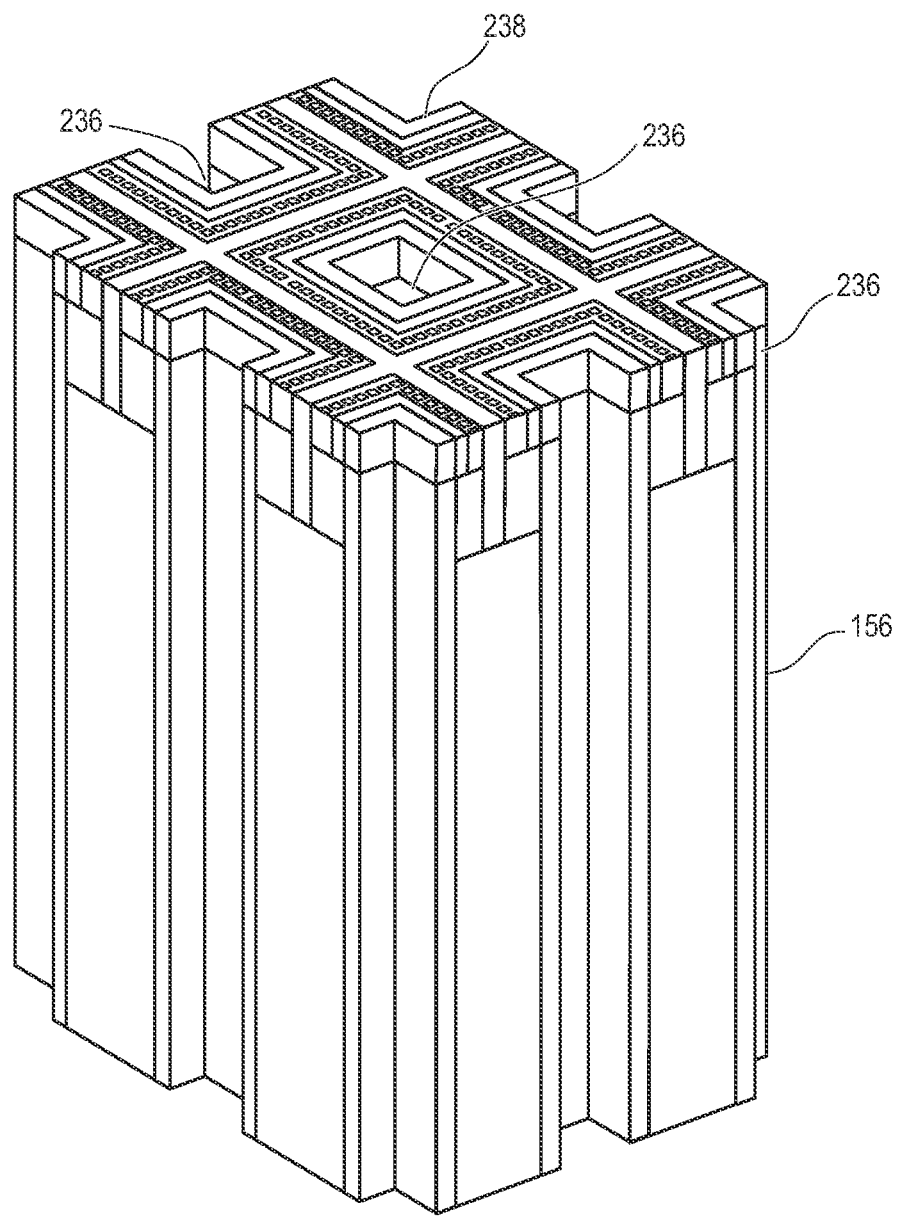
FIGS. 18a-18d illustrate further detail of the MEMS layer transfer or layer bonding process.
Figure 18B:
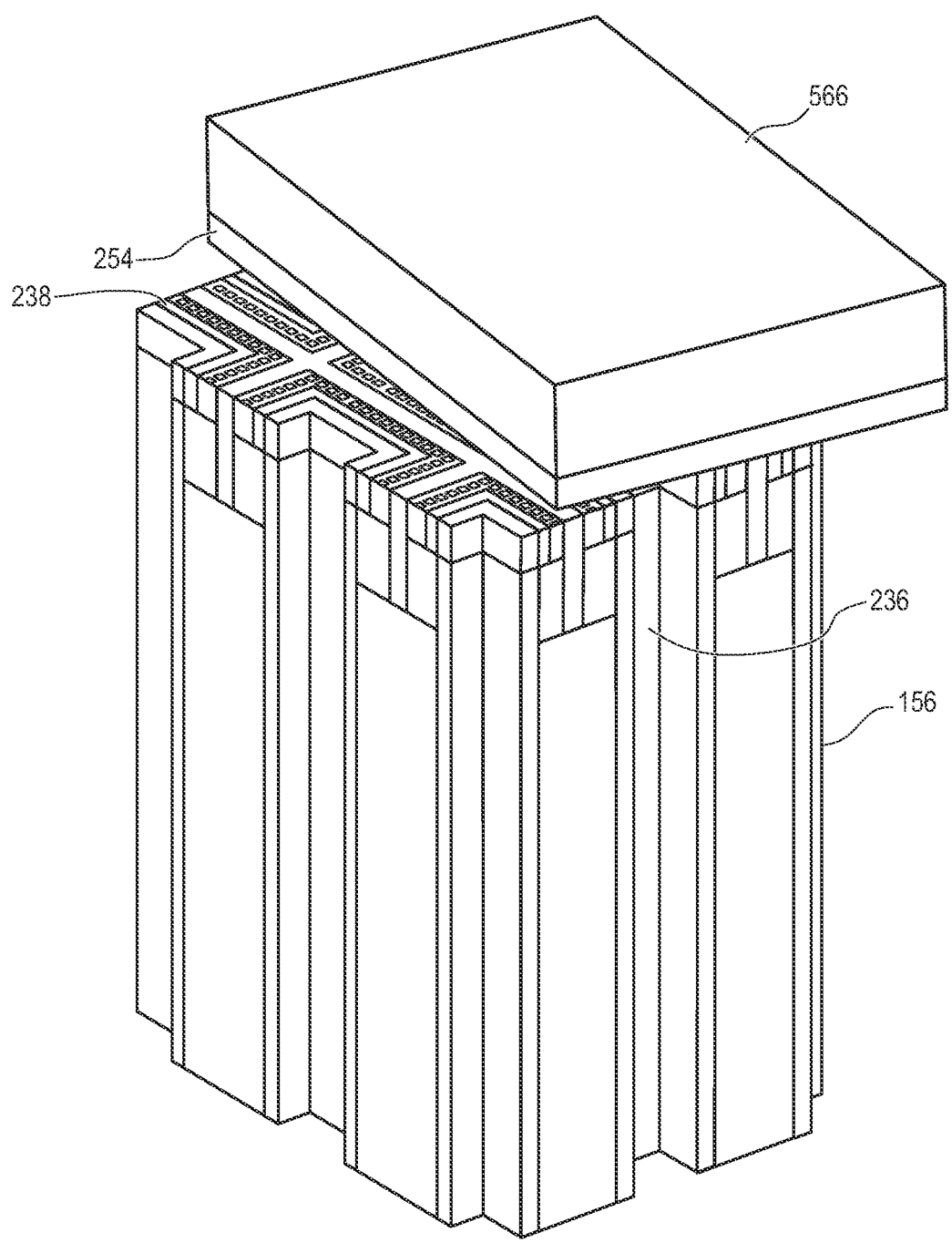
Figure 18C:
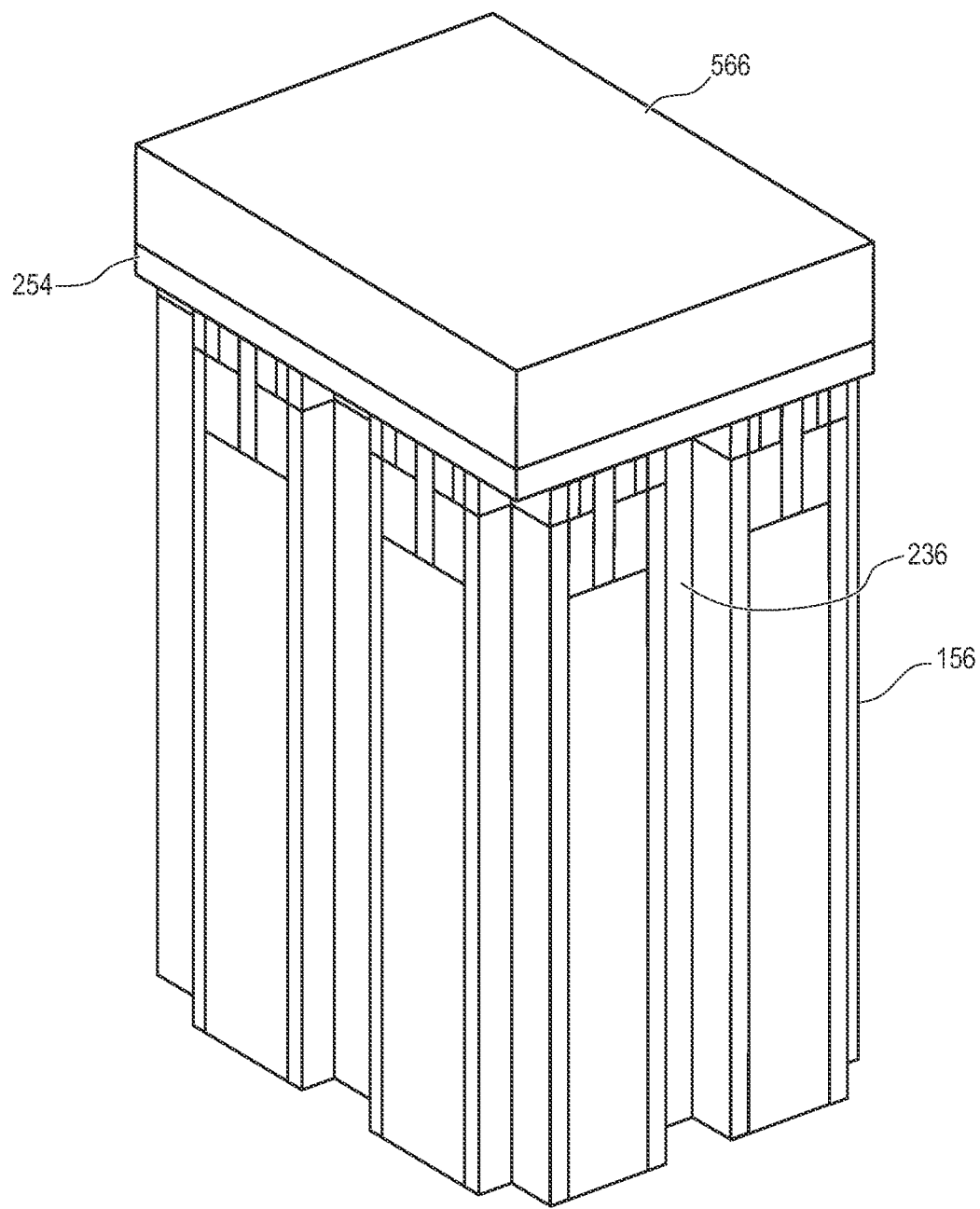
Figure 18D:
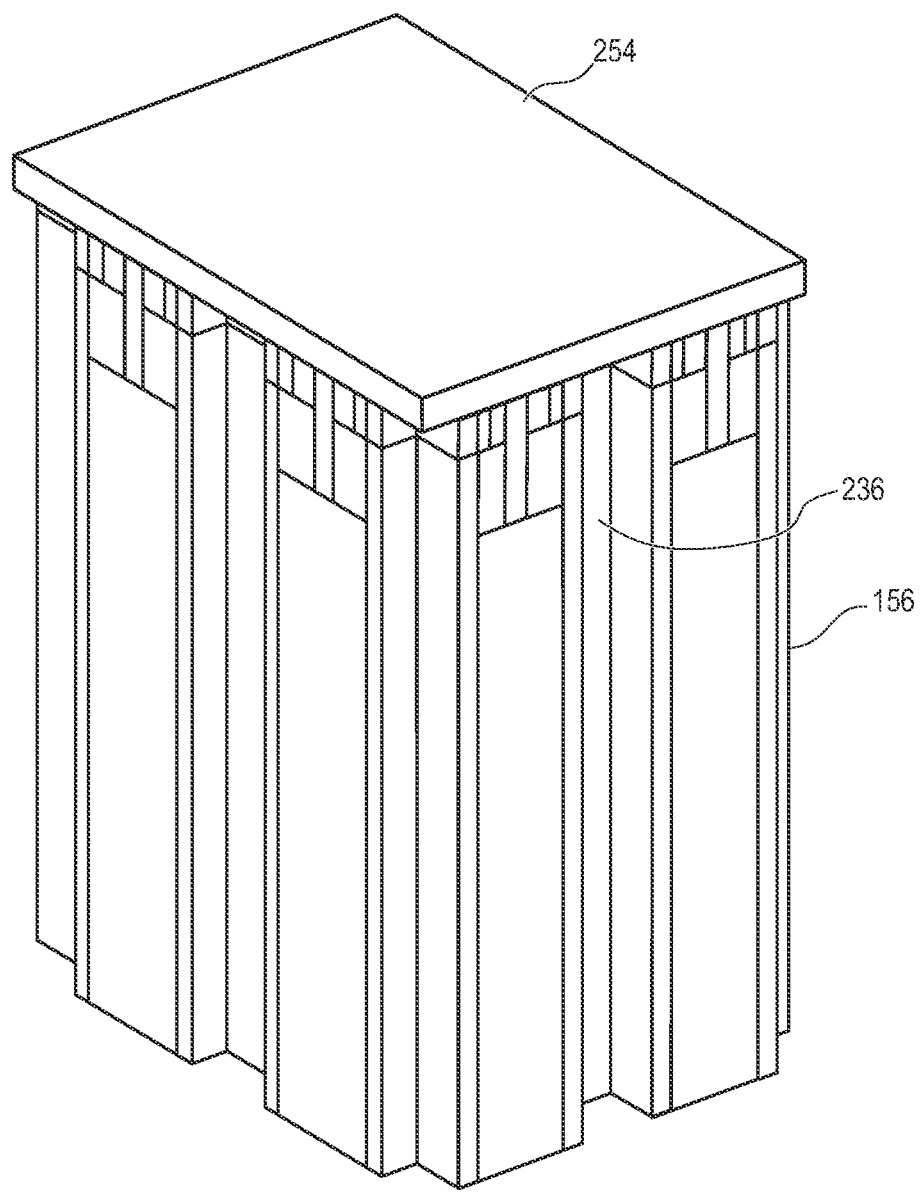

FIGS. 18a-18d show further detail of the MEMS layer transfer or layer bonding process. FIG. 18a shows semiconductor layer 156 with surface 238 and a plurality of trenches 236. FIG. 18b shows silicon substrate 566 with insulating layer 254 disposed over the substrate. In one embodiment, insulating layer 254 is SiO2 grown on silicon substrate 566. Silicon substrate 566 is disposed over surface 238 with insulating layer 254 oriented toward the surface of semiconductor layer 156. In FIG. 18c, silicon substrate 566 is DWB to semiconductor layer 156 with insulating layer 254 contacting surface 238. Insulating layer 254 covers and seals trenches 236. In FIG. 18d, silicon substrate 566 is removed leaving insulating layer 254 disposed over surface 238, and partially into trench 236, to cap each trench, as in FIG. 11f. The MEMS layer transfer or layer bonding process uses a thin SiO2 layer to cap an open deep trench structure forming a hermetically sealed cavity in the trench. Silicon substrate 566 provides structural support for insulating layer 254 during the bonding process.

The transferred SiO$_2$ layer 254 then forms part of ILD 270 for contact/metal. ILD 270 has a low dielectric constant k, mechanical stability, and thermal conductivity. The transferred SiO$_2$ layer 254 integrates with ILD 270 for the MOSFET portion of the device. MEMS manufacturing methods applied to super-junction devices involves the adoption of deep reaction ion trench etching, side wall doping, and layer transfer techniques to eliminate trench refill as its basic fabrication process. The MEMS technique replaces trench refill process by using DWB a mems cap over the trench and seal the vacuum trench. The MEMS layer transfer or layer bonding process has advantages of lower cost for shorter processes, reduction of thermal stress for less thermal process steps, and reduction of mechanical stress by eliminating refill material. The merger of deep reactive ion etch MEMS fabrication process into the mSJ-MOS design is a key step for the high aspect ratio trench to enable charge balance through trench sidewall implantation In summary, engineered substrates 176 and 472 use hot wall CVD reactor growth of a heteroepitaxial layer of N–3C—SiC on a host sacrificial silicon compliant substrate (first wafer) that is then direct wafer bonded to a N– Si/N++

Si second wafer. The MEMS direct wafer bonding processes include plasma activated DWB of a substantially defect-free N– 3C—SiC/N– Si heteroepitaxy film 30 mm thick to a silicon substrate to create an advanced engineered substrate that becomes the starting material for CMOS processing of a 1200V SJMOS embedded drain SiC high voltage power MOSFET.

The combination of defect reduction techniques and DWB in MEMS substrates has produced engineered substrates 176 and 472, where the thin high density defect region always found at the 3C—SiC/Si heterointerface becomes a sacrificial layer and is removed along with the sacrificial compliant substrate from the remaining substantially defect-free thick SiC or 3C—SiC film and leaving only the high voltage sustaining nearly defect-free N– SiC or 3C—SiC layer bonded to a N– Si/n++ Si second wafer. Electrons flow to the SiC or 3C—SiC layer in the drain but holes flow only in the silicon. From this standpoint, it is reasonable to form a drift region by silicon where impact ionization and recombination occur to prevent the opportunity to expand stacking faults in the SiC or 3C—SiC layer. The engineered substrate 272 can pass high energy radiation with no heavy ion-induced permanent destructive effects upon exposure to high energy radiation of 87 Mev $cm^2/mg$, while delivering low Rdson of 90 milliohms at ID max=40 A.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a substrate;
    bonding a first surface of a first semiconductor layer comprising a first semiconductor material as substantially defect-free silicon carbide to a surface of the substrate using direct wafer bonding; and
    bonding a surface of a second semiconductor layer comprising a second semiconductor material dissimilar from the first semiconductor material in contact with a second surface of the first semiconductor layer opposite the first surface of the first semiconductor layer using direct wafer bonding, wherein an electrical component is formed in the second semiconductor layer;
    forming a trench through the second semiconductor layer and extending into the first semiconductor layer;
    forming a first column of semiconductor material having a first conductivity type adjacent to the trench;
    forming a second column of semiconductor material having a second conductivity type opposite the first conductivity type adjacent to the first column of semiconductor material opposite the trench; and
    forming a source region over the first column of semiconductor material.

2. The method of claim 1, wherein the second semiconductor material includes silicon.

3. The method of claim 1, wherein the substrate includes a material selected from the group consisting of silicon, silicon carbide, cubic silicon carbide, germanium, aluminum phosphide, aluminum arsenide, gallium arsenide, gallium nitride, indium phosphide, diamond, and all families of III-V and II-VI semiconductor materials.

4. The method of claim 1, wherein the second semiconductor layer with the electrical component provides a first portion of a breakdown voltage for the semiconductor device and the first semiconductor layer and substrate provides a second portion of the breakdown voltage for the semiconductor device.

5. The method of claim 1, wherein the semiconductor device is a functional component integrated into aerospace devices, data processing centers, LED lighting, charging stations for electric vehicles, and/or variable speed drives for electric motors.

6. The method of claim 1, wherein the electrical component is selected from the group consisting of a transistor, diode, insulated gate bipolar transistor, cluster trench insulated gate bipolar transistor, and thyristor.

7. The method of claim 1, wherein the direct wafer bonding includes chemical bonds and intermolecular interactions at temperature, including van der Waals forces, hydrogen bonds, and covalent bonds, between a surface of the substrate and a surface of the first semiconductor layer, or between a surface of the first semiconductor layer and a surface of the second semiconductor layer.

8. The method of claim 1, further including forming an insulating layer over the trench.

9. The method of claim 1, further including forming a gate structure over the second semiconductor layer.

10. A method of making a semiconductor device, comprising:
    providing a substrate;
    bonding a first surface of a first semiconductor layer comprising a first semiconductor material as substantially defect-free silicon carbide to a surface of the substrate using direct wafer bonding; and
    bonding a surface of a second semiconductor layer comprising a second semiconductor material dissimilar from the first semiconductor material in contact with a second surface of the first semiconductor layer opposite the first surface of the first semiconductor layer using direct wafer bonding;
    forming a trench through the second semiconductor layer and extending into the first semiconductor layer;
    forming a first column of semiconductor material having a first conductivity type adjacent to the trench;
    forming a second column of semiconductor material having a second conductivity type opposite the first conductivity type adjacent to the first column of semiconductor material opposite the trench; and
    forming a source region over the first column of semiconductor material.

11. The method of claim 10, wherein the second semiconductor material includes silicon.

12. The method of claim 10, wherein the substrate includes a material selected from the group consisting of silicon, silicon carbide, cubic silicon carbide, germanium, aluminum phosphide, aluminum arsenide, gallium arsenide, gallium nitride, indium phosphide, diamond, and all families of III-V and II-VI semiconductor materials.

13. The method of claim 10, wherein the second semiconductor layer provides a first portion of a breakdown voltage for the semiconductor device and the first semiconductor layer and substrate provides a second portion of the breakdown voltage for the semiconductor device.

14. The method of claim 10, wherein the semiconductor device is a functional component integrated into aerospace devices, data processing centers, LED lighting, charging stations for electric vehicles, and/or variable speed drives for electric motors.

15. The method of claim 10, wherein the electrical component is selected from the group consisting of a transistor, diode, insulated gate bipolar transistor, cluster trench insulated gate bipolar transistor, and thyristor.

16. The method of claim 10, wherein the direct wafer bonding includes chemical bonds and intermolecular interactions at temperature, including van der Waals forces, hydrogen bonds, and covalent bonds, between a surface of the substrate and a surface of the first semiconductor layer, or between a surface of the first semiconductor layer and a surface of the second semiconductor layer.

17. The method of claim 10, further including forming an insulating layer over the trench.

18. The method of claim 10, further including forming a gate structure over the second semiconductor layer.

19. A method of making a semiconductor device, comprising:
   bonding a first surface of a first semiconductor layer to a surface of a substrate using direct wafer bonding; and
   bonding a surface of a second semiconductor layer in contact with a second surface of the first semiconductor layer opposite the first surface of the first semiconductor layer using direct wafer bonding, wherein the first semiconductor layer includes a first semiconductor material dissimilar from a second semiconductor material of the second semiconductor layer;
   forming a trench through the second semiconductor layer and extending into the first semiconductor layer;
   forming a first column of semiconductor material having a first conductivity type adjacent to the trench;
   forming a second column of semiconductor material having a second conductivity type opposite the first conductivity type adjacent to the first column of semiconductor material opposite the trench; and
   forming a source region over the first column of semiconductor material .

20. The method of claim 19, wherein the first semiconductor material includes silicon carbide.

21. The method of claim 19, wherein the second semiconductor material includes silicon.

22. The method of claim 19, wherein the first semiconductor material is substantially defect-free.

23. The method of claim 19, wherein the substrate includes a material selected from the group consisting of silicon, silicon carbide, cubic silicon carbide, germanium, aluminum phosphide, aluminum arsenide, gallium arsenide, gallium nitride, indium phosphide, diamond, and all families of III-V and II-VI semiconductor materials.

24. The method of claim 19, wherein the second semiconductor layer provides a first portion of a breakdown voltage for the semiconductor device and the first semiconductor layer and substrate provides a second portion of the breakdown voltage for the semiconductor device.

25. The method of claim 19, wherein the semiconductor device is a functional component integrated into aerospace devices, data processing centers, LED lighting, charging stations for electric vehicles, and/or variable speed drives for electric motors.

26. The method of claim 19, wherein the electrical component is selected from the group consisting of a transistor, diode, insulated gate bipolar transistor, cluster trench insulated gate bipolar transistor, and thyristor.

27. The method of claim 19, wherein the direct wafer bonding includes chemical bonds and intermolecular interactions at temperature, including van der Waals forces, hydrogen bonds, and covalent bonds, between a surface of the substrate and a surface of the first semiconductor layer, or between a surface of the first semiconductor layer and a surface of the second semiconductor layer.

28. The method of claim 19, further including forming an insulating layer over the trench.

29. The method of claim 19, further including forming a gate structure over the second semiconductor layer.

* * * * *